United States Patent
Richards

(10) Patent No.: US 10,701,841 B2
(45) Date of Patent: Jun. 30, 2020

(54) MOUNTING APPARATUS, FOR MOUNTING AT LEAST ONE HEAT DISSIPATING ELECTRICAL DEVICE, OPTIONALLY INCLUDING A HEAT SINK BODY FOR SOLID, GAS AND FLUID HEAT EXCHANGE, AND CIRCUIT BOARD ASSEMBLY PROVIDING INTERFACE BETWEEN CIRCUITS

(71) Applicant: ALGOZEN CORPORATION, Mississauga (CA)

(72) Inventor: Michael John Richards, Mississauga (CA)

(73) Assignee: ALGOZEN CORPORATION, Mississauga (CA)

(*) Notice: Subject to any disclaimer, the term of this patent is extended or adjusted under 35 U.S.C. 154(b) by 367 days.

(21) Appl. No.: 15/523,076

(22) PCT Filed: Oct. 30, 2015

(86) PCT No.: PCT/CA2015/051114
§ 371 (c)(1),
(2) Date: Apr. 28, 2017

(87) PCT Pub. No.: WO2016/065485
PCT Pub. Date: May 6, 2016

(65) Prior Publication Data
US 2018/0288907 A1    Oct. 4, 2018

Related U.S. Application Data

(60) Provisional application No. 62/073,074, filed on Oct. 31, 2014.

(51) Int. Cl.
*H05K 7/20*     (2006.01)
*H01L 23/36*    (2006.01)
(Continued)

(52) U.S. Cl.
CPC ......... *H05K 7/20927* (2013.01); *H01L 23/36* (2013.01); *H01L 23/4093* (2013.01);
(Continued)

(58) Field of Classification Search
CPC .... H05K 7/209; H05K 7/20927; H02K 11/33; H02M 7/003
(Continued)

(56) References Cited

U.S. PATENT DOCUMENTS 4,247,881 A   1/1981  Coleman
4,264,943 A   4/1981  Anderson et al.
(Continued)

FOREIGN PATENT DOCUMENTS

DE   202013006278 U1   8/2013
JP      2014192284     10/2014
WO         9417649      8/1994

OTHER PUBLICATIONS

Schulz et al., "The Crucial Influence of Thermal Interface Material in Power Electronic Design".
(Continued)

*Primary Examiner* — Mukundbhai G Patel
(74) *Attorney, Agent, or Firm* — Bereskin & Parr LLP/S.E.N.C.R.L., s.r.l.

(57) ABSTRACT

The invention in part, is a heat removal system or apparatus providing a method of mounting and electrically connecting heat dissipating electrical devices, preferably in a radial geometry while achieving good surface-to-surface clamping force, in liquid and or air cooled variants. A variation of the invention can provide arc safety for high power density applications. In specific embodiments, the invention also provides low inductance as a result of minimal loop area while also providing high voltage isolation between devices. The N-sided geometry and effective clamping methodology (Continued)

offer low mass and volume. A variation of the invention also provides a signal interface for driving power electronics devices. A unique cylindrical electrical device package with terminals can support capacitor, inductor and transformer integration in a common package. The various elements of the invention can be combined together to minimize size and weight, while addressing high voltage, noise and thermal management.

18 Claims, 43 Drawing Sheets

(51) Int. Cl.
  *H01L 23/473* (2006.01)
  *H01L 23/467* (2006.01)
  *H01L 23/40* (2006.01)
  *H02K 11/33* (2016.01)
  *H02K 9/06* (2006.01)

(52) U.S. Cl.
  CPC .......... *H01L 23/467* (2013.01); *H01L 23/473* (2013.01); *H05K 7/209* (2013.01); *H01L 2924/0002* (2013.01); *H02K 9/06* (2013.01); *H02K 11/33* (2016.01); *H02K 2211/03* (2013.01)

(58) Field of Classification Search
  USPC ......................................................... 361/699
  See application file for complete search history.

(56) References Cited

U.S. PATENT DOCUMENTS

| | | | |
|---|---|---|---|
| 4,536,819 A | 8/1985 | Deutsch | |
| 5,586,004 A | 12/1996 | Green et al. | |
| 5,673,168 A | 9/1997 | Efford et al. | |
| 6,201,699 B1* | 3/2001 | Ayres | H01L 23/367 174/16.3 |
| 6,255,722 B1* | 7/2001 | Ewer | H01L 23/4093 257/675 |
| 6,330,160 B1* | 12/2001 | Ayres | H01L 23/4093 24/457 |
| 6,587,344 B1 | 7/2003 | Ross | |
| 6,714,414 B1* | 3/2004 | Dubovsky | H01L 23/4006 165/185 |
| 6,909,595 B2 | 6/2005 | Erhardt et al. | |
| 7,289,311 B2 | 10/2007 | Hosking | |
| 2009/0231812 A1* | 9/2009 | Wiles | H01L 23/3735 361/699 |
| 2014/0240989 A1 | 8/2014 | Hardikar et al. | |

OTHER PUBLICATIONS

Wuidart, Application Note, "Topologies for Switched Mode Power Supplies", STMicroelectronics, pp. 1-18.
Jedec, "Silicon Rectifier Diodes", Nov. 2002.
European Patent Application No. 15853810.8, Extended European Search Report, dated Aug. 18, 2018.

* cited by examiner

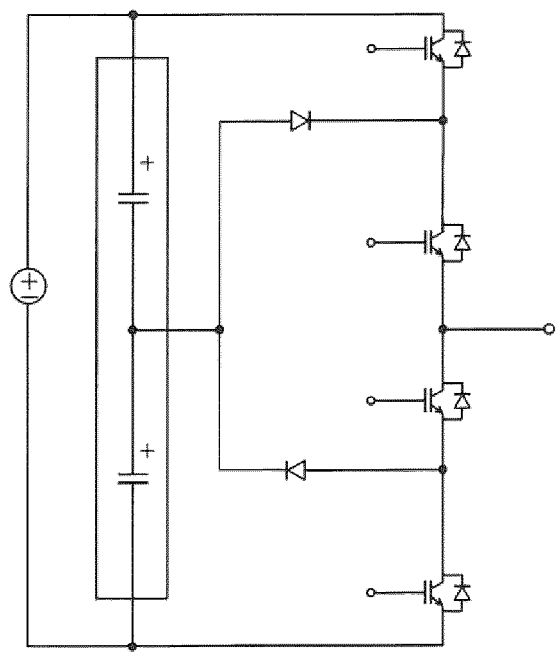
FIG. 41
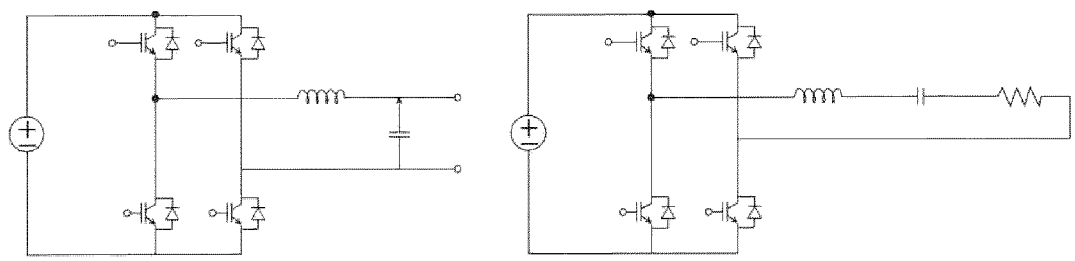
FIG. 42a   FIG. 42b

MOUNTING APPARATUS, FOR MOUNTING AT LEAST ONE HEAT DISSIPATING ELECTRICAL DEVICE, OPTIONALLY INCLUDING A HEAT SINK BODY FOR SOLID, GAS AND FLUID HEAT EXCHANGE, AND CIRCUIT BOARD ASSEMBLY PROVIDING INTERFACE BETWEEN CIRCUITS

This application is a National Stage of International Application No. PCT/CA2015/051114, filed Oct. 30, 2015, which claims the benefit of Provisional Application No. 62/073,074, filed Oct. 31, 2014, the contents of which are herein incorporated by reference.

FIELD

The present disclosure relates generally to the transfer of heat from heat dissipating electrical power devices. The applicable circuit topologies include, but are not limited to, applications such as motor drives, power supplies, loading systems, solar power conversion systems, active front ends, welding machines and virtually all forms of applications in the power electronics technology market.

BACKGROUND

The following paragraphs are not an admission that anything discussed in them is prior art or part of the knowledge of persons skilled in the art.

The need to transfer heat away from one or more devices in order to keep temperatures from rising to destructive levels is common in many electrical and non-electrical applications. A common trait of such systems is that the power dissipating device is mated to the heat removal device at a common surface to surface interface. Minimal intervening thermal impedance is desired to minimize the temperature difference across the boundary.

Traditional power electronics applications utilize multiple heat sinks or a single common heat sink. These typically provide some form of fins in a gaseous or liquid cooling approach to effect heat transport away from the device.

To support the needs of industry, semiconductor manufacturers usually mount single or multiple devices on an insulating substrate (typically a ceramic substrate) in a flat geometry. In many power circuits, multiple devices are interconnected using combinations of flat direct-bonded-copper-to-ceramic islands and wires connected from die-to-die and to the substrate with a small links of wire. Usually such wire bonds are welded robotically. These interconnected objects are generally referred to as power modules.

Demand for smaller and lighter products with increased power density continues to drive engineered product development to achieve competitive advantages of smaller size and weight. As a result, the size and quantities of semiconductor dies on the substrate continue to increase to support higher currents. Simultaneously, the voltage levels are increased. Since power is proportional to the product of voltage and current, both dimensions of current and voltage are increased to produce higher power processing capability in the smallest volume possible. Progressively greater surface area is required in this flat approach. As the surface area increases so does the loop area of the circuitry. This loop area gives rise to parasitic inductance in the circuit which causes trapped energy to be produced that must be dissipated as heat every switching cycle. In this predominantly flat geometry a point of diminishing return may be reached where power loss and current density coupled with high voltage electric field limits make further increases in power density by volume problematic. In many circuits of interest, such as motor drives and power supplies, switching at high frequency is important to reduce the size of transformers and other magnetic devices. Such parasitic inductance therefore limits the ability to remain efficient and to allow further reductions of size.

Parasitic inductance is highly undesirable because it gives rise to voltage overshoot. Voltage overshoot must then be controlled by other means such as snubbers, which dissipate the trapped energy caused by the parasitic inductance. This results in power loss that impairs the overall efficiency of the electronics power conversion process and exacerbates the need for more cooling. Since losses due to parasitic inductance increase with switching frequency, the practical limit of maximum switching frequency may ultimately be linked to the loop area and geometry.

Those skilled in the art of high frequency switch mode power electronics circuit design will recognize that the goal of minimizing loop inductance amounts to reducing the geometry of the power circuit to the smallest area and ultimately the smallest volume possible. However, it should also be recognized that achieving these goals cannot be accomplished without also managing other constraints such as a) assuring that conductor size is adequate (to keep conductors from overheating); and b) assuring that clearances are adequate (to keep high voltage electric fields from breaking down the insulation or the surrounding gaseous atmosphere and causing an arc). A further emerging challenge of operating at high power levels are safety concerns if and when there is a catastrophic failure and an arc is created.

Additional practical considerations must also be considered, such as managing the cost of the solution so that economic feasibility is maintained in the solution and maintaining mechanical reliability of clamping forces over wide temperature variation etc.

Those skilled in the art will recognize that, in most cases, the goal of switching at higher frequencies is driven by a desire to minimize the size and weight of filters which are used to achieve power quality or to achieve necessary regulatory electromagnetic interference performance levels, or both. These filters may include inductors, capacitors, and transformers whose weight is to a first order inversely proportional to the switching frequency of the power converter, and which also require effective heat removal.

In summary, the trend towards design of power conversion systems is to make them smaller and lighter and handle more power. Stated differently, the ultimate goal in designing power conversion systems is to provide the highest power density by volume and/or weight possible.

Those skilled in the art will recognize that as power density is increased the power loss in any switch mode system must be carefully managed. One way to do this is to minimize loop inductance. In order to do this, as the circuit gets smaller, the needs of achieving high reliability voltage insulation, high thermal performance, and low conduction and switching losses become more difficult. Having to manage all of these constraints simultaneously challenges the limits of available technology. These simultaneous goals must be balanced altogether both technically and economically to achieve success in the business of power electronics.

SUMMARY

This summary is intended to introduce the reader to the more detailed description that follows and not to limit or define any claimed or as yet unclaimed invention. One or more inventions may reside in any combination or subcombination of the elements or process steps disclosed in any part of this document including its claims and figures.

Embodiments described in the present disclosure may take a different approach from the traditional flat approach of mounting semiconductors and interconnecting them with die-bond wire links. Instead, a less complicated design utilizing a non-flat geometrical approach with an N-sided thermally conductive object is employed. This allows the power circuit to effectively occupy three dimensions more effectively than the traditional two dimensional interconnect approach. Interconnection can be accomplished with a printed circuit board or laminated bus bar structure. This allows many of the problems associated with traditional industry approaches to be solved.

In the electronics industry, many electric power devices that dissipate power exist. Electric power dissipating devices include resistors, diodes, IGBT's (insulated gate bipolar transistor), MOSFET's (metal oxide semiconductor field effect transistor), BJT (bipolar junction transistor), and SCR's (silicon controlled rectifiers) capacitors, inductors, transformers, among others. Embodiments of the present disclosure may be well suited to work with these devices but they are not limited to use with only these common device types.

The disclosed embodiments may allow very high switching frequency power circuits to function reliably, for example in the 20 KHz to 5 MHz range, and economically by reducing loop inductance. This may enable more effective deployment of the next generation of power switch Silicon Carbide semiconductors which have the potential of operating at ten times the switching frequency of today's state of the art products. The embodiments may also allow practical realization of weight reduction of ancillary filter inductors, capacitors, and transformers. Silicon carbide holds promise of allowing semiconductors to operate at very high temperatures. This may allow another factor of increase in power density by volume because thermal transfer systems will be rendered more efficient as a result of the larger temperature difference (delta-T) possible between devices and the environment. Higher operating temperature differentials will require a thermal transfer method that supports the higher operating temperatures of the semiconductors without mechanical or material degradation. In one aspect, embodiments described herein may enable practical application of Silicon Carbide high speed switching circuits because they ameliorate or overcome some of the barriers that exist today with Silicon Carbide device packaging and device management that are preventing such devices from being used at higher temperatures. Specifically, embodiments of the present disclosure may allow materials to be chosen that can operate to very high temperatures in excess of 400° C.

In one aspect, there is provided a mounting apparatus, for mounting at least one heat dissipating electrical device; the mounting apparatus including a heat sink body having peripheral surface with at least one surface for mounting a heat dissipating electrical device, and a securing member encircling the heat sink body and each electrical device mounted to said at least one surface of the heat sink body, the securing member being maintained in tension, thereby to provide a force on each electrical device to press each electrical device against the heat sink body.

In another aspect, there is provided a mounting apparatus, for mounting at least one heat dissipating electrical device, the mounting apparatus including a heat sink body having a peripheral surface with at least one surface for mounting a heat dissipating electrical device, a supporting element with the heat sink body mounted on the supporting element, at least one heat dissipating electrical device mounted on the heat sink body and including leads extending to the supporting element, with the leads being configured to provide desired creepage distances.

In another aspect, there is provided a mounting apparatus, for mounting at least one heat dissipating electrical device, the mounting apparatus including a heat sink body having peripheral surface with at least one surface for mounting a heat dissipating electrical device, wherein the heat sink body is integral and in one piece.

In another aspects, there is provided a mounting apparatus, for mounting at least one heat dissipating electrical device, the mounting apparatus including a heat sink body having peripheral surface with at least one surface for mounting a heat dissipating electrical device, wherein the heat sink body includes a first end face for mounting the apparatus and an extension, extending from the first end face, whereby the heat sink body can be mounted to a generally planar supporting element, with the heat sink body located on one side of the supporting element and the extension of the heat sink body extending through to another side of the supporting element.

In another aspect, there is provided a mounting apparatus, for mounting at least one heat dissipating electrical device, the mounting apparatus comprising a heat sink body having peripheral surface with at least one surface for mounting a heat dissipating electrical device, wherein the heat sink body includes a first end face for mounting the apparatus and a plurality of extended heat transfer surfaces for air cooling.

In another aspect, there is provided a circuit board assembly for providing a signal interface between a first circuit operating at a first voltage level and a second circuit, that preferably is operating at a second voltage level different or equal to the first voltage level, the circuit board assembly preferably being substantially planar and the circuit board assembly extending from a first end to a second end, the circuit board assembly including at least one first end connector for mounting the first end of the circuit board assembly to a first, preferably generally planar, supporting element with the circuit board assembly, preferably generally perpendicular to the first supporting element, and connecting the first end of the circuit board assembly to the first circuit.

Alternatively in this aspect of the invention, the first and second circuits can be distinguished or identified as operating, respectively, at first and second power levels, with these power levels being the same or different.

In another aspect, there is provided an electrical device package comprising a package body having an outer peripheral surface, an inner peripheral surface spaced inwardly from the outer peripheral surface and a package inner volume between the outer peripheral surface and the inner peripheral surface, the inner peripheral surface defining an inner radius void, a passive electrical device disposed within the package inner volume, and at least three electrical terminals protruding from the package body.

In yet another aspect there is provided an electrical device package comprising a package body defining a closed cylindrical loop with an internal volume, a passive electrical device within the internal volume and at least three electrical terminals protruding from the package body.

In a further aspect, there is provided a power system assembly comprising a generally planar first supporting element, the first supporting element comprising one of a printed circuit board and a bus structure, a heat sink body having a peripheral surface with at least one surface for mounting a heat dissipating electrical device that is connectable to the first supporting element and operates at a first voltage level, the heat sink body having a first end face for mounting the apparatus to the first supporting element with the heat sink body located on a first side of the first supporting element, and a circuit board assembly for providing a signal interface between the first supporting element and a second circuit that preferably is operating at a second voltage level different or equal to the first voltage level, the circuit board assembly extending from a first end to a second end, the circuit board assembly including a first end connector for mounting the first end of the circuit board assembly to the first supporting element and connecting the circuit board assembly to the first supporting element, with the circuit board assembly located on a second side of the first supporting element, and with the circuit board assembly preferably generally perpendicular to the first supporting element, the circuit board assembly having a second end connector for connecting the second end of the circuit board assembly to the second circuit.

In the power system assembly, the first voltage level can be in the range of 0 to +/−12,000V with respect to any common point of reference arbitrarily defined, and the second voltage level can be in the range of to +/−12,000V with respect to the same common point of reference defined.

Alternatively, or in addition, the heat dissipating device can process power levels greater than 500 W, preferably greater than 1 kW, and the second circuit can process at power levels of less than 500 W, preferably less than 100 W.

Other aspects and features of the teachings disclosed herein will become apparent, to those ordinarily skilled in the art, upon review of the following description of the specific examples of the present disclosure.

BRIEF DESCRIPTION OF THE DRAWINGS

For better understanding of the present disclosure, and to show more clearly how it may be carried into effect, reference is now made, by way of example to the accompanying drawings in which:

FIG. 41 shows a circuit diagram illustrating another example of a switch configuration employing capacitors that may be used with embodiments described herein;

FIGS. 42a and b show circuit diagrams illustrating further examples of switch configurations employing capacitors, inductors, and transformers (which are a form of coupled inductors) that may be used with embodiments described herein;

DETAILED DESCRIPTION

Figure 1:
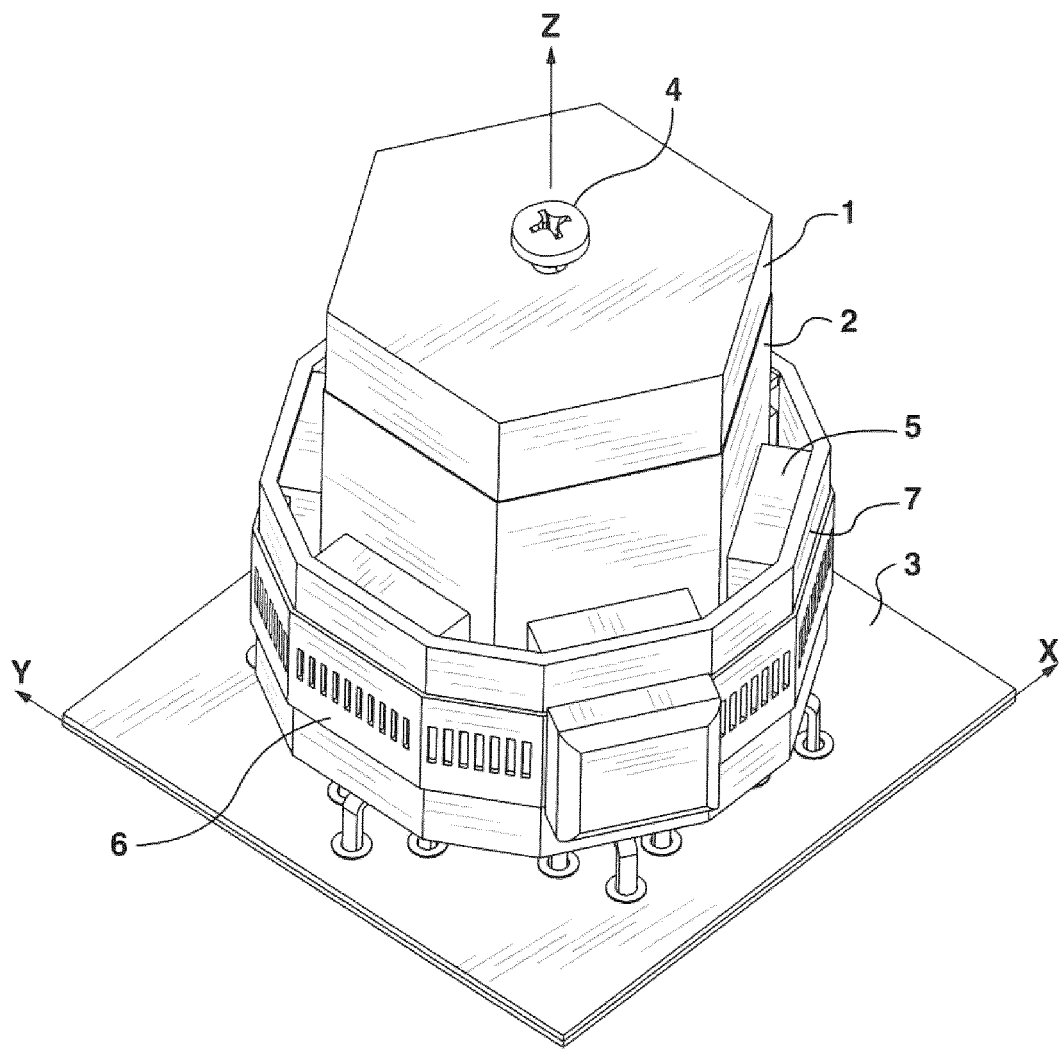
FIG. 1 shows a perspective view from above of a first embodiment of a heat sink assembly.

Various apparatuses or processes will be described below to provide an example of an embodiment of each claimed invention. No embodiment described below limits any claimed invention and any claimed invention may cover processes or apparatuses that are not described below. The claimed inventions are not limited to apparatuses or processes having all of the features of any one apparatus or process described below or to features common to multiple or all of the apparatuses described below. It is possible that an apparatus or process described below is not an embodiment of any claimed invention. The applicants, inventors or owners reserve all rights that they may have in any invention disclosed in an apparatus or process described below that is not claimed in this document, for example the right to claim such an invention in a continuing application and do not intend to abandon, disclaim or dedicate to the public any such invention by its disclosure in this document.

The embodiments described herein may, in one respect, provide a flexible cooling and interconnection system for implementing a wide variety of power circuits where size, weight, reliability, performance and cost are important considerations. The cooling and interconnect system provides flexibility and may solve common problems encountered with prior art methods. Referring to FIGS. 1 to 5, a first embodiment of an apparatus has a thermally conductive heat sink 1. Heat sink 1 is comprised of an initial N-sided 2-dimensional geometry in the x-y plane projected along the z-axis to produce a 3D object with N-faces typically, but not limited to, for example square (N=4), hexagonal (N=6) (as shown), rectangular (N=4) or octagonal (N=8) shapes. The N-sided 2-dimensional geometry is not limited to objects having even numbered sides, but may include 3D objects with N-faces where N is an odd number such as 3, 5 or 7 for example. These N-sided shapes may be extruded, cast, 3D-printed or otherwise formed into a bar with flat exterior faces. The N-sided shapes may be suitable for mating under pressure with the flat surface of a power dissipating device. Shown in the first embodiment of the apparatus is the special case for N=6.

An electrically insulating and thermally conductive coating or film 2 may be inserted between the bare electrically connected surface of the electrical device(s) (e.g. semiconductor(s)) and the heat sink to electrically isolate the electrical (e.g. semiconductor) device from the heat sink. In some applications, the film or coating may not be necessary. For example, the film or coating may not be necessary where the semiconductor surface is not required to be insulated from the heat sink. In such cases, if the heat sink is electrically conductive it can be used as a common current carrying element, typically capable of carrying very high currents, for example hundreds or thousands of amperes.

A printed circuit board (PCB) or laminated bus bar structure 3 is capable of connection to the electrical terminals of the semiconductor or other heat dissipating electrical devices using internal conductive copper planes. The printed circuit board or laminated bus bar structure 3 can implement a circuit while providing insulation between any number of interconnect layers. This multilayer planar connection approach allows currents to flow in opposite directions from one device to another which can result in magnetic field cancellation and an attendant reduction in parasitic inductances. Close proximity of multiple devices can further reduce the loop area compared to other commonly used schemes. The present disclosure can achieve low inductance because of short conductor connections to the circuit board in conjunction with the planar interconnect between power devices promoting magnetic field cancellation. A fixing mechanism 4 allows the heat sink assembly or apparatus to be secured to the circuit board and surrounding supporting hardware. The fixation method is typically a screw but is not limited to a screw. Different screw patterns or fixation methods may be used in different embodiments. A semiconductor or other heat generating and dissipating electrical device 5, or a number of such devices 5, each has a power dissipating surface intended to mate to a flat cooling surface. These devices can be identical or different from each other, for example they could be diodes, transistors, resistors, or hybrids in any combination to facilitate the construction of the intended functional electric circuit, and may be identified simply as heat dissipating devices.

A securing band/strap 6 is typically applied to the assembly. The securing band/strap 6 may provide a uniform clamping pressure to the group of heat dissipating devices. The securing band/strap 6 can be pulled tight with an integrated latching mechanism to facilitate the uniform clamping pressure. Examples of ideal securing band/straps include epoxy coated stainless steel that can be applied with controllable tension. These securing band/straps may be automatically crimped and cut using specialized application tools.

A compressible electrically insulating interface 7 can be applied between the semiconductor device and the securing band 6. The interface 7 can typically be implemented using compressible silicon rubber sheet. When compressed by the securing band 6, the compressible electrically insulating interface 7 deforms and produces a net inward force that securely clamps the surfaces of the electrical devices 5 to the heat sink 1. The compressible silicon rubber sheet also acts to distribute sharp point forces that may be present due to the strap 6 as it changes angle at the corners of the electrical devices 5, thereby preventing cracking of the plastic or composite material of the electrical device case (see FIG. 3). In one aspect the high corner forces at the device corners promote holding the device flat against the heat sink which is sometimes a problem in traditional screw mount applications.

Figure 17:
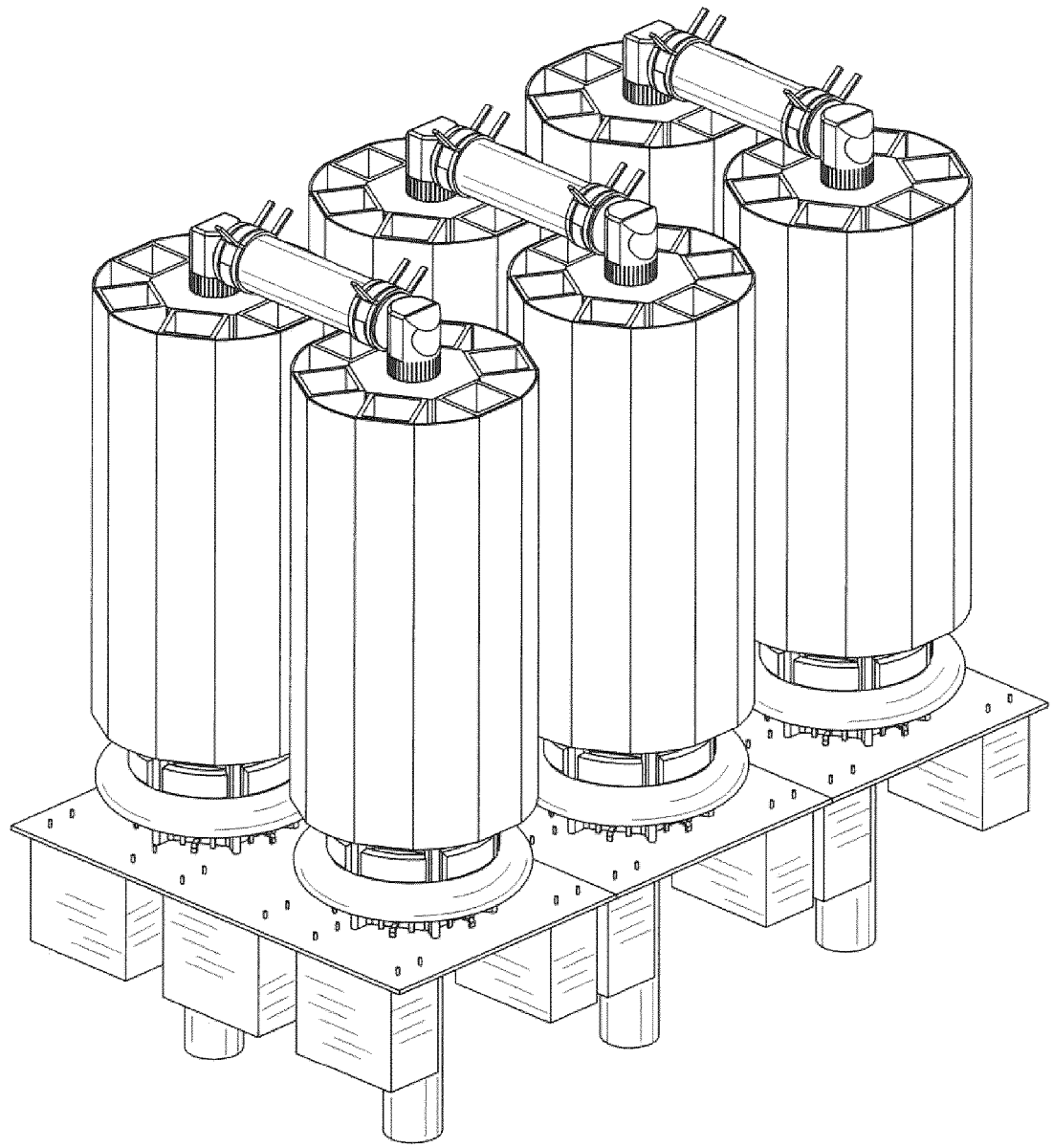
FIG. 17 shows a perspective view of six of the third heat sink assemblies of FIGS. 15 and 16 mounted on a printed circuit board and using an alternative pressure distribution device and alternative compressive strapping device on the power devices.
Figure 17A:
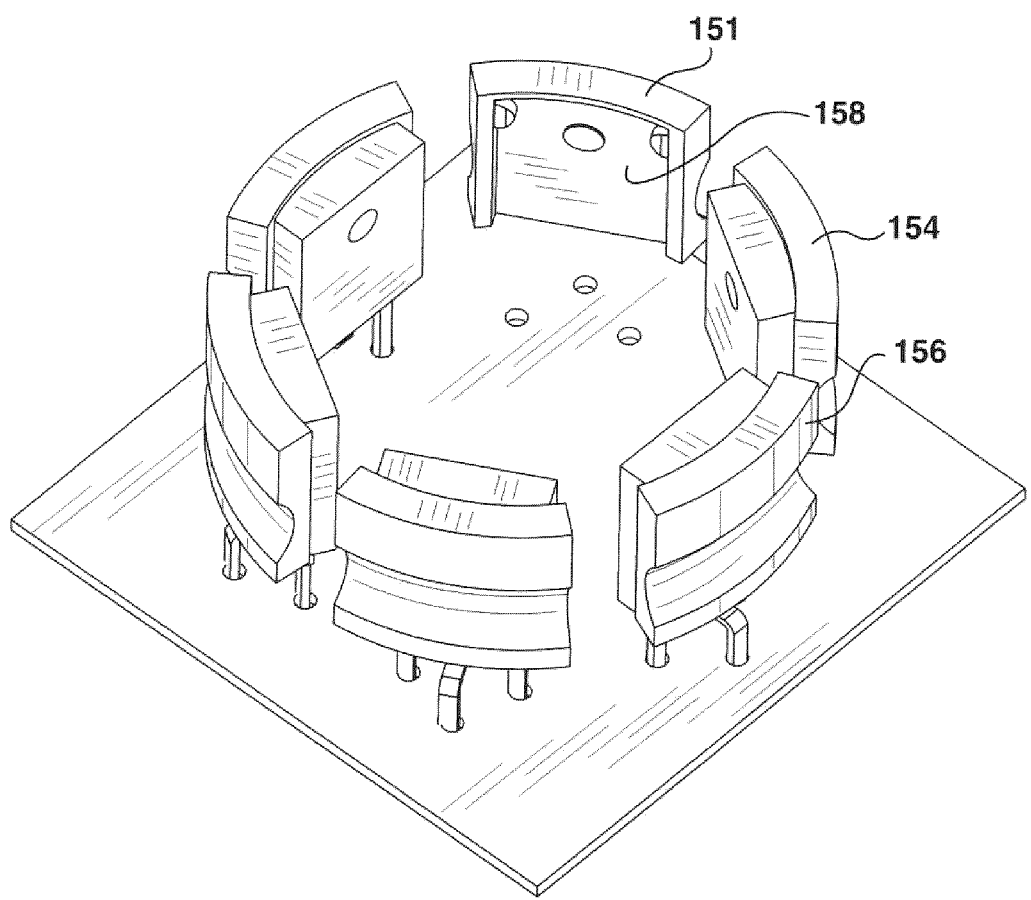
FIG. 17a shows a perspective view of an alternative pressure distribution device.
Figure 17B:
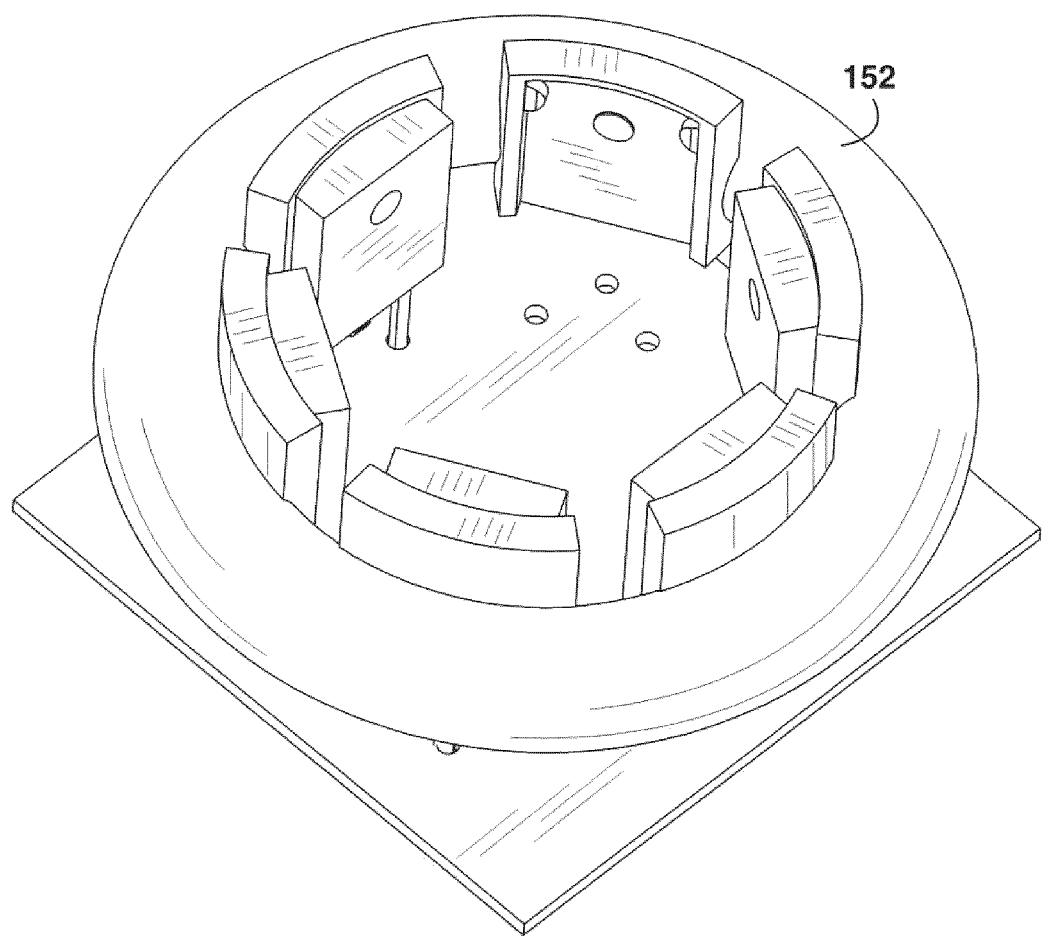
FIG. 17b shows a perspective view of an alternative compressive strapping device.

In cases where corner forces are undesirable, an alternative pressure distribution device 151 and strapping device 152 can be deployed as shown in FIGS. 17, 17a, and 17b. The alternative pressure distribution device 151 can be molded plastic, or ceramic to assure high voltage integrity is maintained. The alternative pressure distribution device 151 can be specifically molded to suit any unique features of the semiconductor devices 5. The alternative strapping device 152 may be a coiled tension spring contained within an insulated tube, or a spring silicon rubber ring that applies compression forces as result of its inherent stretch characteristics. The pressure distribution device 151 can also include pressure distribution elements 154. Each of the pressure distribution elements can have an arcuate, partly cylindrical outer surface 156. Each pressure distribution element 154 can also have an inner surface 158 that is flat or otherwise shaped to provide an even or other required pressure distribution to the respective device 5. The pressure distribution elements 154 may include shaped grooves corresponding to a shape of the strapping device 152. Where, as shown, the strapping device 152 is toroidal, the pressure distribution elements 154 can have a correspondingly shaped groove.

Figure 3:
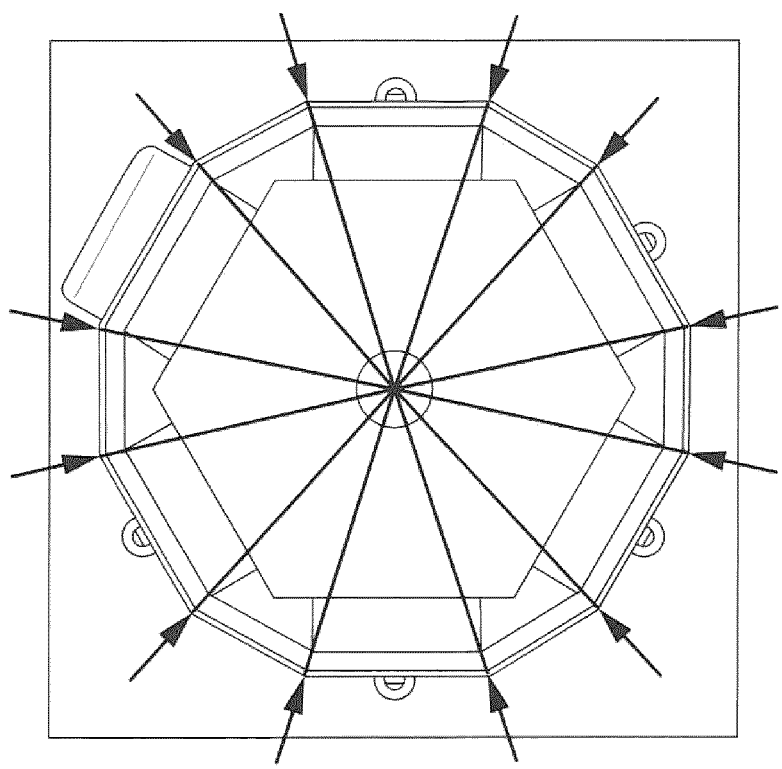
FIG. 3 shows a plan view of the heat sink assembly shown in FIG. 1.

A number of aspects of the first embodiment of the heat sink assembly are now described. FIG. 3 illustrates the symmetrical forces produced by the strap 6 under tension. This arrangement may produce a constant reliable clamping force that may be made higher than other device mounting methods thereby promoting lower effective thermal impedance at the surface interface. Forces produced by the strap 6 in tension may be directed concentrically through the center of the apparatus along the z-axis. This clamping method may provide for reliable operation as temperature changes which cause repetitive expansion and contraction in the various dimensions of components and materials. Since the strap 6 and the compressible electrically insulating interface 7 are compliant with spring-like qualities, they absorb any dimensional changes while maintaining tension. Those skilled in the art will recognize that mechanical compliance of materials and interconnects during repetitive thermal cycling may improve long term reliability. For emerging high temperature silicon carbide power electronics where normal temperature excursions may be several hundreds of degrees Celsius this aspect may be an enabling technology factor.

Figure 4:
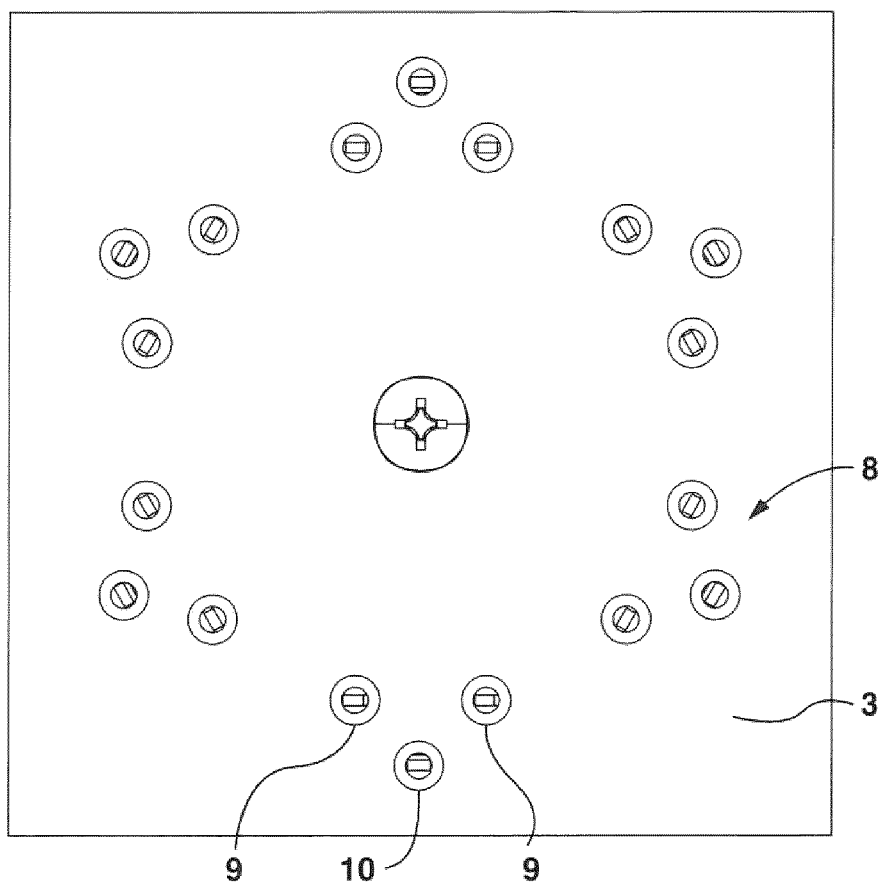
FIG. 4 shows a plan view of a pad-pattern for the heat sink assembly of FIGS. 1 to 3.

FIG. 4 illustrates an example of the symmetrical radially oriented pattern 8 of the devices for pads 9, 10, shown corresponding to the popular TO-247 semiconductor package. The symmetrical radially oriented pattern 8 promotes good high voltage management of creep and strike high voltage phenomenon, where creep is defined as the required safe high voltage clearance over the printed circuit board surface 3 and strike is the required safe high voltage clearance through the air. Those skilled in the art will recognize that the term "Safe" in this context refers to the creep and strike clearances that are determined to be safe by third party safety agencies will set minimum clearances as conditions of approvability based on operational voltages and environmental considerations, such as dust, moisture and chemical vapors present in any specific application category. Examples of such agencies are CSA, UL, VDE. Those skilled in the art will recognize that the exemplary pad pattern for the specific 3-terminal device of the TO-247 does not limit in this invention the use of other available packages with fewer or more pins, for example the emerging TO-247 4 pin Kelvin emitter package can also be chosen and pad patterns established that manage high voltage in similar fashion can be created.

The middle pad 10 that is positioned at the apex of the three pad terminals with the middle lead bent maximizes high voltage withstand capability on the surface of the printed circuit board 3. This allows the devices 5 to be placed close together promoting low loop inductance, while still maintaining good high voltage clearances.

Figure 5:
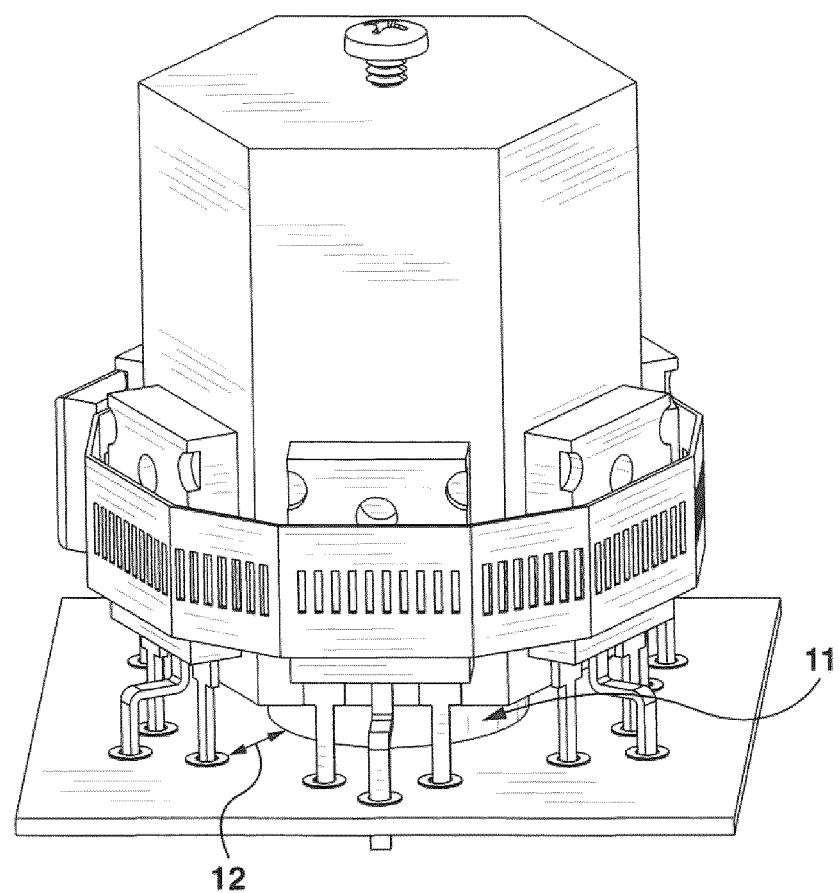
FIG. 5 shows a further perspective view of the first heat sink assembly of FIGS. 1 to 4.

FIG. 5 illustrates a deliberate undercut 11 made in the heat sink 1. This undercut 11 if not present would result in the printed circuit board pads 9, 10 being in close proximity to the heat sink 1. This would constitute a high voltage breakdown risk since the pads 9, 10 are typically at high voltage potential with respect to the heat sink 1. By utilizing the undercut feature 11, the creepage distance 12 over the surface reduces the electric field and arc hazard between the pads 9, 10 and the heat sink 1. It should be noted that the geometry of the undercut 11 can be controlled to meet or exceed various safety agency creepage requirements as applicable.

Figure 2:
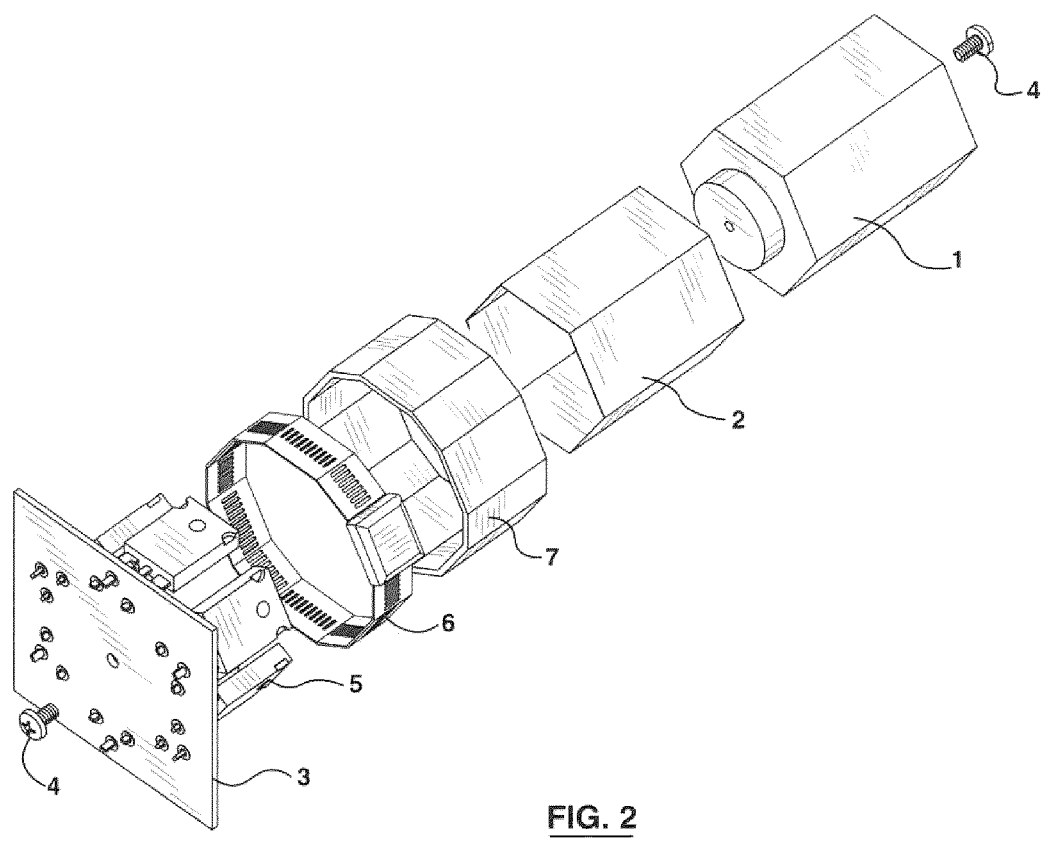
FIG. 2 shows a perspective, exploded view of the heat sink assembly shown in FIG. 1.

FIGS. 1 and 2 also illustrate how the leads 9, 10 of the semiconductor devices provide a compliant connection to the discrete device packages 5. The inherent flex in the leads 9, 10 of each device 5 allows reliable connections to be maintained over many thermal cycles where various elements experience expansion and contraction as a result of changing temperature. Such mechanical compliance minimizes solder joint fatigue. The multiple wire-bond and welded bond-wire attachment methods used in conventional power semiconductor modules can be one of the more significant issues affecting long term reliability. The present arrangements may offer a means to reduce the number of solder and weld bonds required and therefore may be made more reliable by comparison.

In the first embodiment of the heat sink assembly, the aforementioned attributes may give advantages and are also included in subsequent embodiments described herein. However the first embodiment as shown in FIGS. 1 to 5 may have limited thermal power dissipation capability because the surface area of the thermally conductive heat sink 1 is quite small. This low surface area may not promote prolonged heat transfer and convection of heat to the surrounding air from the heat sink 1. The first embodiment may still have significant utility in many low power loss applications because it allows multiple devices to be mounted in a lower volume configuration and with lower count and cost of mounting hardware compared to known discrete mounting methods. The limitation of low thermal power dissipation capability of the first embodiment stand-alone may be alleviated when another thermally conducting surface is provided that can carry substantial heat away from the N-sided heat sink block by thermal conduction.

Figure 6:
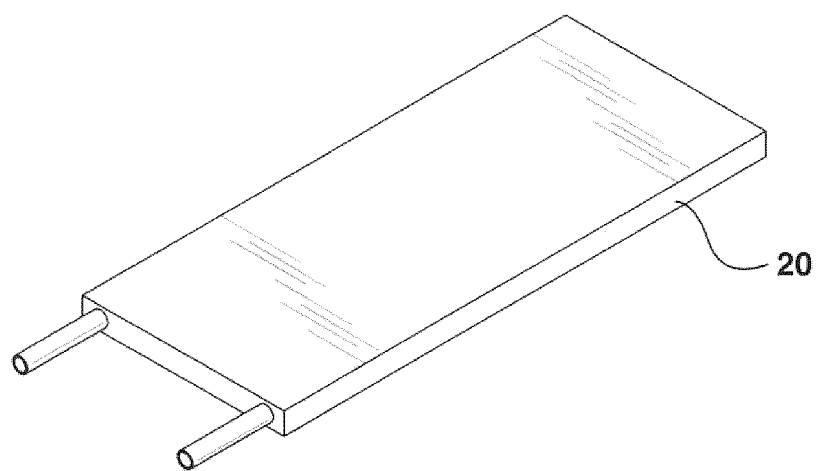
FIG. 6 shows a perspective view of a cold plate.

This can be achieved by providing a cold plate 20. The cold plate 20 provides a thermally conductive flat surface. The cold plate 20 can have embedded pipes for circulating a cooling fluid to carry heat away, as shown in FIG. 6.

Figure 7:
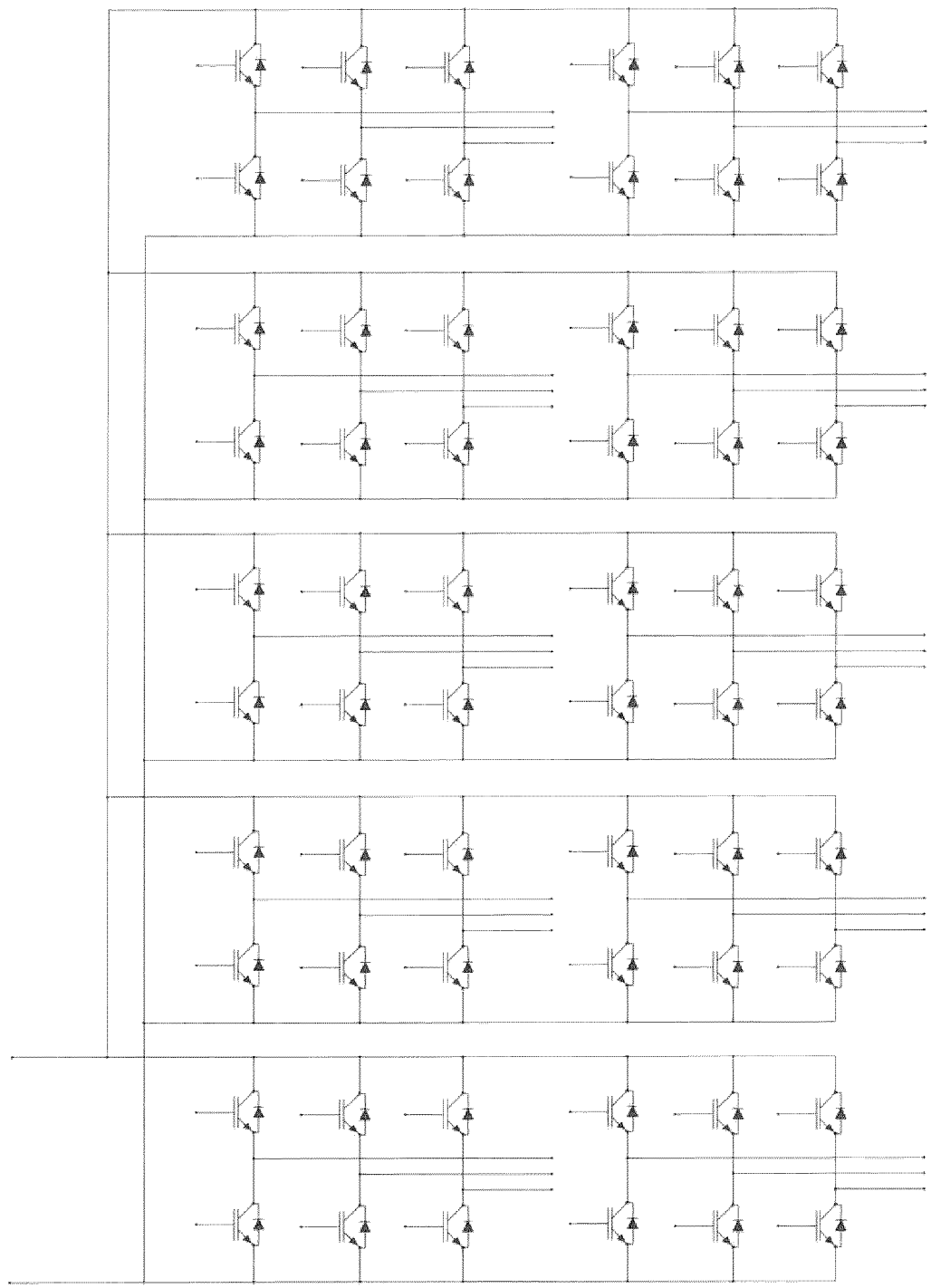
FIG. 7 shows a circuit diagram illustrating an arrangement of semi-conductor devices that may be placed on the heat sink apparatus of FIGS. 1 to 5.
Figure 8:
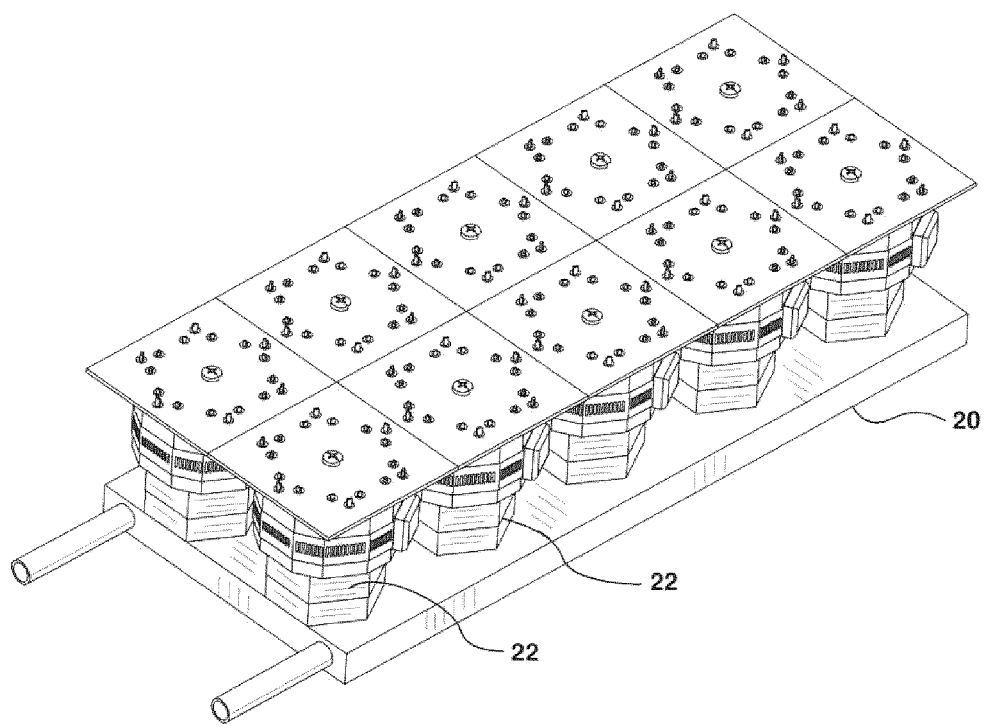
FIG. 8 shows a perspective view of several heat sink assemblies mounted on the cold plate of FIG. 6.

The utility of the first embodiment in reducing volume and providing efficient heat removal as well as enhancing packaging flexibility may become evident in a possible application illustrated with the example schematic of FIG. 7 and corresponding example physical implementation of that schematic shown in FIG. 8. Other examples are possible.

Using a standard 5 inch×12 inch cold-plate and printed circuit board construction method as shown in FIG. 8, ten heat sink assemblies with motor drive power circuits 22 are successfully packaged. Deployed in this configuration the first embodiment may provide high cooling capability, low inductance, and superior mounting and clamping forces. This configuration of the first embodiment may also allow the heat sink to be used as an integrated supporting mechanism for the entire printed circuit board. The cold plate 20 is securely connected to each heat sink 1 of the heat sink assemblies and motor device circuits 22.

The schematic of FIG. 7 is only intended as one possible example of many possible combinations of semiconductor, or other flat tab devices that might be selectively populated on the heat sink 1. Other circuit configurations are possible for example implementing different mixes of power supplies, motor drives, and other power conversion schemes and complete systems of components. The first embodiment of the invention allows improved volumetric efficiency compared to other prior art schemes by facilitating one common and flexible mounting, interconnect and cooling methodology.

With the first embodiment of the heat sink assembly, a single component failure can potentially be repaired. With highly integrated power modules such repair is not practical because the semiconductor die are soldered to the substrate internal to the module. In most cases, failure of one internal device in a power module results in molten solder and copper fragments causing other devices to be damaged. In the power module case, if a single semiconductor fails, the module must be removed and replaced with a new module and the defective module often ends up in a landfill site after being disposed. With the first embodiment described herein, failure of one device may cause the plasma blast to be directed away from other devices, thereby increasing the survivability of the other devices, and maximizing the possibility of repairability. The failed semiconductor can be removed, disposed of and replaced—minimizing the waste incurred with the power module approach.

Optionally, one printed circuit board or multiple printed circuit boards 3 can be used in the arrangement shown in FIG. 8 to reduce cost (single printed circuit board) or enhance repairability (multiple circuit boards) and manufacturability as desired.

The strap (6), heat sink (1), insulator (2), device (5) and compressible interface 7 of the first embodiment can be assembled to the PCB before the final assembly is screwed to the cold plate (8) thus possibly simplifying assembly complexity and reducing labor.

The design community can copy and paste the printed circuit pattern using printed circuit board design CAD software to promote reuse. Modifications to the circuit can be easily and quickly engineered, allowing better performing devices to be quickly adopted and utilized as they are developed. The design should not become obsolete as compared to power modules where the manufacturer may choose to discontinue production of the module at any time in its life cycle triggering the designers to have to re-engineer their products—a costly and time consuming process.

Little or no special tooling or materials are required to implement the first embodiment so that little or no capital investment is required to use or license the technology. It will be shown that in some embodiments described herein, readily available mass produced extrusions may be available to allow minimal costs to be achieved even in low initial production volumes.

However, the use of a cold-plate 8 with the first embodiment may have some associated disadvantages. For instance, the cost of cold plates can be economically prohibitive in many applications.

The weight of cold plates can also be undesirable. The weight of a final product is typically affected significantly by the presence of cold-plates and weight is an increasing concern as shipping costs go up with increasing transportation fuel costs. Aerospace, military and space applications also place a high premium on weight.

Conducted electromagnetic interference (EMI) currents can be carried by the common connection produced by the common metallic cold-plate and electrically conducting heat sink. In some cases, this may help reduce conducted emissions. In other cases this can make it difficult to manage conducted emissions. Ideally a designer would like to be able to only make a connection of the heat sink to the cold plate at his or her discretion. The need to manage this aspect of EMI control varies widely from power circuit type to type. Cold plates and common heat sink applications suffer from the unintended coupling of EMI currents. Consequently, the ability to electrically isolate the heat sinks 1 in FIG. 8 from each other or alternatively connect them to preferred circuit nodes may be a valuable design advantage because the designer can then exploit electromagnetic interference solutions that, prior to having this degree of freedom, were not possible.

The thermal impedance produced by the length of the heat sink and its material properties are the ultimate limiting factors in keeping the devices cool. Given high enough power dissipation, the mounting scheme of FIG. 8 may not be effective at maintaining a low enough device junction temperature because of the thermal impedance limits.

Figure 9A:
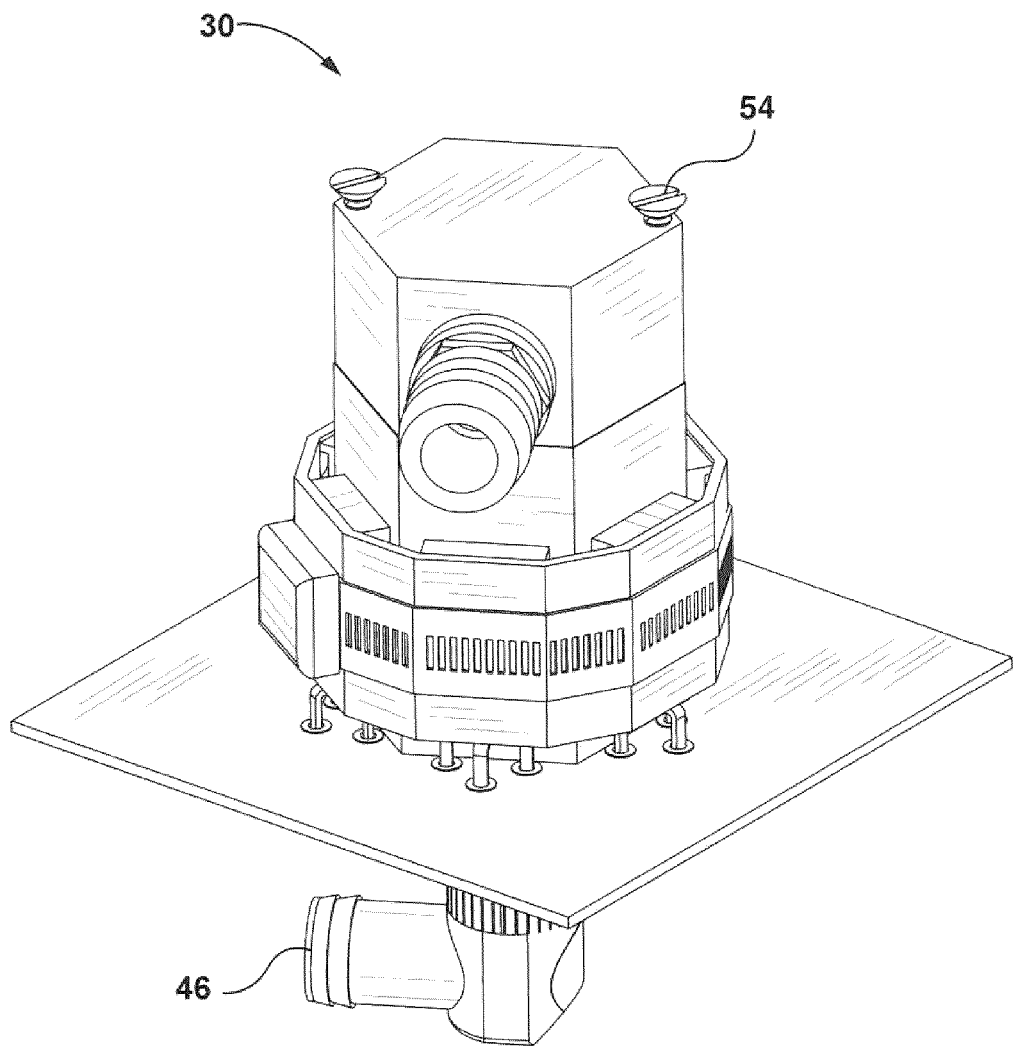
FIGS. 9a and 9b show perspective views from above and from below of a second embodiment of the heat sink assembly.
Figure 9B:
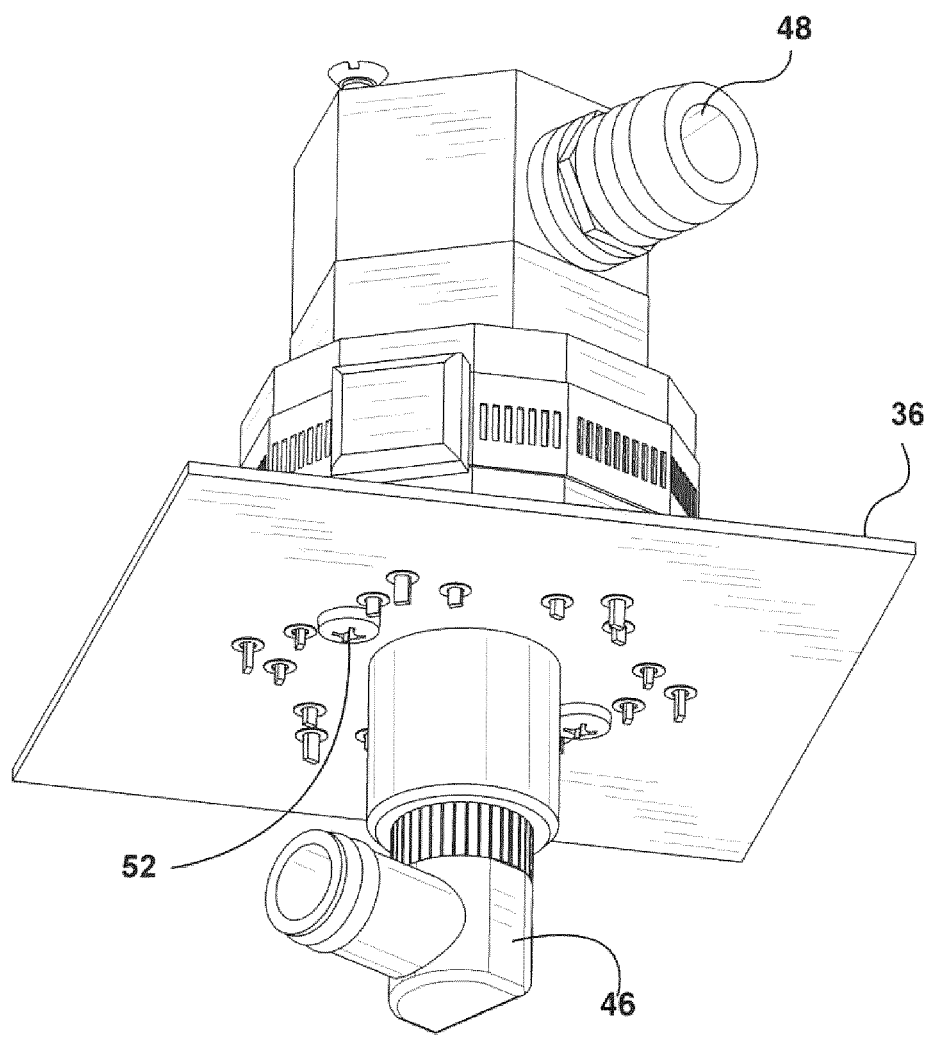

A second embodiment described below may overcome at least some of these disadvantages. FIG. 9 illustrates a heat sink assembly 30 of the second embodiment. The second embodiment utilizes all of the elements of the first embodiment with several modifications.

The second embodiment of the heat sink assembly 30 may provide high performance cooling by allowing the circulation of a cooling fluid. The cooling fluid medium chosen can be many different types of fluid. Some examples are water, ethylene glycol/water mix, oil, Fluorinert, Freon, Polyalphaolefin (PAO), ammonia and/or other engineered cooling fluids, such as Novec™ by 3M.

Figure 10:
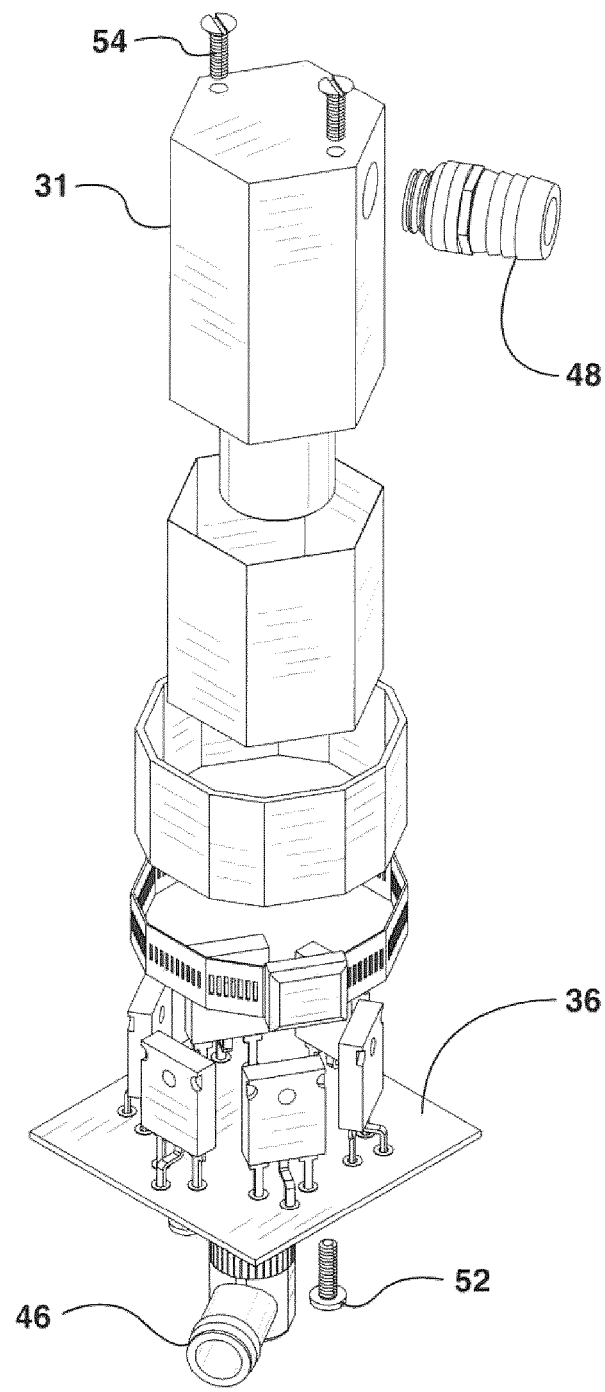
FIG. 10 shows a perspective exploded view of the second heat sink assembly.
Figure 11A:
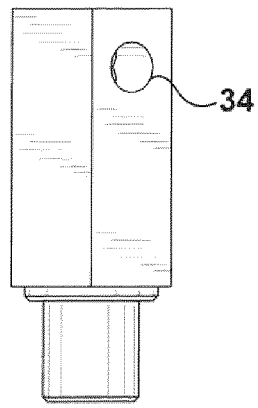
FIGS. 11a, b, c and d show views of the heat sink of the second heat sink assembly.
Figure 11C:
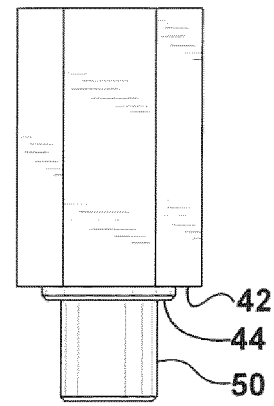
Figure 11B:
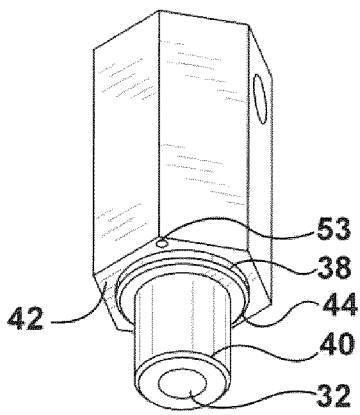
Figure 11D:
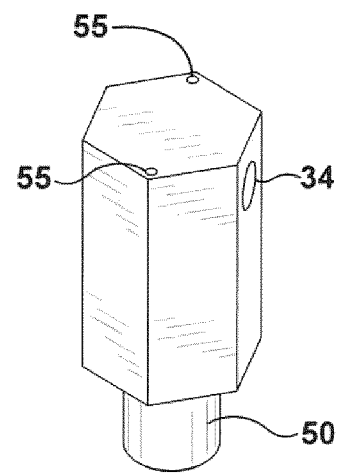
Figure 12:
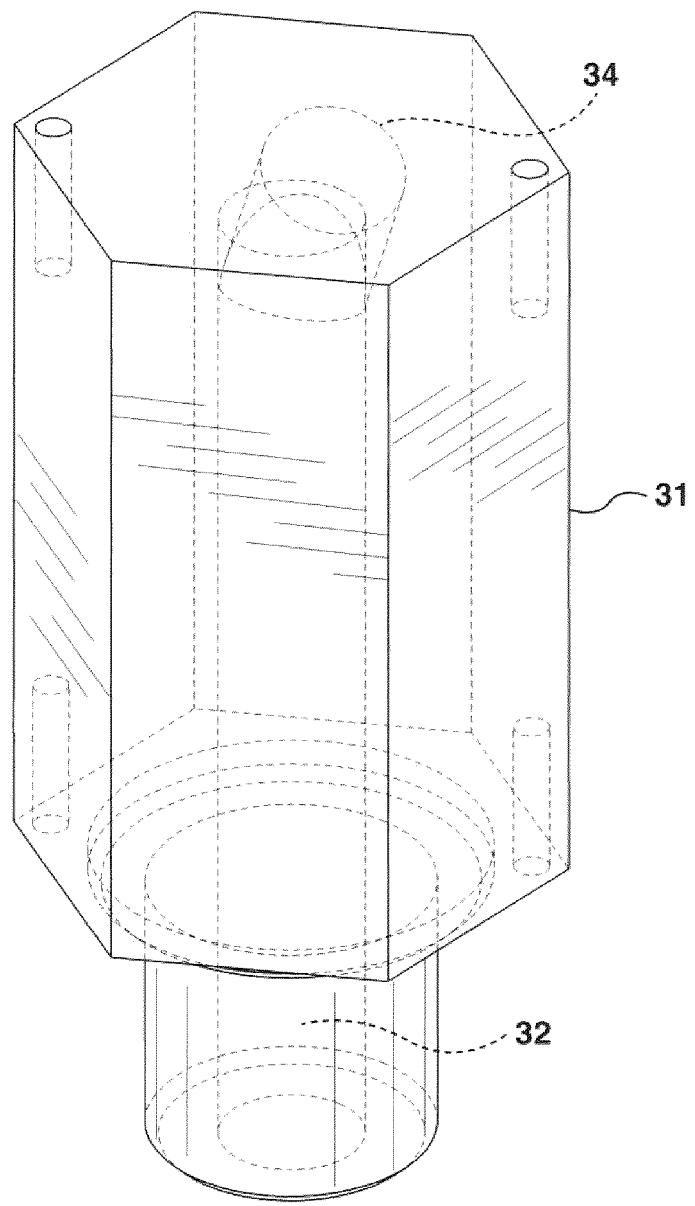
FIG. 12 shows a perspective transparent view of the heat sink of the second heat sink assembly.

In this second embodiment of the heat sink assembly 30, coolant fluid typically enters through a lower pipe fitting 46 and warmer fluid typically exits through an upper pipe fitting 48 in FIGS. 9 and 10. The lower pipe fitting 46 is connected to a central bore 32. The bore 32 is a blind bore in the heat sink 31. The bore 32 terminates below the top of the heat sink 31 and connects to side aperture 34, which in turn is connected to the upper pipe fitting 48. Thus, the central bore 32 extends generally along z-axis, while the side aperture 34 extends generally perpendicularly to the z-axis.

As with the first embodiment, the heat sink 31 is provided with an undercut 42, which leaves an end surface 44 that abuts the printed circuit board 36 to provide for thermal conduction of heat away from the circuit board. The other periphery of the surface 44 can be provided with a chamfer 38. Additionally, an extension 50 of the heat sink 31 can also be provided with a chamfer 40. The use of chamfers at the intersection of otherwise perpendicular surfaces is optional to remove sharp edges. In the case of surface 44, the use of chamfers may prevent the heat sink 31 from cutting into the softer circuit board 36 during vibration.

The surface 44 of the heat sink 31 that rests on the printed circuit board 36 provides the added important utility of conducting heat produced inside the printed circuit board 36 where copper conductors are placed to produce electrical interconnection. Heat produced by ohmic losses due to current flow is carried away because the surface of the PCB 36 is in contact with the thermally conductive heat sink 31. Since the heat sink 31 is liquid cooled, the printed circuit board 36 effectively becomes indirectly liquid cooled.

The existence of the central bore 32 precludes using a single central screw for securing the assembly. Consequently, the second embodiment provides two screws 52 as shown in FIG. 10. It should be noted that the further screws 54 are typically conductive metal but can also be made of composite non-conductive material. The two screws 52 are in close proximity to the high voltage pads on the printed circuit board 36 and will often need to be made of a non-conductive material to eliminate arc hazard. Examples of screw material suitable for screws 52 are nylon, polycarbonate, polyvinyl chloride (PVC), but the preferred material is acetal, or similar low moisture absorbing materials. Acetal is preferred because of its strength and non-moisture absorbing characteristics.

The upper pipe fitting 48 in FIG. 10 is illustrated as a straight threaded barb fitting. The side aperture 34 shown in FIG. 11 can be threaded to accept the upper pipe fitting 48. The exit port produced by the upper pipe fitting 48 in FIG. 10 and the side aperture 34 of FIG. 11 is one of many possible ways of configuring the plumbing interface to the assembly and does not in general preclude any other possible variants of the basic scheme shown in FIG. 10 and FIG. 11.

The lower pipe fitting 46 as shown in FIG. 10 can be a right-angle threaded barb fitting. An extension 50 and the central bore 32 of FIG. 11 can also be threaded to accept the lower pipe fitting 46 of FIG. 10. It should be noted that the exit port produced by the lower pipe fitting 46 and the central bore 32 in FIG. 10 and FIG. 11 is one of many ways of configuring the plumbing interface to the assembly and does not in general preclude any variants of the basic scheme shown in FIG. 10 and FIG. 11.

Small chamfers 38 and 40 shown in FIG. 11 are optional finishing features that may be used to eliminate sharp edges. The heat sink 31 can also include threaded bores 53 and 55 for the screws 52 and 54.

Figure 13:
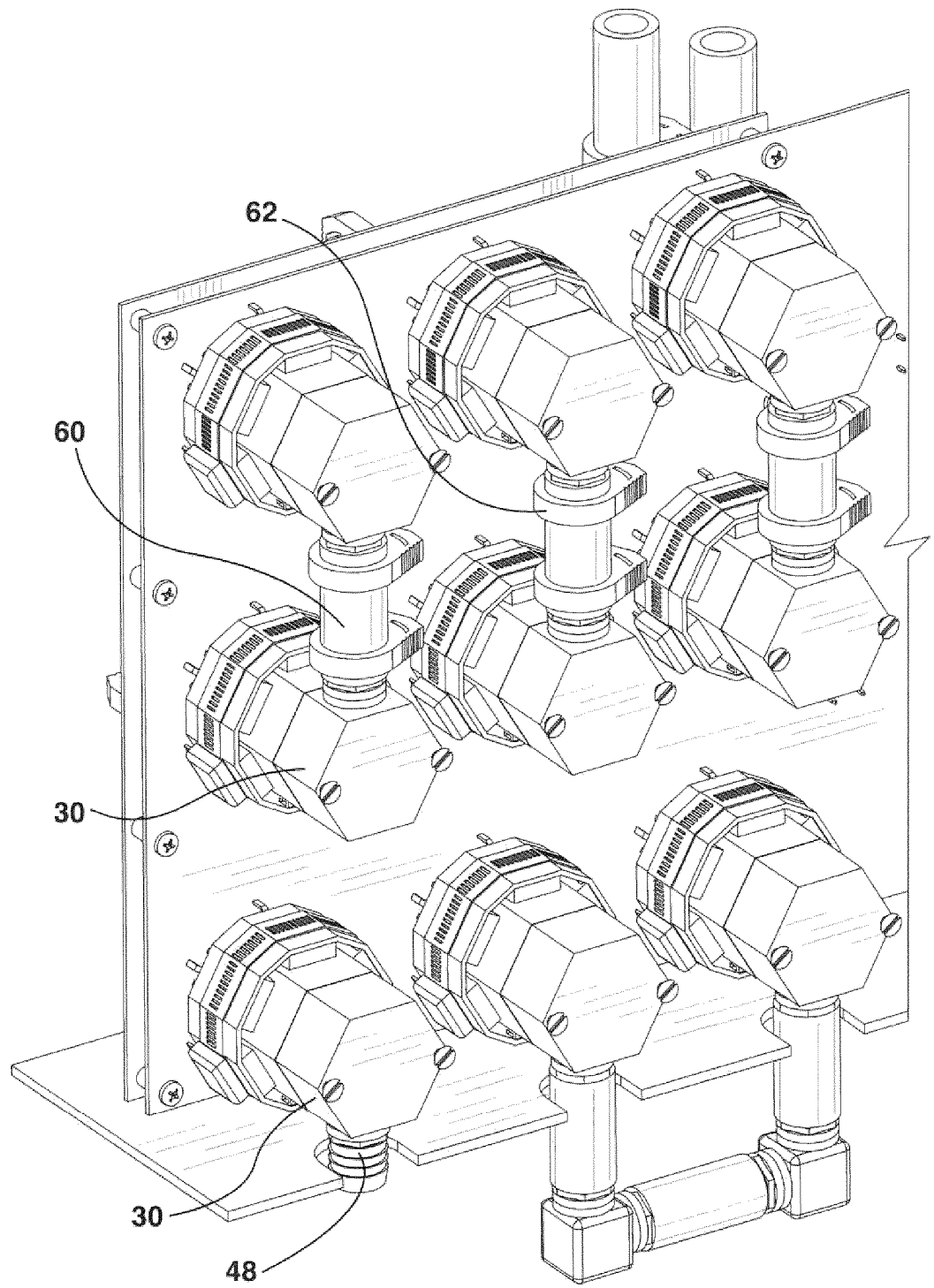
FIG. 13 shows a perspective view of a power electronic system including nine of the second heat sink assemblies mounted on a circuit board.
Figure 14:
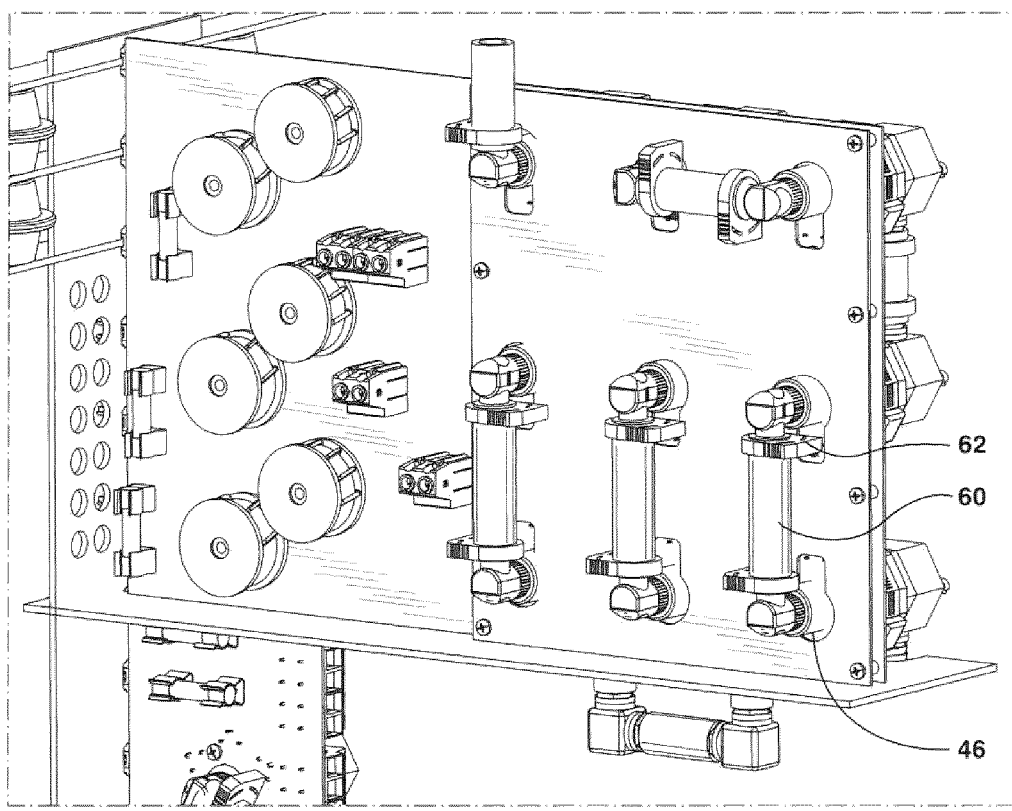
FIG. 14 shows a perspective view from underneath the printed circuit board of the power electronic system of FIG. 13.

FIG. 13 and FIG. 14 illustrate the heat sink assembly 30 of the second embodiment deployed in a large power electronic system example. This specific example implements a three-phase three level inverter power circuit and several chopper circuits, using nine heat sink assemblies 30.

Flexible plastic tubing links 60 (e.g. Tygon™ glass fiber re-enforced) are secured to the lower and upper pipe fittings 46, 48 with a self-clinching hose clamp 62 that may be made of acetal plastic.

The lower pipe fittings 46 that are mounted at a 90° angle can be positioned to allow an array of the second heat sink assemblies 30 to be assembled with plumbing interconnected in many different ways using the same plastic tubing links 60 and the hose clamps 62.

The second embodiment may provide several advantages. For instance, the weight of the second embodiment may be less than the cold plate implementation of the first embodiment. The mass of metal required for the cold plate version (FIG. 8) acts as a support mechanism and thermal transfer medium to the cooling fluid, where it is not required in this embodiment. In this embodiment, the only heavy (typically metallic but not limited to metal) items may be the N-sided heat sinks 31 that support the heat dissipating devices, which may be small by comparison to the cold plate mass.

Rigidity, strength, and arc-threat safety of the second heat sink assemblies 30, compared to the cold plate first embodiment example, may be provide by the use of a composite insulating sheet or board that each heat sink 31 can be secured to. The composite insulating sheet or board may be a composite insulating sheet (typically electrical grade GPO-3). The insulating sheet or board could also be printed circuit boards (typically made of FR4 or polyimide insulating composite materials with components on outside layers and interconnections). This makes the assembly light, strong, and less prone to destructive arcing if ever a failure occurs, because of the comparatively large reduction in metal available for vaporization and subsequent arc propagation in any arcing event.

The removal of heat may be faster in the second embodiment compared to the first embodiment-cold plate example because the heat dissipating devices are much closer to the fluid flow, as compared to the cold plate.

While the tubing links 60 are shown in FIGS. 13 and 14 providing a series connection between the heat sink assemblies 30, other configurations could be used. For example, the cooling fluid connection could provide for parallel connections or a combination of parallel and serial connections.

The first embodiment may provide a relatively low surface area for convective cooling. The second embodiment provides cooling by providing liquid cooling, and it is to be understood that any suitable fluid, even some gases instead of a liquid, could be used for cooling. In some applications, the presence of liquid of any kind is not allowed. A third embodiment may share positive attributes of the features of the first and second embodiments, but provide an adaptation that provides for convection cooling using air or other gaseous medium.

Figure 15:
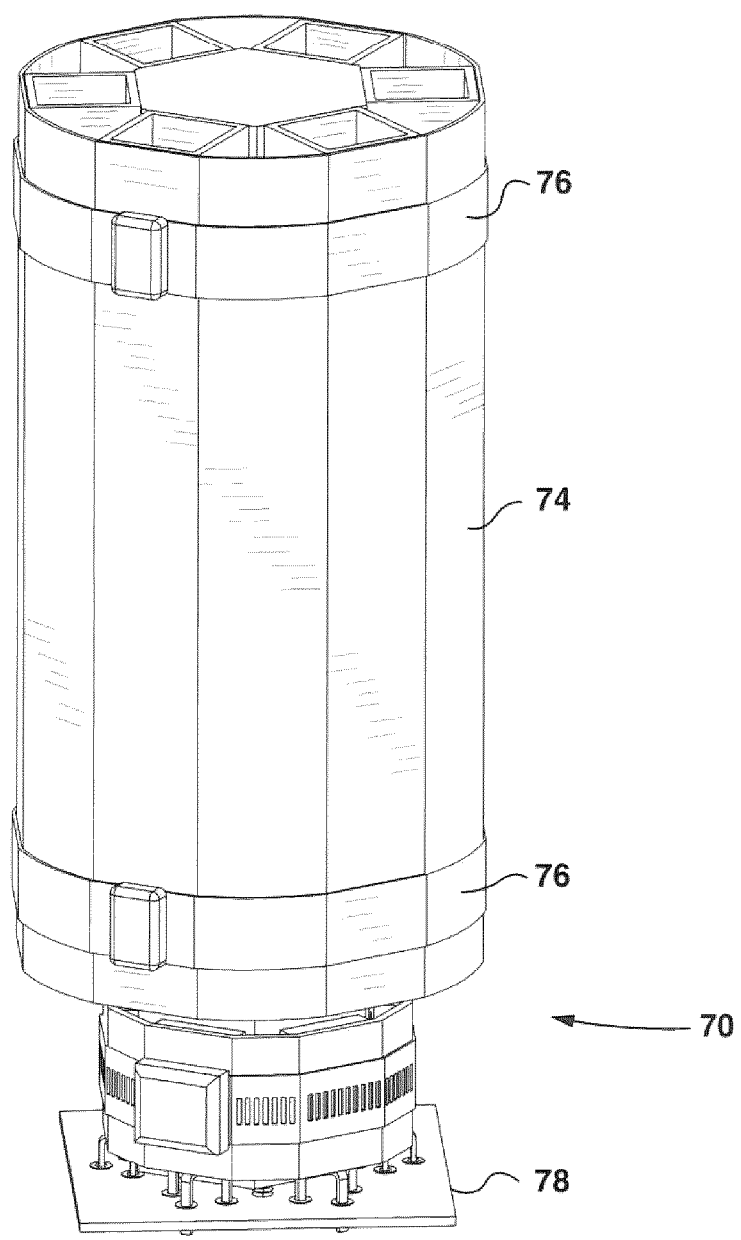
FIG. 15 shows a perspective view of a third embodiment of a heat sink assembly.
Figure 16:
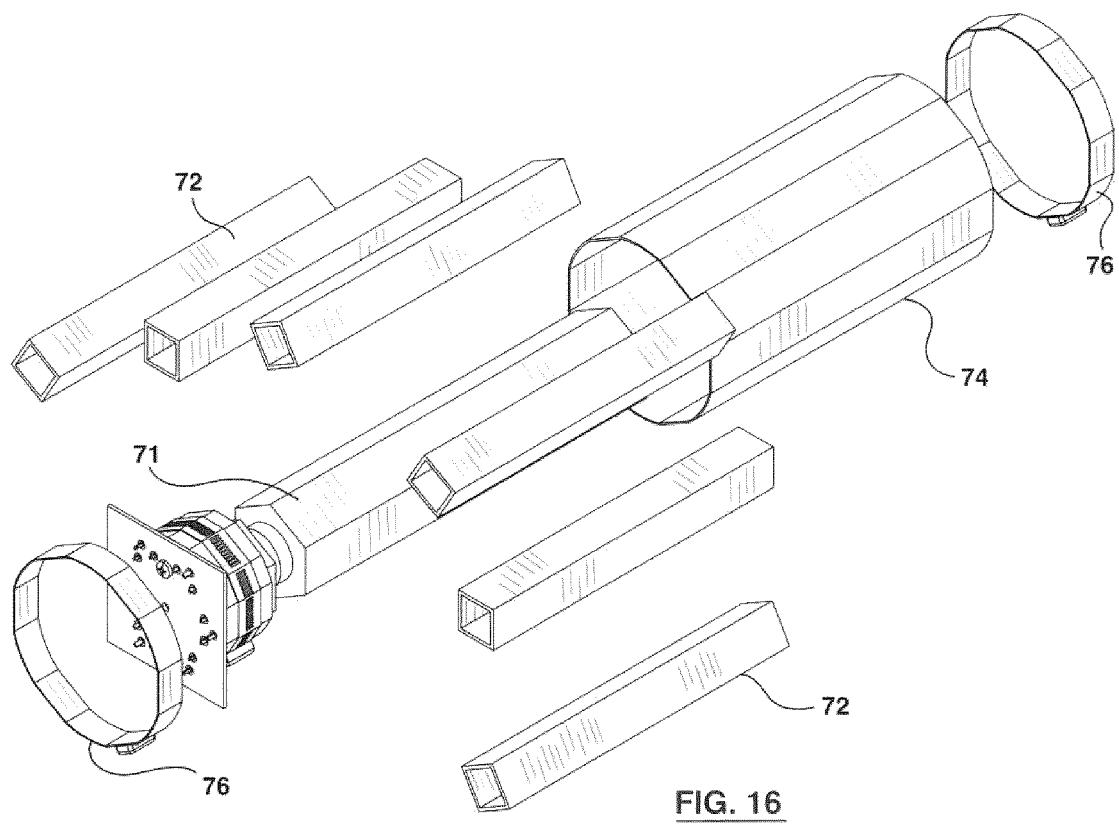
FIG. 16 shows an exploded perspective view of the third heat sink assembly of FIG. 15.

FIG. 15 illustrates one possible version of the third embodiment of a heat sink assembly 70. FIG. 16 illustrates an exploded view of the heat sink assembly 70.

The heat sink assembly 70 has a heat sink 71 that is similar to the heat sinks 1 and 31 of the earlier embodiments, except that its length has been extended. Tubes 72 (six shown) have faces that can be mated to the faces of heat sink 71. The tubes 72 may be square or rectangular. A cowling 74 surrounds the heat sink 71 and tubes 72 to form a plenum that constrains air flow through the cylindrical geometry to promote cooling. A high tensile strength strap 76 can tightly bind the components 71, 72 and 74 together.

The components 71, 72 and 74 when compressed by one or more straps 76 results in the flat mating surfaces being clamped together at pressure. This promotes high heat transfer and low thermal impedance.

The assembly 70 of FIGS. 15 and 16 can be convection cooled or alternatively force air cooled by mounting a cooling fan near the top. Air drawn into the lower section of the assembly 70 also cools the printed circuit board 78 by venturi like action as air is required to flow over the surface of the circuit board 78 and the power devices, to promote cooling.

Figure 18:
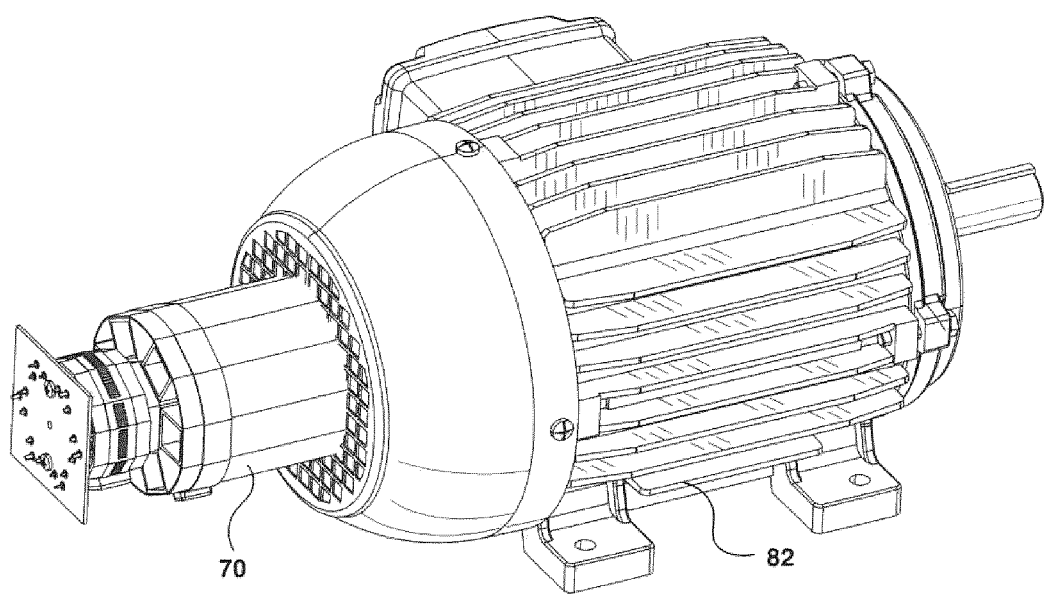
FIG. 18 shows a perspective view of the apparatus of FIGS. 15 and 16 mounted to an electric motor.
Figure 19A:
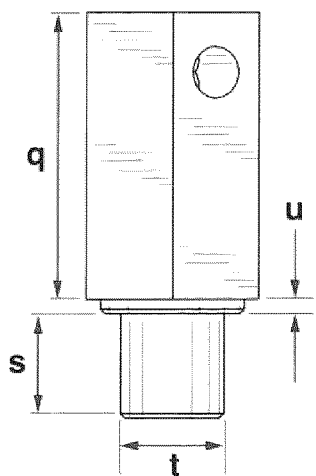
FIGS. 19a, b, c and d show respectively a first side view, a perspective view from underneath, a second side view and a perspective view from above of the heat sink of the third heat sink assembly.
Figure 19B:
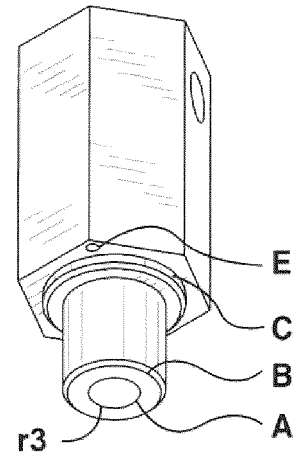
Figure 19C:
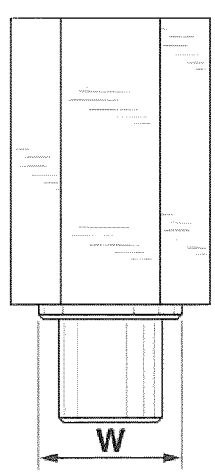
Figure 19D:
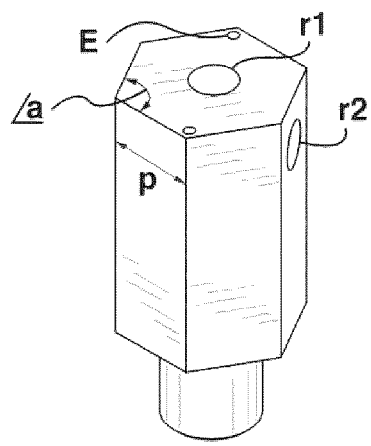

FIG. 18 shows the heat sink assembly 70 mounted directly to an electric motor 82. The motor 82 may include an integral fan that can serve to cool the assembly 70.

Construction of the heat sink assembly 70 can utilize an assembly jig to hold the components in place prior to clamping. Alternatively, adhesive can be applied between the faces of the heat sink 71 and the tubes 72 and/or between the tubes 72 and the cowling 74, prior to tightening the straps 76 which help hold things into place. For instance, thermally conductive adhesive or double sided adhesive coated copper tape can be used to hold the components in place.

The heat sink assembly 70 of the third embodiment may be inexpensive and non-critical to manufacture owing to the fact that all pieces can be straight cut, and lengths may require low precision cuts in most cases.

Another variation of the heat sink assembly 70 of the third embodiment may include a central-bore that provides for fluid flow straight through the assembly with plumbing fittings at both ends of 70, as shown at r1 in FIG. 19. When this is done, both liquid and air cooling work together in removing heat. FIG. 17 shows this solution with 90 degree barb fittings and tubing used to plumb fluid in a distributed array implementation. This effectively provides a combination of heat spreader and radiator and can use passive convection cooling or optionally forced air cooling or both simultaneously. Again, it is to be understood that the liquid cooling could be any suitable fluid, including suitable gases, and further that the air cooling encompasses cooling by any suitable gas.

Arc Threat Reduction (ATR) Variation

The disclosed embodiments may provide utility in part by allowing high power density by volume to be achieved by coordinating the simultaneous goals of high current, high voltage and thermal management in an effective 3D geometry.

However, safety will likely be a dominant goal or consideration, as the goal of highest possible power density by volume is achieved.

The reason is subtle and may not be readily apparent. The power sources connected to such equipment may exhibit low source impedance. This is a required for high system efficiency. Consequently, when a fault occurs such as the failure of a semiconductor device or other electrical device within the assembly, the high fault current available from the source will quickly cause high melting temperatures to occur within the device.

When a semiconductor die melts, the separation of molten material from the electrodes will result in an arc. Typically, in many power circuits that might be used, this arc will be fed by DC current that does not commutate (break) easily.

As the process continues, the severe energy delivered to the arc proceeds to melt adjacent materials launching them into the plasma which vaporize and become plasma themselves flooding the region with highly conductive material that sustains the arc.

Traditional protection systems normally must detect and remove power quickly to prevent this plasma ball from proceeding so quickly as to cause expansion forces that will cause the enclosure to explode. However, these protection systems themselves have limited reliability and often are composed of the very same power electronics devices. If they fail to open, then the prospect of the enclosure being engulfed in full plasma and the equivalent of an arc furnace is quite possible.

The value of an intrinsically safe power electronic packaging system such as the one described should be clear.

Figure 22:
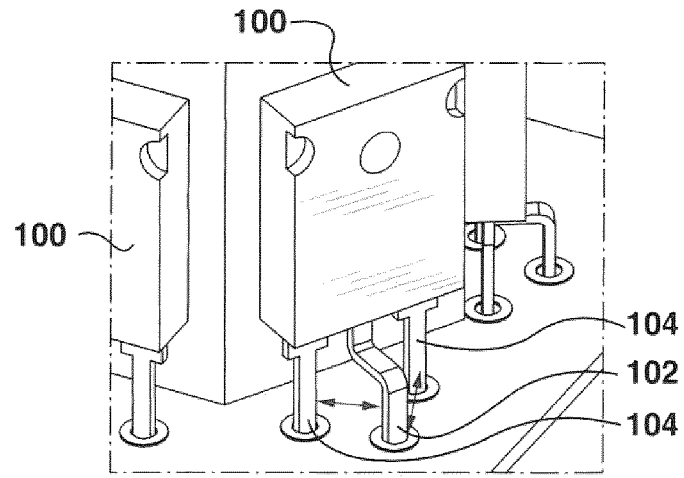
FIGS. 22, 23 and 24 show a perspective view of three terminal power devices mounted, illustrating failure.
Figure 23:
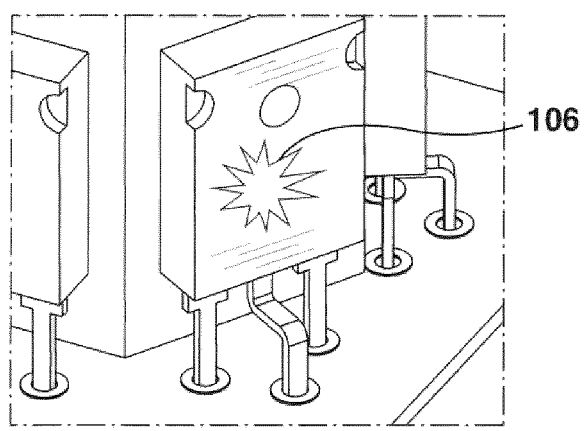
Figure 24:
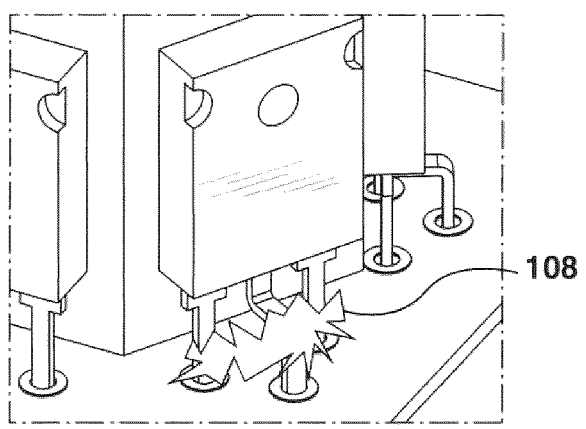

The arc process that occurs is illustrated in FIGS. 22-24. FIG. 22 illustrates a close-up view of one of the three terminal power devices 100 mounted. Typically a center pin 102 is at high voltage with respect to the two outside pins 104.

When a failure occurs it begins at the die level. The arc begins within the device package 106, as illustrated in FIG. 23.

When an arc occurs, the package of the device inevitably ruptures and if the arc continues to burn, it consumes all material in its path as it burns backwards towards the source. The arcing process continues provided the power source remains connected, and will only stop when separation distance between the arcing electrodes causes the plasma density to fall below arc-sustaining levels.

Voltage levels required to sustain an arc are much lower when the presence of plasma fed by combusting materials in the vicinity exist. The presence of metals and organic materials that cannot sustain the high arc temperatures without degradation tend to keep the arc alive for an indefinite period in an enclosed environment. Most enclosures by definition are enclosed environments. This is exactly how an arc furnace operates.

Invariably, the process proceeds with the arc burning backwards towards the source—in FIG. 22 the source is in the direction of the surface of the printed circuit board. FIG. 24 illustrates an arc 108 as described, as it impinges upon the printed circuit board surface.

The plasma ball that moves to the printed circuit board will only commutate when the density of plasma reduces to a level low enough to cause the arc to extinguish. If it reaches the circuit board, the organic insulation materials (typically FR4 or Polyimide having glass transition temperatures between 120 C and 280 C) are no match for the many thousands of degrees arc temperature and quickly decompose, and carbonize creating high conductivity short circuits in the printed circuit board, and the arc and fire continues to burn.

The arc can then travel and destroy the printed circuit board and possibly propagate further.

Clearly safety is a key concern in high power density applications, but even putting safety aside, the prospect of un-repairable damage resulting from a single failure in the life of a product is highly undesirable.

For this reason, a variant is now described which mitigates the arc threat problem. The variant consists of five distinct elements that can be used separately or in combination for maximum safety benefit. These elements may be used with the various heat sink assembly embodiments described herein and variations thereof.

Figure 25:
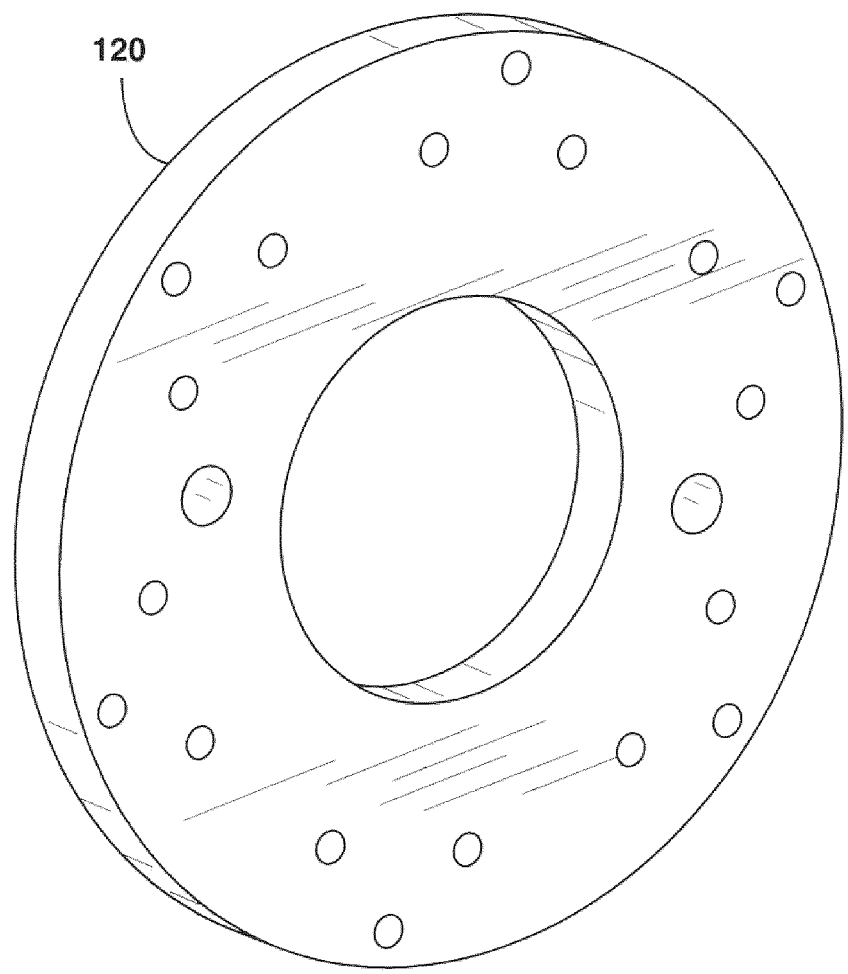
FIG. 25 shows a perspective view of an isolator.

FIG. 25 illustrates an isolator disc 120. The isolator disc 120 can be formed of flexible ceramic woven fabric cut into the shape shown. The material of the disc 120 is preferably Cotronics Rescor ceramic Fiber Blanket available in many thicknesses or several stacked Ultra-temp 300 or 390 ceramic papers with 3000° F. (1650° C.) service temperatures.

Figure 26:
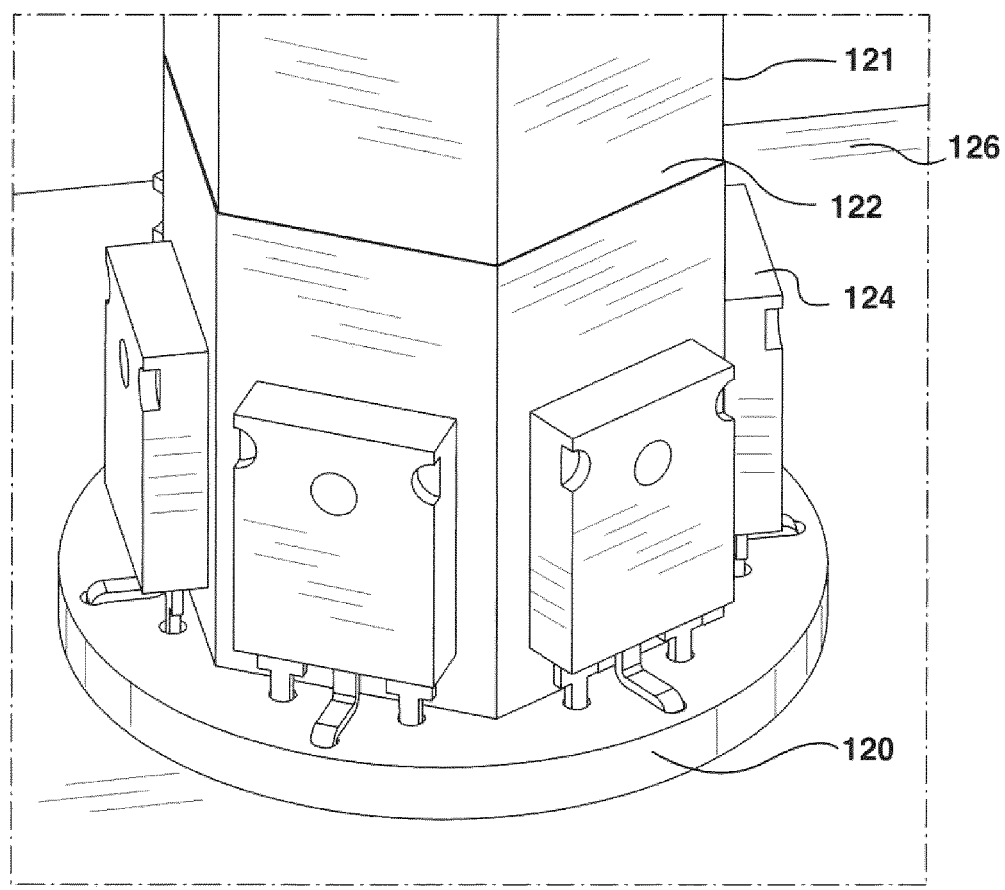
FIG. 26 shows a perspective view of the isolator of FIG. 25 mounted on a heat sink assembly.

FIG. 26 illustrates how the isolator disc 120 can be assembled into a heat sink assembly, here indicated as 122. The heat sink assembly 122 also includes a heat sink 121 and devices 124 mounted to a printed circuit board 126. When an arc burns back, before it reaches the printed circuit board 126 it encounters the ceramic barrier of the isolator disc 120. The densely woven multi-filament ceramic does not break down at the high temperatures and acts to intervene with the ongoing ionization process. As the copper leads burn back into the body of the isolator disc 120, the exposed surface area of the conductor rapidly diminishes. The plasma laden with ionized species cools due to the reduced energy injection into the arc precipitating the chemical by-products of the arc-cracking process on to the ceramic filaments. These gaseous conductive constituents are thus removed from further participation in the propagation of the arc. The arc commutates at this point with limited and repairable damage.

The isolator disc 120 not only mitigates arc threats but also acts to fill the otherwise empty region of the power device leads and the undercut of the heat sink 121. Without the isolator disc 120, the prevalence for dust and other material to congregate in the lead region or undercut region can be high. This is because high voltage has a tendency to produce electric fields that attract dust and foreign debris. The isolator disc 120 effectively prevents debris from accumulating in the undercut region.

Figure 27:
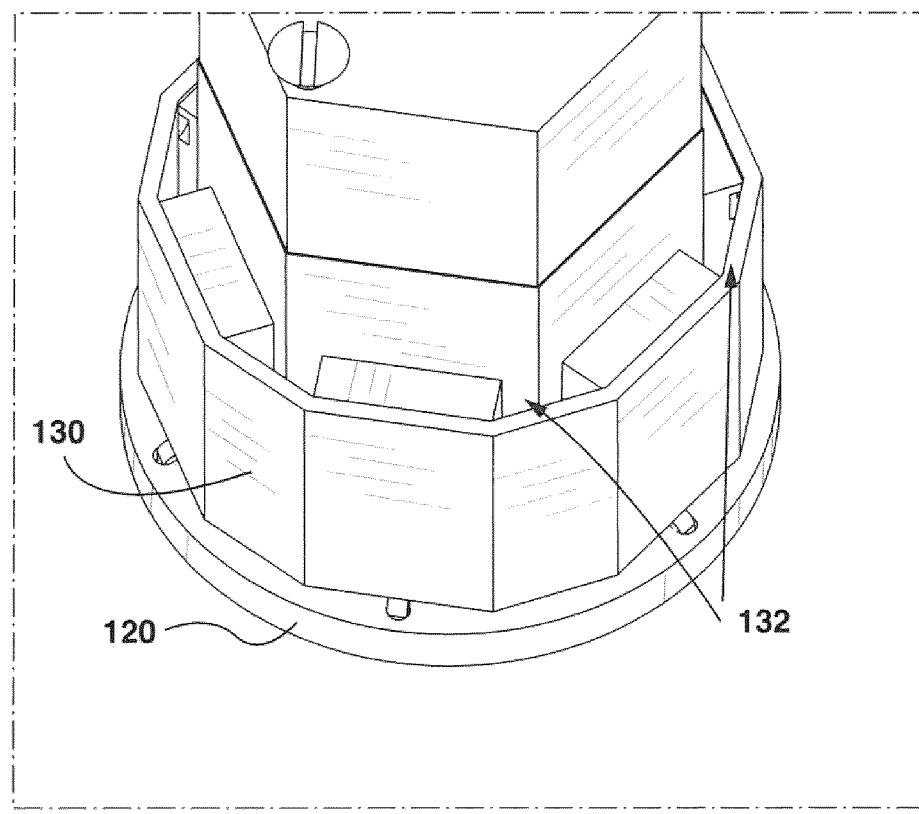
FIG. 27 shows a perspective view of the isolator mounted as in FIG. 26.

FIG. 27 illustrates a silicon rubber sleeve 130. Prior to arc commutation, the sleeve 130 may decompose as a result of exposure to very high temperatures. However the by-product of high temperature oxidation of silicon is non-conductive silicon dioxide (sand) which is inherently non-conductive and thus the sleeve 130 may not promote the continuation of an arc.

Note that FIG. 27 illustrates that high pressure caused by rapid gas expansion due to the arc is provided an expansion path indicated as plasma vents 132. This prevents explosive behavior seen with power modules that are often sealed.

Figure 28:
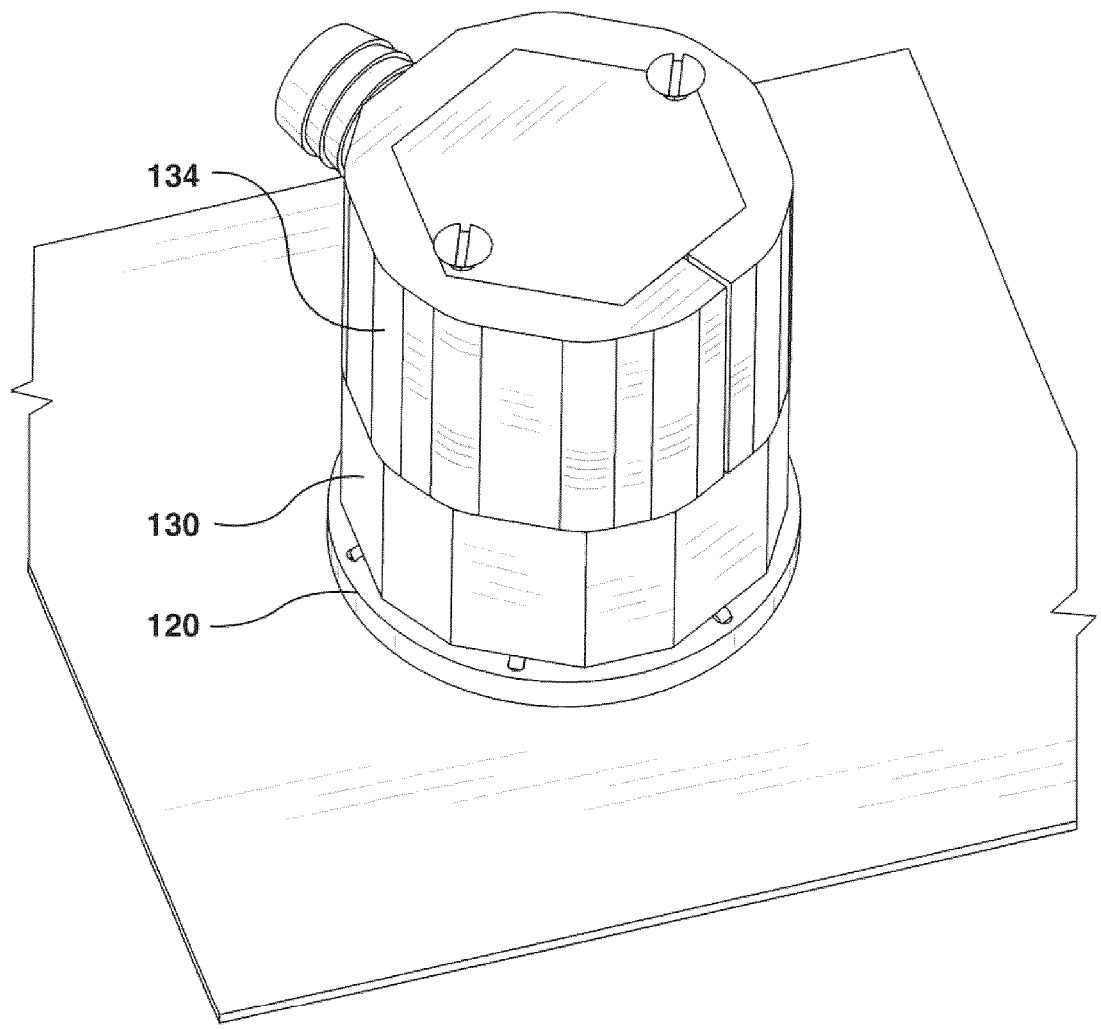
FIG. 28 shows a further view of the isolator mounted as in FIGS. 26 and 27, with a blanket wrap.
Figure 29:
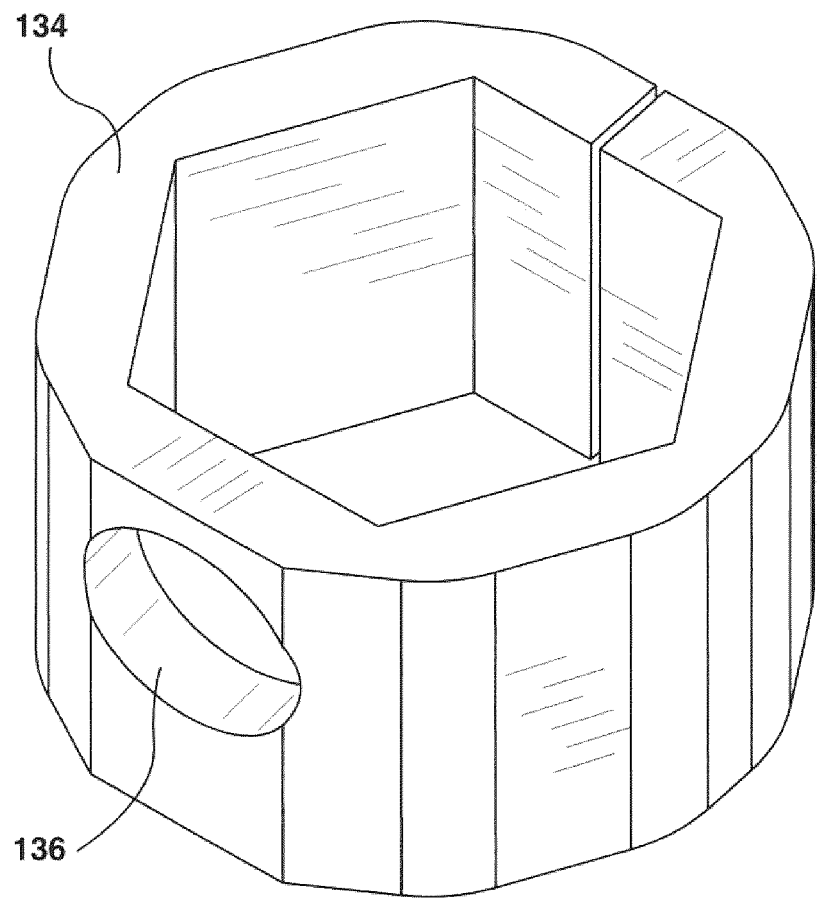
FIG. 29 shows a perspective view of the blanket wrap of FIG. 28.

FIG. 28 illustrates the optional addition of a blanket wrap 134 which may be made of ceramic and, in some cases, of the same materials as the disc 120. The flexible blanket wrap 134 is not solid but rather porous due to the fibrous construction so that air can pass through it. Consequently, arc jets emanating from the plasma vents 132 of FIG. 27 impinge and enter the blanket wrap 134, where exposure to the large surface area of the ceramic fibers results in cooling and precipitation of the vaporized metals and materials. FIG. 29 illustrates the shape of the ceramic blanket 134 and how it is slightly compressible and molds to parts quite readily. The blanket wrap 134 can be secured using fiberglass tape 138 shown in FIG. 30. Alternatively, the blanket wrap can be bonded to the aluminum of the heat sink 31 using high temperature ceramic cement preferably Cotronics Electrically Resistant Adhesive Resbond 919.

The blanket wrap 134 wraps the heat sink 121, and provides an additional function. In many applications where the external ambient atmosphere has high humidity content and the cooling fluid of the heat sink 121 has a relatively low temperature the large exposed surface area of the heat sink 121 can cause condensation of water from the air resulting in water droplets that will run down heat sink 121 and flood the power device connections. The blanket wrap 134 mitigates this condensation phenomenon because it covers the cold surface of the heat sink 121 from exposure to large volumes of air.

Figure 30:
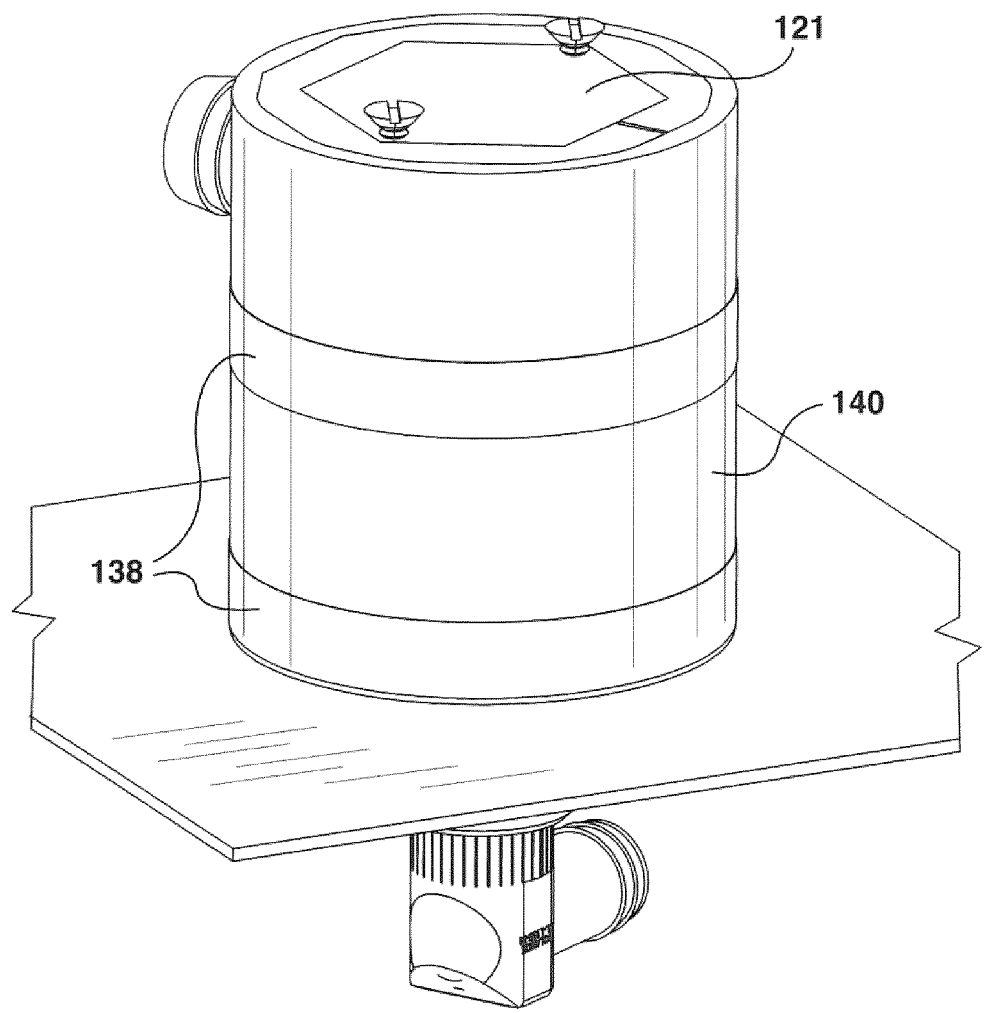
FIG. 30 shows a further view of the apparatus of FIGS. 26-29.

To further mitigate the arc threat, FIG. 30 illustrates the inclusion of a final ceramic paper wrap 140 that can cover the silicon rubber sleeve 130 and any exposed cavities. The wrap 140 also has a hole 136 through it to allow pipe fitting 48 to protrude clear through wrap 140 from the heat sink body. The wrap 140 can be secured by two or more fiberglass tape wraps preferably 3M Glass cloth tape 361. Alternatively, the wrap can be secured with high temperature ceramic cement preferably Cotronics Electrically Resistant Adhesive Resbond 919.

Figure 31:
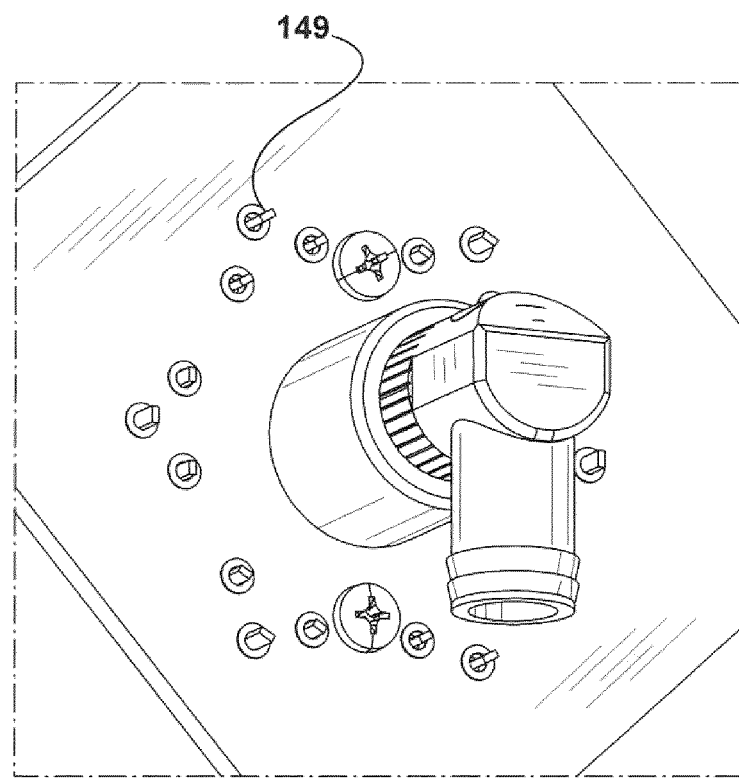
FIG. 31 shows a perspective view from underneath of the apparatus of FIG. 30.
Figure 32:
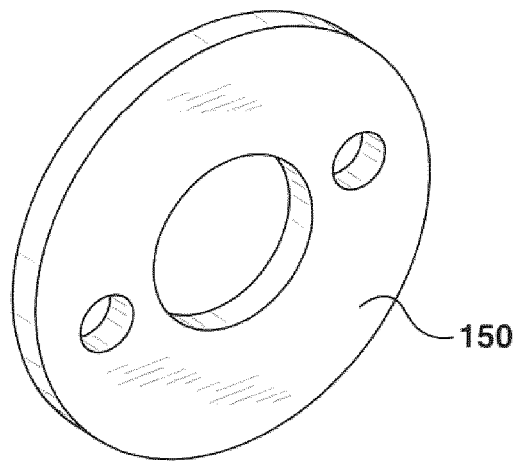
FIG. 32 shows a perspective view of a second isolator.
Figure 33:
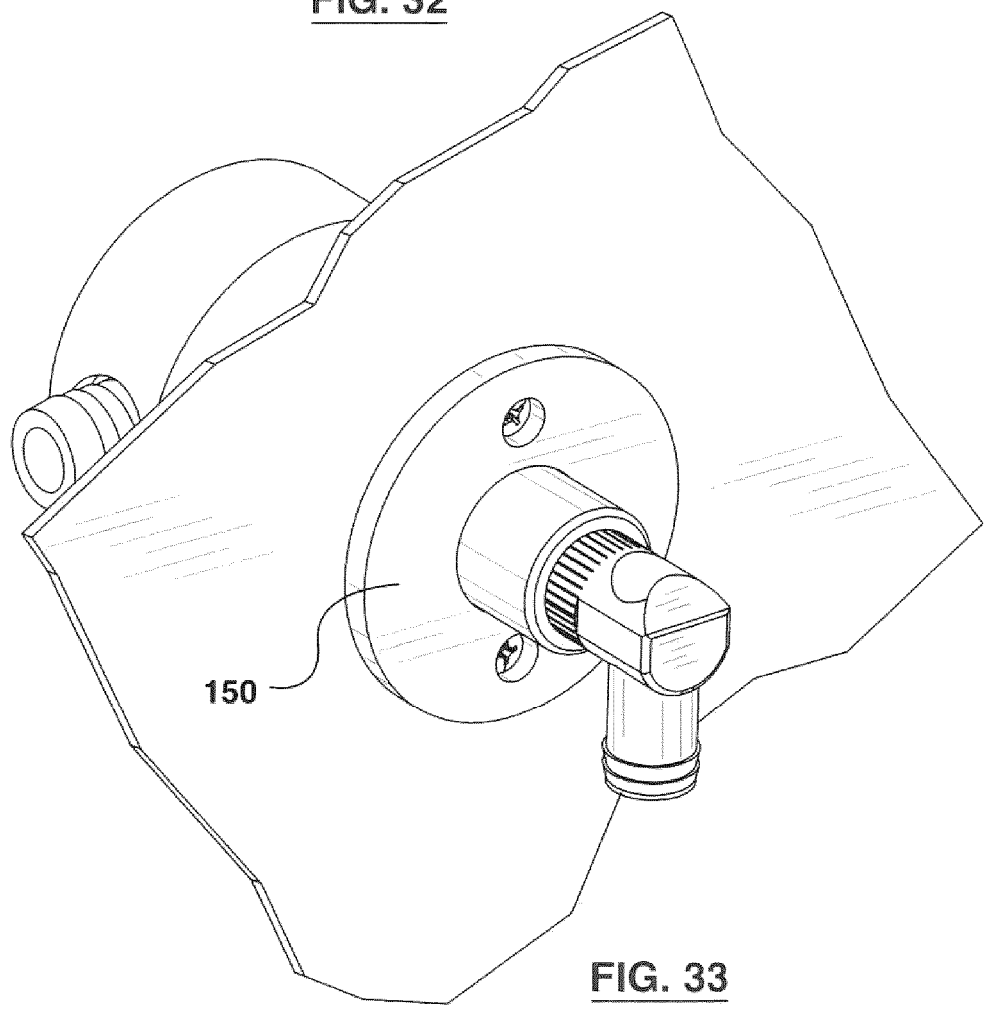
FIG. 33 shows a perspective view from underneath of the second isolator as applied underneath of the printed circuit board.

FIG. 31 illustrates the bottom side of the assembly 122. The exposed terminals 149 of the power devices can also be induced into arcing if foreign debris falls across the terminals. To mitigate this possibility, a second isolator disc 150 shown in FIG. 32, can be applied and glued to the printed circuit board. The second isolator disc 150 can be glued to the printed circuit board using ceramic cement preferably Cotronics Electrically Resistant Adhesive Resbond 919. FIG. 33 illustrates the final implementation. The material for the second isolator disc 150 can be the same as for isolator disc 120.

Figures 34A, 34B:
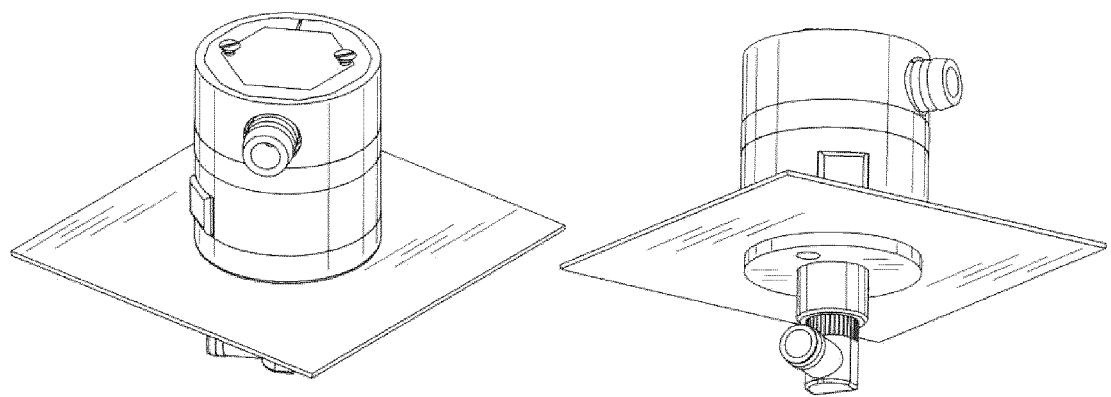
FIGS. 34a and b show perspective views of the apparatus of FIG. 33 with the second isolator applied underneath of the printed circuit board.

FIG. 34 illustrates the preferred embodiment with all of the elements of the Arc Threat Reduction variant in place.

Example Applications of the Third Embodiment

The trend to miniaturization in motor drives has resulted in a strong goal of incorporating the motor drive power electronics right within the motor, instead of locating the drive a long distance away. This solves many problems associated with long motor leads such as high voltage ring-up and the accumulation of common mode capacitance. The radial geometry of the disclosed embodiments, the rugged power device mounting techniques and the low cost of the disclosed embodiments may offer advantages in achieving the goal of motor drive integration with motors.

The air cooled third heat sink assembly 70 should be able to share the air cooling offered by the integrated shaft-driven fan cooled motor technology readily available today with industrial motors. Also, the thermal conduction of the first heat sink assembly to the motor stator chassis also offers thermal heat sinking capability for the motor and the power drive electronics illustrating the synergy of this application. FIG. 18 illustrates how the third embodiment allows the motor drive power electronics to be integrated with the motor effectively and inexpensively.

Figure 17C:
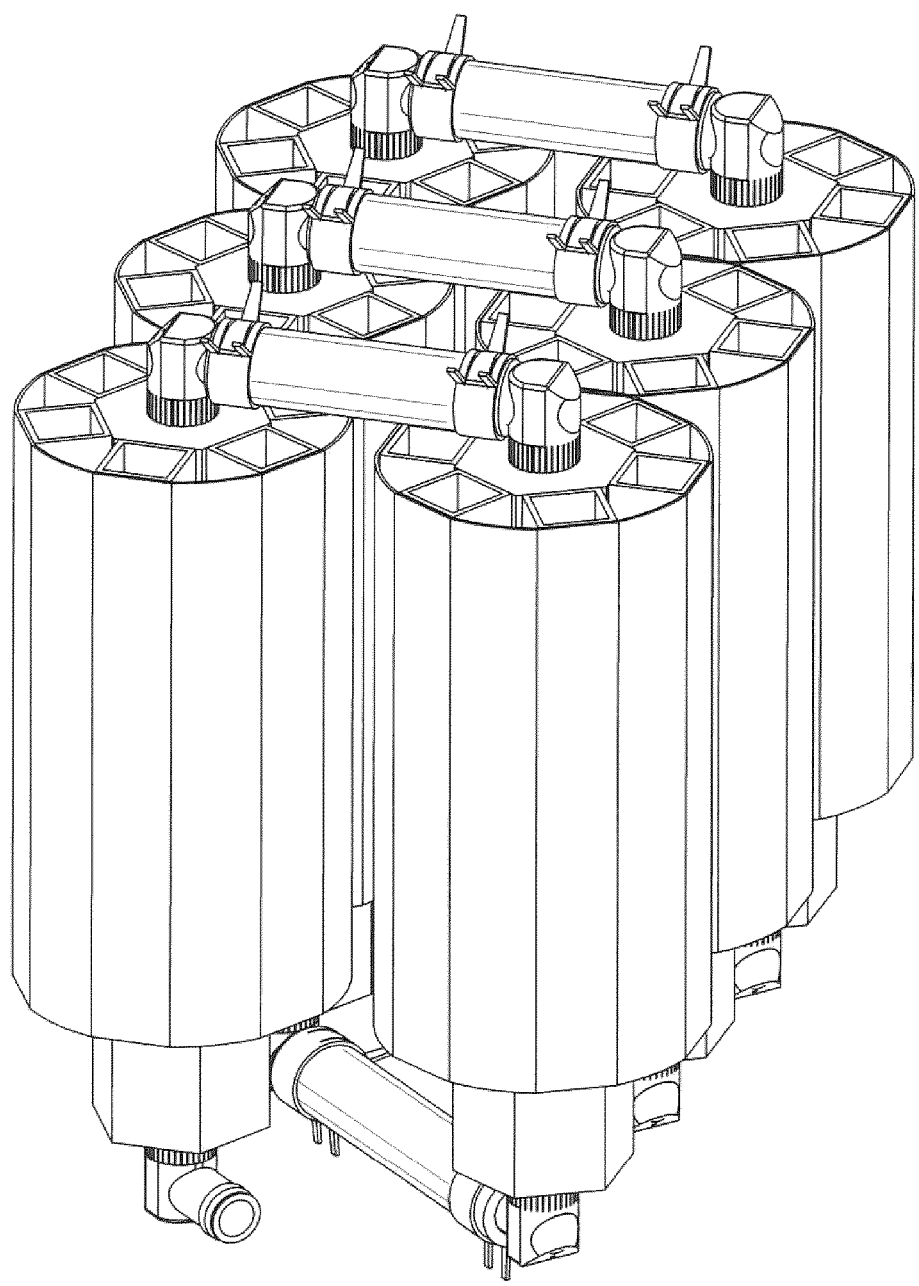
FIG. 17c shows a perspective view of a general purpose liquid to air heat exchanger variation of the third embodiment.

The third embodiment of FIG. 17 shows how both liquid and air can be used to cool the power devices. If the power devices and features associated with mounting them are removed from the heat sink assembly 70 the assembly becomes simplified and useable as a standalone liquid to air heat exchanger as shown in FIG. 17c. This simplified construction of a liquid to air heat exchanger may have considerable utility in many heat management applications.

The simplified expandable heat exchanger array of FIG. 17c can be connected via a pump and tubing to the other embodiments depicted in power electronic systems of FIG. 9, FIG. 13 and FIG. 14 to facilitate liquid to air heat exchange remote from the power electronics circuitry. In this way, the power electronics remains contained in a small, low volume section without the need for the high volume of cooling air flow which can otherwise carry debris and moisture that compromises high voltage withstand capability of sensitive electronics. The simplified liquid-to air heat exchanger of FIG. 17c can be placed in unclean, dusty and wet environments. Since all the embodiments described herein share the same basic raw materials, economies of scale and cost reductions may be achievable that were not achievable before.

Those skilled in the art will recognize that the utility of the third embodiment as a liquid to air heat exchange device has common utility in many applications. However operation of the third embodiment in the air to liquid direction is also possible and is not precluded from use.

Furthermore, the reference to air in the various embodiments herein is for convenience and application of the various embodiments in different gaseous mediums is entirely possible and understood.

Common examples of replacement gaseous media for air are listed as follows but are not limited to: Sulfur Hexafluoride, Carbon Dioxide, Hydrogen, Oxygen, Nitrogen and various mixtures of such gases or other gases.

In general, embodiments disclosed herein consist of an N-sided 2 dimensional shape with straight lines that form flat faces when projected to form the heat sink, and with the generic features defined in FIG. 11 and detailed in FIG. 19.

The Figures described herein illustrate the special case where N=6 and the angle a=360/N=60 degrees, but in general N can be any integer>2. It should be clear that the key benefits of the clamping method and radial geometry of the invention are applicable to cases where N is not 6, but that these benefits are portable to those geometries.

In practice, the specific dimensions and materials used for the heat sink can be any that achieve the main purposes of heat transfer, voltage isolation and mounting to meet the needs of any specific application. The specific means by which the heat sink dimensions are determined is application dependent. For example, the requirements of high voltage creep and strike requirements will drive the dimensions of u, w and t (FIG. 19). These application dependent aspects of the embodiments described herein in no way impair the general architecture of the invention which herein is claimed.

The embodiments described herein can include an electrical insulation layer 2 when required. If, for instance, the heat sink is composed of an electrically insulating material, or each device 5 is electrically isolated from the electrical terminals then the film or coating 2 may be omitted. When the film or coating 2 is required, the material type and application method of the film or coating 2 is general and could be accomplished using a plastic film, or fired ceramic substrate, or 3D printed materials, powder coatings or many other materials and methods.

The clamping strap 6 in its most general form could be any conducting or insulating material that when secured achieves the function of applying adequate pressure between the mating thermal surfaces of the heat sink 1 and the film or coating 2 and/or the devices 5. For instance, the strap 6 may be in the form of a strap or other device with spring-like properties. The dimensions of strap 6 are general in nature and can be changed to whatever values that achieve the main purposes of heat transfer, voltage isolation and mounting to meet the needs of any specific application.

One aspect of the present disclosure is that for an N-faced heat sink 1, all positions do not necessarily need to be populated with power devices. It is possible to populate 1 to N devices and still build and use the embodiments described herein. The strap will conform to the body and tighten to support less than N devices in compression. For example, if N=6, 1, 2, 3, 4, 5 or 6 devices may be mounted and the design will work.

The invention in one aspect has an architecture that is general in nature where details of the dimensions and materials are not critical in defining its utility. In other aspects, the invention can be reduced to practice where dimensions, materials and specific character make the invention more valuable as a result of these details.

The selection of N has particular utility for the values of 6 and 8 because these N-sided figures are presently manufactured in extruded bars in common specific sizes for use in general industry in volume. Also, the material choices of copper and aluminum are preferred because of their excellent thermal conduction characteristics. Aluminum is generally preferred over copper because of its lower cost and weight compared to copper. Although thermal conduction of copper is better than aluminum, there is usually not enough difference to make the copper a preferred choice. N=6 may be preferred over N=8 mainly because it is generally more readily available and lower cost. Since many power electronic circuits in the three-phase market utilize devices in multiplicity of 3 and 6, N=6 is a particularly useful configuration of the invention that promotes wide use, and hence promotes economies of scale in purchasing power and ultimate cost reduction of the final invention. Hex (N=6) extruded bars are also readily available in many different sizes.

Figure 20:
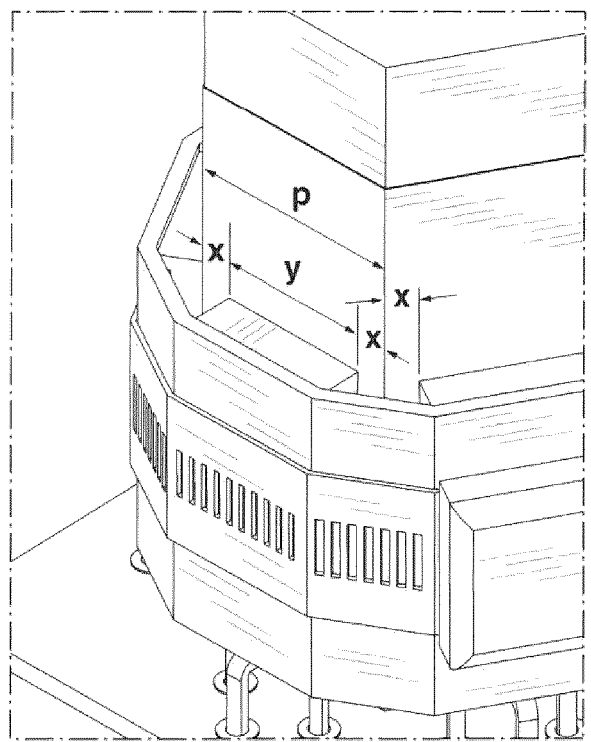
FIG. 20 shows a perspective view of part of the first heat sink assembly.
Figure 21:
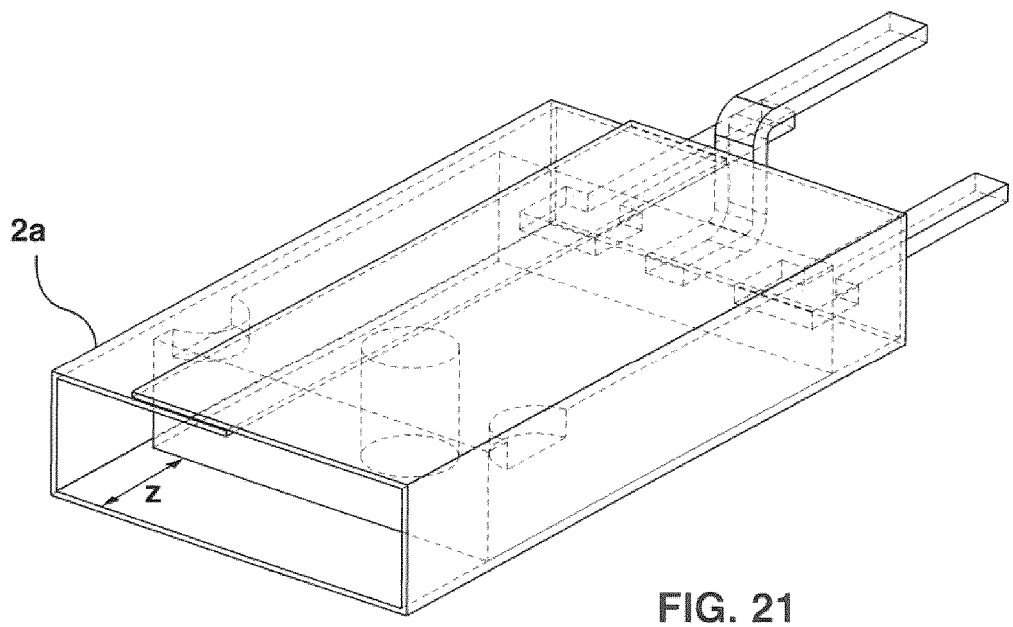
FIG. 21 shows a perspective view of a power device with an alternative thermally conductive electrically insulating film wrap.

Key to selection of the most appropriate size is the selection of a bar size whose dimension p (FIG. 19) is large enough to accommodate the width of the power device y (FIG. 20) being mounted with adequate high voltage creepage margin. This margin is 2× in FIG. 20. As the body width dimension y increases and the required voltage withstand requirement goes up, the dimension p must increase because the margin of 2× must also increase. This causes the weight and volume of aluminum to go up per unit length and may not be generally desirable. Consequently, for some applications running at very high voltages, it may be desirable to overcome this limitation. This variation of the invention replaces conductive film or coating 2 with a film wrap 2a in FIG. 21 which is a film wrap of the power device. The film wrap 2a provides creep and strike distance improvements that allow the distance 2× to be reduced to close to zero and replaced with the creepage distance z of FIG. 21. This in turn may allow the weight and cost of the aluminum to be minimized. Hence this variation allows the dimension p to be required to be no more than y, the power device body width.

Prototype design and test experience for the popular TO-247 and TO-220 power device package styles have determined that the body width dimension face width p=0.866 inches (22 mm) with 6061 Aluminum T6511 material type is a preferred choice. A preferred finish for the heat sink 1 is hard coat anodizing as per MIL-A-8625 TYPE III which insulates the surface electrically and passivates the surface so that potential corrosion in the liquid path is mitigated.

This raw material may come from the factory at a cost of less than $12 USD/foot (in 2014) with a surface finish that requires no additional machining to allow highly effective thermal transfer between the surfaces of heat sink 1 and device 5. The weight of 2.29 pounds per foot may make heat sink 1 in FIG. 19 an attractive solution with nominal dimensions q=2.5 inches (63.5 mm), s=0.910 inches (23.1 mm); t=0.9 inches (22.9 mm), u=0.125 inch (3.18 mm). Hole diameters r1=r2=r3=0.453 inches (11.5 mm) allow convenient thread tapping for use with inexpensive popular G-¼ tube fittings used in the computer liquid cooling industry.

For example, the pipe fitting 48 of FIG. 9 may be a BITSPOWER BP-WTP-001 G¼ inch Silver shiny ½ inch hose barb fitting, and the pipe fitting 46 of FIG. 9 may be a Koolance Swivel angled hose barb for ½ inch tube in the second embodiment. The combination of these fittings may allow broad application because the pipe fitting 48 can be positioned with the barb facing in one direction desired by the user on one side of the printed circuit board 36, and the pipe fitting 46 can then be rotated into any angular position relative to the pipe fitting 48 on the other side of the printed circuit board 36 allowing plumbing to be optimized and simplified in most applications.

The strap 6 of FIG. 1, from testing, may be a Nylon-coated Multi-Lok Type 316 Stainless steel Tie, part number AE7129 with rated load 250 pounds manufactured by Bandit Idex Corporation. The Tie is CE approved, UL listed and DNV approved. The nylon coating enhances the immunity to arc-damage and arc-propagation otherwise caused by plasma bridging an otherwise selected conductive non-insulated part. The vertical slots of the band when tightened cause the compressible electrically insulating interface 7 to deform and protrude through the slots of the strap 6 thereby mechanically captivating the strap 6 and electrically insulating interface 7 together to restrict movement relative to each other.

The strap 6 can be installed first by loosely threading the strap over the electrically insulating interface 7, and then after positioning, tightening the strap 6 using Bandit clamping tool part number M50389. The tool has an adjustable tension control and crimps and cuts the strap with no resulting metallic debris. Tension is selected according to maximum pressure limits of the power devices 5 and/or heat sink 1. It is here noted that the strap 6, or securing member, may be a tension strap, ring or spring with tension control provided by design. In other cases, the strap may be a screw, a tensioning tool or other mechanism, and retention may be provided by a screw, or one time crimp mechanism.

The electrically insulating interface 7 that can be used in all embodiments may be chosen as a 1 inch (25.4 mm) wide strip of silicon rubber because of its low compression-set properties as well as its immunity to a wide range of chemical attack, and absorption of other ionic conductive compounds (for example, most notably salt water). It also has a wide rated operating temperature range of between −70° F. (−56° C.) and +525° F. (274° C.) when the material is chosen to be MIL ZZR 765 silicon rubber, and between −60° F. (−51° C.) and 490° F. (254° C.) when the material is chosen as NSF 51 Compliant silicon rubber. Silicon rubber also has the unique property of producing non-conductive ash if ever involved in an arc produced fire and so mitigates arc propagation during faults.

The insulating and thermally conductive coating or film (conductive film or coating 2 or film wrap 2*a*) may be chosen as a low thermal impedance material preferably Laird phase change thermal film in a thickness ranging from 0.003 inch (0.076 mm) and 0.010 inch (0.254 mm) depending on the high voltage withstand capability required in the application. This material when rising above 50° C. softens and flows to fill surface imperfections of heat sink 1 and conductive film or coating 2 and with the high clamping forces produced by the embodiments described herein produces excellent performance.

The cowling 74 can be made of any thin flexible sheet material, however the preferred embodiment material is aluminum sheet flashing 0.01 inch-0.032 inch thick used in the roofing industry as flashing. The material comes in high volume at very low cost in precut rolls in varying widths and is anodized for long life and low corrosion in wet weather environments. The material can be easily cut to length with table sheers and rolled around the assembly before strapping.

The straps 76 used to secure the cowling 74 and tubes 72 can be any securing strap mechanism, however the preferred method is 302 stainless steel ½ inch wide, 0.030 inch thick minimum industrial strapping. Such material can be tightened to high tension (1500 pounds max per strap typical) which owing to the high concentric forces caused by the symmetrical cylindrical geometry acts beneficially to produce high surface-to-surface pressure of the flat faces of heat sink 1, the straps 76 and the tubes 72 promoting high thermal transfer. Two or more straps may be required depending on the length chosen for the heat sink 1.

The tubes 72 can be any rectangular or square extruded hollow material that allows air flow through its cross section and is thermally conductive. One material for the disclosed embodiments described herein is square aluminum tube with ¹⁄₁₆ inch (1.6 mm) thick walls and outside dimensions of ¾ inch×¾ inch (19.05 mm×19.05 mm). This material is available in high volume in industry.

Addition of Signal Interface/Gate Driver

Those skilled in the art of power electronics system design will recognize that many types of power devices (transistors, diodes, resistors etc.) can be selected and arranged in many possible circuit configurations to implement virtually any power electronic specific application such as choppers, motor drives, UPS's and the like using the embodiments described. The previously described embodiments of the cooling and mounting architecture for power devices will of necessity require what are commonly referred to as "Gate Drivers", DC link and filter capacitors and inductors, and transformers to make these functional circuits produce useful functionality. All of these elements together require co-ordinated cooling and attention to noise and high voltage stresses. The following embodiments address these additional features and are intended to provide for the broad re-use, utility and configurability of the power electronics system with common apparatus for heat exchange in a wide range of different applications, which may provide desirable benefits of economies of scale and lower production costs.

Figure 35:
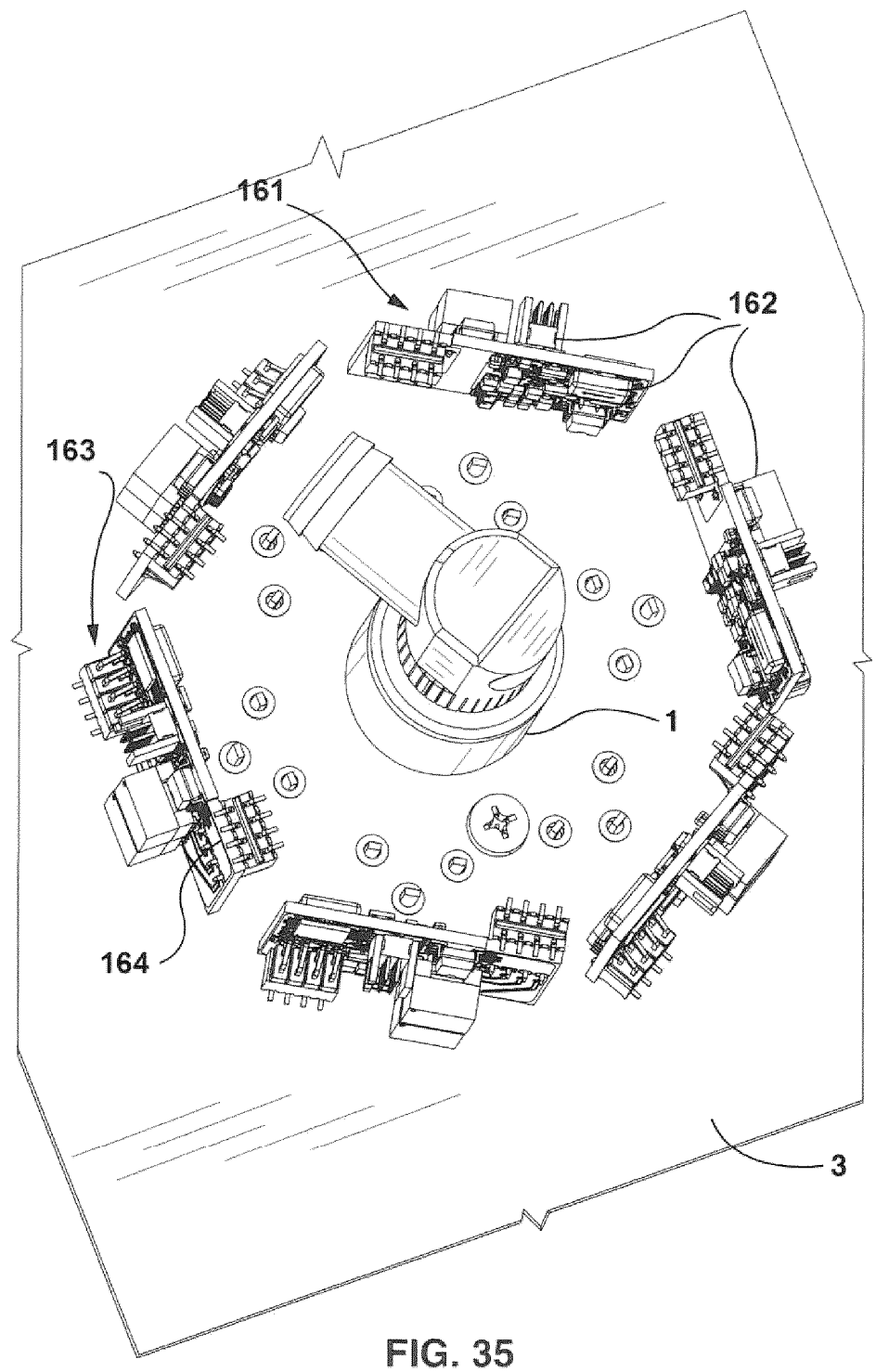
FIG. 35 shows a perspective view of signal interface circuit board assemblies mounted to a printed circuit board.

FIG. 35 illustrates deployment of six gate driver/signal interface printed circuit board assemblies 161. These circuit board assemblies 161 may vary in design function, detail, quantity and location depending on each application. However, the circuit board assemblies 161 typically share common functions of providing high noise immunity and high voltage withstand capability signal interface between a printed circuit board (PCB) 166 (shown in FIG. 37) and the power devices of the main power circuit printed circuit board 3. The circuit board assemblies 161 can provide an interface for various examples of signals familiar to those skilled in the art of power electronic system design such as gate drive commands, current and voltage feedback, temperature and other analog and digital signals of all kinds.

In FIG. 35, the circuit board assemblies 161 are shown identical to each other but each circuit board assembly 161 could be unique and different in construction and function. In general, however, the circuit board assemblies 161 can be similar in orientation, size and mechanical detail to remain generally compatible with the arrangement shown in FIG. 35. This assures that a broad range of application dependent power circuit needs can be addressed with little or no change in the physical mounting and/or electrical interconnect components. Notably, as shown in FIG. 35, assorted electronic components 162 are mounted on 161 and circuit conductors are printed in copper on various layers of the circuit board assemblies 161 to facilitate interconnect and circuit functionality of the circuit board assemblies 161.

Figure 36A:
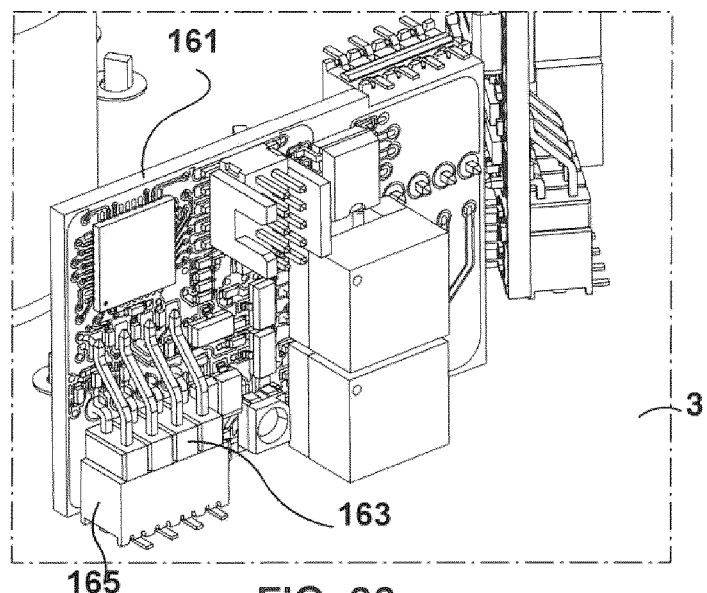
FIG. 36a shows a perspective view of part of the apparatus of FIG. 35.
Figure 36B:
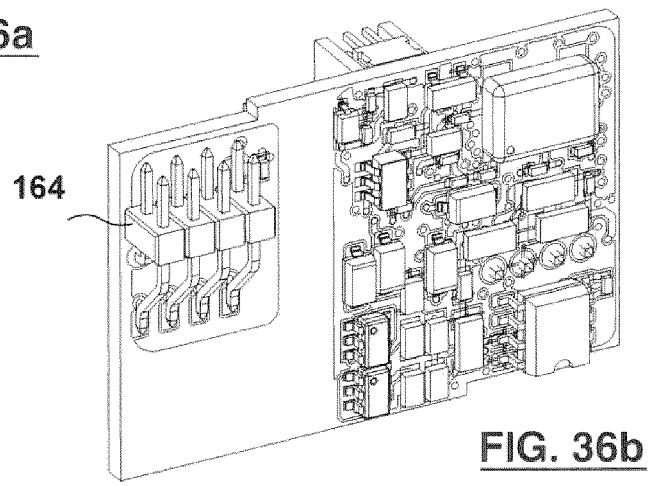
FIGS. 36b and c show perspective views of the signal interface circuit board assemblies.
Figure 36C:
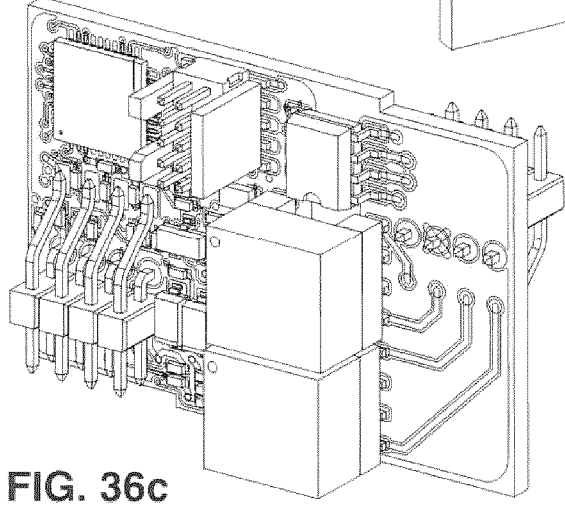

As shown in FIG. 36, connectors 163 and 164 can be affixed at opposite ends of 161. This facilitates good high voltage clearances between high voltage power circuitry on 3 and the low voltage control and distribution circuitry on the printed circuit board 166 of FIG. 37. Removable connectors are preferable in that they provide repair-ability and mechanical compliance necessary for high reliability connections in the presence of expansion and contraction over temperature. However, compliant soldered interface pins could also be used to replace the connectors in high volume applications. Female connector 165 of FIG. 36A is ideally a surface mount connector mating to circuit board 3. This facilitates elimination of through-hole pins on 3. Through-hole pins produce high voltage obstacles on all of the inner layers of the circuit board 3 which would otherwise impair the desired low inductance high conductivity layout characteristics of the inner power circuitry traces of the circuit board 3.

The general purpose of the circuit board assemblies 161 is to provide high voltage and high current noise immunity for isolated gate drive and power circuit signal interfaces between the circuit boards 166 and 3, and between adjacent channels of each circuit board assembly 161. This task is a common challenge encountered in the power electronics field, and the difficulty may be exasperated as sizes are reduced and power density, voltages, currents and power circuit switching speeds are increased. The need for noise immunity should be clear to those skilled in the art when one considers that the power currents in the circuit board 3 could be hundreds or even thousands of amperes, with voltage excursions in thousands of volts switching in tens of nanoseconds, whereas the current and voltages in the circuit board assemblies 161 and 166 typically consist of micro circuitry operating with levels of currents measured typically in microamperes and volts. To assure high reliability the required noise isolation between circuitry on the circuit board 3 and circuitry on the circuit board 166 can be on the order of 1000000:1 or 120 dB.

The location and orientation of the circuit board assemblies 161 can be important in several respects. Further, while the circuit board assemblies are shown as having planar circuit boards, it is possible that one or more of the assemblies could have flexible or curved circuit boards. Additionally, while bearing in mind the need for isolation between adjacent assemblies 161, it is conceivable that two or more of the circuit board assemblies 161 could be implemented on a common curved and optionally flexible circuit board.

First, the disclosed embodiments manage magnetic field susceptibility in a unique way. Circuit currents in the circuit board 3 are constrained to flow in the plane of the circuit board 3. Magnetic fields produced by such current loops will produce a magnetic flux phi, perpendicular to the plane of the circuit board 3. According to basic transformer relationships, the voltage induced in a loop from another loop carrying current is proportional to the amplitude of the current and its rate of change with respect to time. As well, the coupling between the loops in air (without a core) is maximized when the loops share the same orientation and minimized when the loops are perpendicular to each other.

Those skilled in the art will recognize that in this embodiment, the perpendicular orientation of the circuit board 3 with respect to the circuit board assemblies 161 may minimize induced noise voltages in the circuit board assemblies 161 as a result of high frequency currents in the circuit board 3 and may be a highly desirable attribute.

Second, the disclosed embodiments may manage electric field susceptibility in a unique way. The circuit conductors in the circuit board 3 will possess a common mode voltage with respect to the circuit conductors in the circuit board assemblies 161. Typical power electronic switching at high speeds is well known to produce very high common mode voltage rates of change with respect to time, generally known as dv/dt. A respective noise current is induced as a result of such dv/dt according to I=C dv/dt where C is the effective capacitive coupling between the two circuits. The main coupling mechanism in this case is C, the parasitic capacitance, whose size is generally proportional to the surface area A of the conductors and inversely proportional to the distance d between the circuits (i.e. C-Eo A/d simple parallel plate capacitor relationship). In this design, the distance from the circuit board assemblies 161 to the circuit board 3 is increased thereby reducing a major source of parasitic capacitance. Also the parallel conductor area of the circuit board assemblies 161 relative to the circuit board 3 is also reduced as a result of the perpendicular orientation. Those skilled in the art will recognize that in this embodiment, the orientation of the circuit board 3 with respect to the circuit board assemblies 161 may minimize induced noise currents as a result of high dv/dt induced capacitive coupling during normal circuit operation and may be a desirable attribute.

Figure 37:
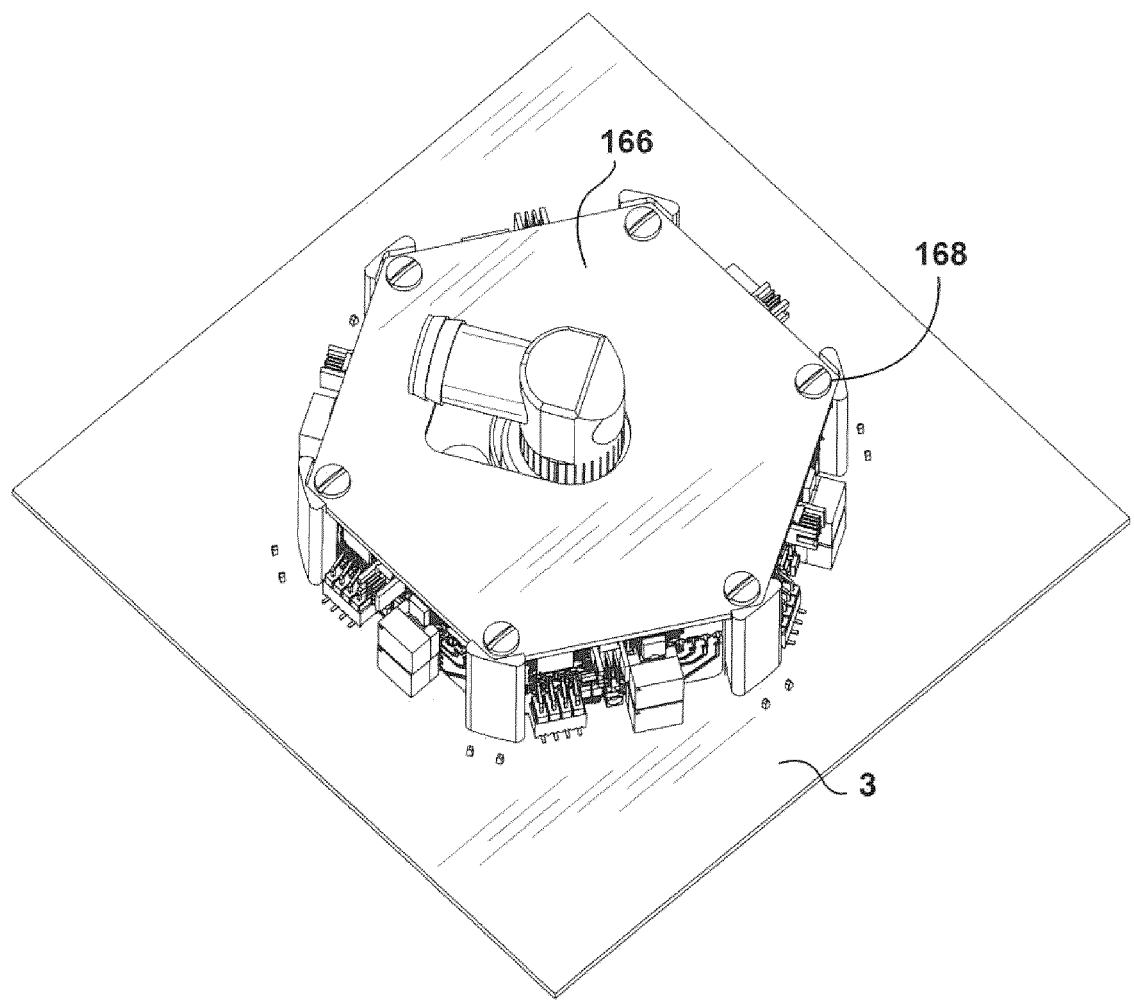
FIG. 37 shows a perspective view of the apparatus of FIG. 35 with a control circuit board mounted to the signal interface circuit board assemblies.

While the low voltage control and distribution circuitry printed circuit board 166 of FIG. 37 is in the same orientation as the circuit board 3, its significant distance from the circuit board 3 provided by the circuit board assemblies 161 may assure that magnetic and electric field noise coupling is reduced sufficiently to maintain noise isolation. Consequently, it should be clear that the circuit board assemblies 161 and their orientation may provide reliable low noise signal transitions between the circuit boards 3 and 166 required by power electronic systems with high power density.

The low voltage control and distribution printed circuit board 166 of FIG. 37 can mechanically captivate the multiple instances of circuit board assemblies 161 in place preventing them from moving from their designated positions across the surface of the circuit board 3, moving vertically perpendicular to the surface of the circuit board 3, or flexing relative to the printed circuit board 3. However, retention forces of circuit board assemblies 161 may be supported by the electrical connectors 163, 164 and 165, and optionally additional mechanical support may be provided.

Figure 38:
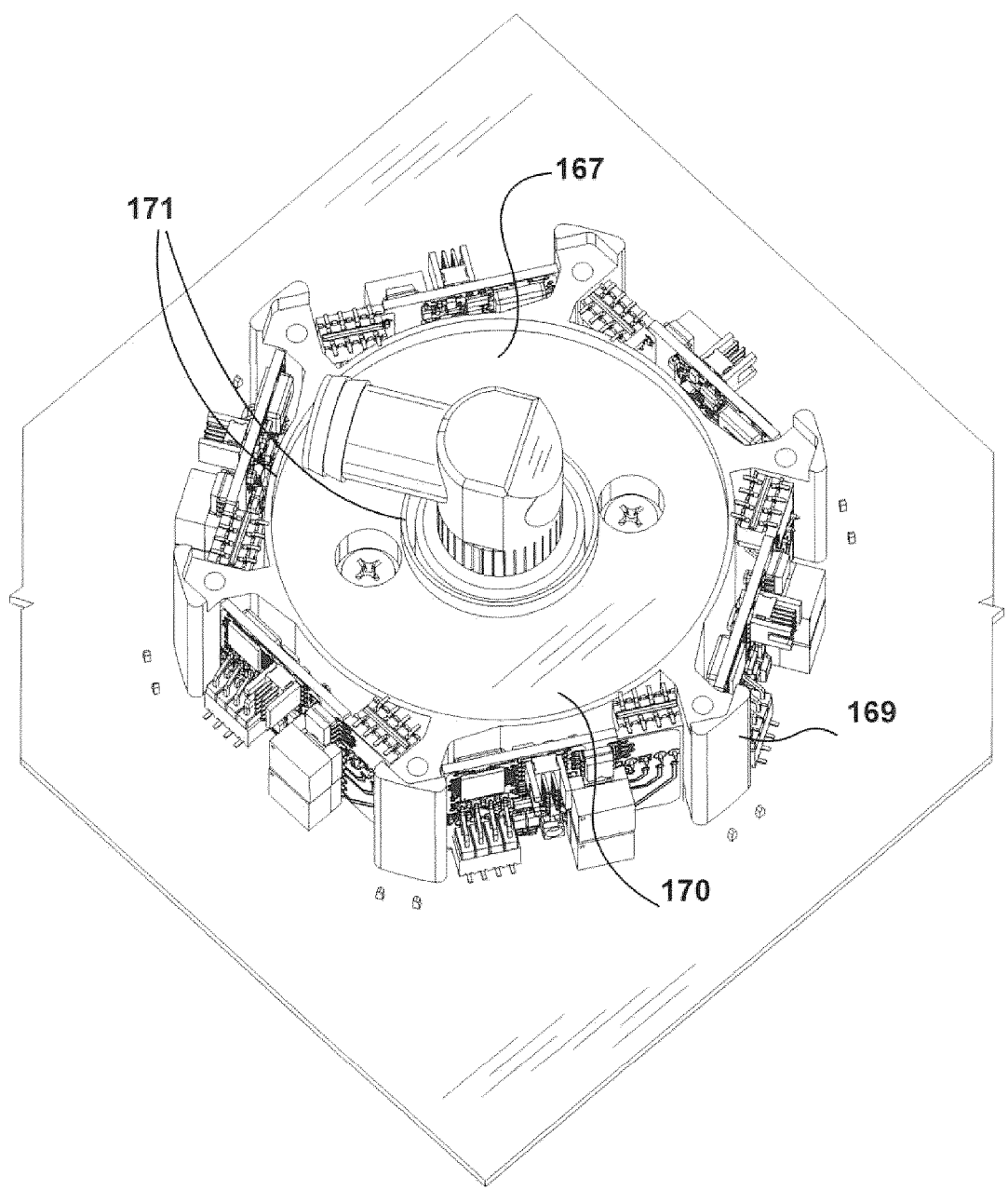
FIG. 38 shows a perspective view of the circuit board assemblies of FIGS. 35 and 36 with a retaining support.

Consequently, FIG. 38 illustrates an embodiment including a retaining support 167. The support 167 can retain the PCB 166 and the circuit board assemblies 161 in a substantially fixed position with respect to the PCB 3 and the heat sink 1. The support 167 can be a molded or 3D printed insulator. The support 167 may use screws located around the perimeter of the support 167 to retain the PCB 166 and circuit board assemblies 161 in the substantially fixed position with respect to PCB 3 and heat sink 1. The screws may be insulated nylon or acetyl screws 168. Support 167 can be made of different shapes than what is shown, and may use a wide range of different materials. A high grade insulating stable electrical polymer that does not absorb moisture such as Ryton or Acetyl is the preferred material.

The circuit board assemblies 161 can be slid into position on to connectors 165 prior to attaching the support 167. Additional removable compliant fixing adhesive can be applied between the circuit board assemblies 161 and the support 167. For example, a removable compliant fixing adhesive such as silicone can be applied to the edges of the circuit board assemblies 161 and various contact points of support 167 to minimize motion and can provide damping of vibrational motion of the circuit board assemblies 161 during operation in hostile environments. A recessed surface 170 of the support 167 assures that space is provided for non-interference mounting of surface mount components on the bottom of the PCB 166. Outside and inside support walls 171 provide bearing surfaces to support the PCB 166 as it is secured by screws inserted into bore holes 168. Insulator flanges 169 enhance high voltage isolation between adjacent printed circuit board assemblies 161 and increase creep and strike distances across the surface of power printed circuit board 3.

Figure 39A:
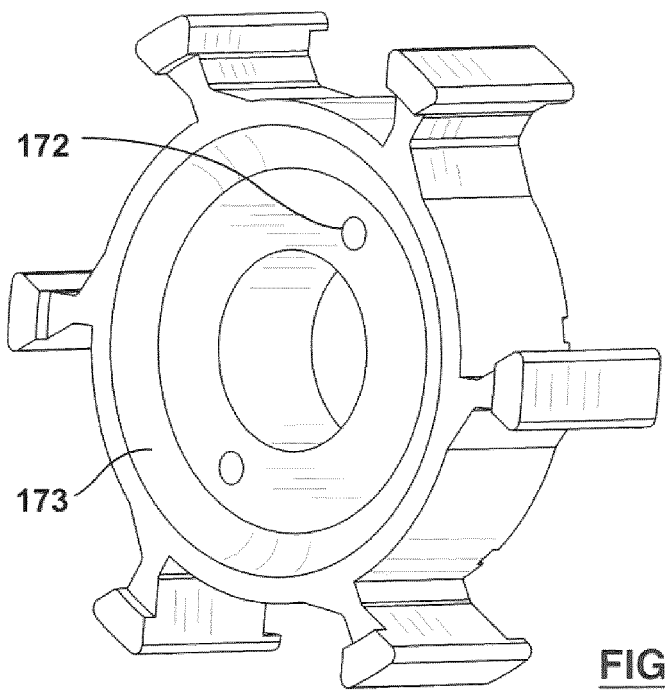
FIGS. 39a and b show perspective views of the retaining support of FIG. 38.
Figure 39B:
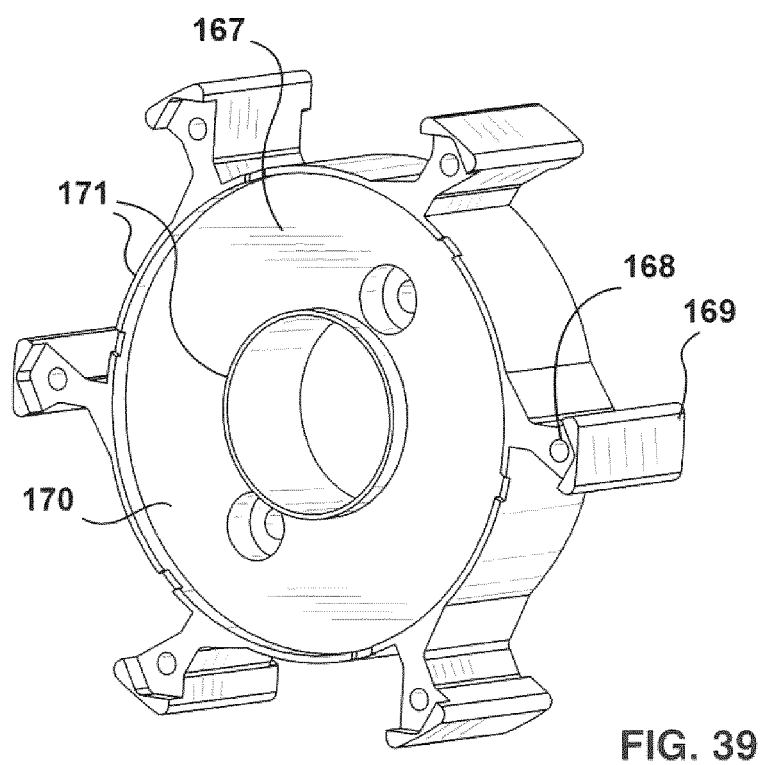

FIG. 39 illustrates further features that can be provided with support bosses 172, which can provide access to screws. These screws can thread into heat sink 1 and hold the entire assembly together clamping PCB 3. A cavity 173 can provide space for the high temperature insulator disc 150.

Those skilled in the art will recognize that the gate drive and signal interface printed circuit board assemblies 161 typically carry no power circuit signals. Consequently connection traces sizes are generally quite small compared to trace sizes and copper density of the main power printed circuit board 3. Thus, faults and failures on circuit boards 161 generally occur with fast melting of the traces and minimal production of plasma from molten copper. The traces and components on the boards 161 fuse easily and can be replaced or repaired. Note that the orientation of the gate drive boards 161 faces them outward so that any arc blast does not involve adjacent channels thereby minimizing fault propagation of single failures leading to multiple arc flash failures. During any fault causing arc flash, the combination of insulators 150 and 167 may prevent arc flash from entering the interior region of the closed polygon formed by the multiple 161 printed circuit boards.

Those skilled in the art will recognize that the disclosed embodiments may provide a clear separation of low voltage circuitry and high voltage circuitry, with the power circuit board 3 acting as a not only a power circuit interconnect mechanism, but also an arc flash barrier.

For further clarification, the term "heat dissipating device" may refer to any device that produces heat, generally including but not limited to electrical devices. In general, power and other electronic systems will typically use many devices that dissipate heat, but that may not require special cooling means. Since all practical electrical devices produce some amount of heat, those skilled in the art will recognize that the term "heat dissipating devices" as used herein refers to devices whose heat dissipation is high enough in the context of the full power system application that specific efforts may be required to cool those devices to avoid the potential failure of those devices or other system components due to overheating. These devices are generally referred to as heat dissipating devices because they may provide the dominant thermal concerns in the system design compared to other system components.

For example, the control and distribution circuitry of printed circuit board 166 may operate with voltage differentials in the range of 1V to 30V. Power used by PCB 166 may be in the range of 1 W to 10 W. The technology used by PCB 166 may typically be digital signal processors, transistors, micro-processors, and other digital and analog electronic components. The control board 166 can include electronics for controlling the power devices (the heat dissipating devices) or for providing other housekeeping functions such as safety, monitoring and protection functions in case there are any malfunctions in the system. The PCB 166 may also be provided with communications hardware allowing interface to external remote systems. The communications hardware may allow communications from PCB 166 in the form of physical connections such as direct electrical connections, or Fiber Optic cables and wireless communication such as Radio Frequency communication. The communications hardware may be selected from components that are sufficiently robust and safe to operate in a high voltage environment.

Similarly, in some embodiments, the gate driver PCB 161 may have onboard circuitry operating with voltage differentials in the range of 1V to 30V. The power used by PCB 161 may also be in the range of 1 W to 10 W and the technology used by PCB 161 can also include typically digital signal processors, transistors, micro-processors, and other digital and analog electronic components, as well as high voltage isolation circuits. The gate driver PCB 166 can provide an interface between the power electronics devices 5 (and power circuitry of PCB 3) and the control board 166.

The interface provided by PCB 161 may provide the ability for information to flow from the control PCB 166 to the power electronics devices (e.g. commands signals), and from the power circuit back to the control (e.g. feedback signals and status signals). In some embodiments, the interface signals may be discrete signals comprised of binary 1's and 0's. The key commands from the control PCB 161 to the power devices can be channeled through the gate driver PCB 161. These commands may include discrete "on"/"off" commands that power electronic devices typically accept as commands. Other command signal types may also include signals to support automatic tests to aid in production testing.

Many different power electronic devices can be used with embodiments described herein. Each type of power electronics device may have different drive command requirements depending on the application. For example, current MOSFET and IGBT power devices may require gate drive signals in the −15V to +15V range, while silicon carbide power devices may require, for example −4V to +20V gate drive signals. Embodiments where the gate driver PCB 161 is a removable and replaceable component may allow various different power electronics technologies to be supported by a family of specifically designed gate driver PCBs 161. The desired gate driver PCBs 161 can be selectively mounted to a first supporting element (e.g. circuit board 3) and connected to the power devices 5 and control PCB 166 without requiring the entire system to be redesigned. Furthermore, the orientation and positioning of the gate driver PCBs 161 may facilitate supporting high voltage potential differences between the circuits of the control PCB 166 and the power PCB 3.

For example, the power PCB 3 and power devices 5 may operate with voltages up to 12,000V, and currents in the range of 0.1 to 300 amps, preferably 1 to 100 amps. Very high voltages and high frequencies may require additional care, not just for mitigating simple voltage breakdown, but also for mitigating corona and other high voltage and high frequency related phenomenon. The low capacitance orientation of the gate driver PCB 161 provided in some embodiments may assist in mitigating these risks.

In general, the power circuit connections in the power PCB 3 with power devices 5 typically operate at voltages and currents that process power significantly higher than in the control PCB 166 and gate drive PCB 161. For example, power levels processed by the power PCB 3 and power devices 5 can be in the range of a few thousands of watts to several hundred kilo-watts, e.g. in the range of 2 kW to 500 kW, preferably 5 kW to 100 kW, and may increase further as power device technologies evolve. Presently, common efficiencies of power electronic systems are typically in the 90%-99% range. If we use 90% efficiency as an example then the losses associated with the power board 3, and power devices 5 may typically be in the range of 10%, which losses appear as heat to be dissipated predominantly all within the power devices 5. As a result, hundreds or even thousands of watts may be dissipated as heat by the power devices 5. Hence, the need to provide a cooling apparatus for these devices.

Maximizing the voltage and current product is the key to increasing power density. The power circuits, including the circuits connected within the laminated or printed circuit structure of 3 and the devices selected for power devices 5, may achieve high power processing capability by using high voltages and/or high currents. In some cases, high voltages may be preferred to high currents. High current conductors may practically be limited to aluminum and/or copper which can be heavy and may occupy an undesired amount of space as current levels increase. However, many different high voltage insulating materials are presently available. In some cases, high voltage may be also preferred for high power density because it generally leads to higher efficiency. This however, in no way limits the use of the embodiments described herein with low voltage and high currents, for example voltages ranging from 12V-600V may be used in the solar industry with currents of hundreds or thousands of amperes; in the present context, these voltages and currents would need to be supported and pass through the power devices 5, respectively.

Embodiments described herein may be capable of supporting typically encountered voltage levels in normal atmosphere below 10,000 ft altitude, for the power devices 5, in the 0-1200V range (1200V device class), preferably 40-850V, with no additional modifications for circuits such as illustrated in FIG. 7, FIG. 40, and FIGS. 42a and 42b, for example. Embodiments described herein may be capable of supporting state of the art encountered voltage levels, for the power devices 5, operating in the 0-2400V range (1200V rated device class in a multi-level inverter circuit configuration), preferably 40-2000V, with no additional modifications for circuits such as illustrated in FIG. 41. In these cases, the nature of the power circuit topology itself extends the maximum overall voltage handling capability. Furthermore, the use of a high voltage gas such as for example, Sulfur Hexafluoride (SF6), at pressures properly selected, with embodiments described herein may allow these embodiments to operate with voltage levels potentially as high as (but not limited to) for example 12,000V. This is a result of reduction of creep and strike distances due to the higher ionization levels associated with SF6—where, for example, multiple 1200V, and/or 3000V class devices may then be connected in series in one or more advanced circuit configurations, with carefully routed interconnect within the pcb or laminated bus structure that will support these 12,000V levels with an attendant increase in power processing capability of a factor of 10 or more may be possible. The orientation and design of the gate driver PCBs 161 may facilitate the operation of embodiments at these high voltage levels. Those skilled in the art will recognize that the nature of the invention allows many power devices to be populated in the same volume and area by comparison to traditional power modules in use today that are limited to flat cooling interfaces. The flexibility of interconnect offered, in combination with the high cooling capability, and combination of power devices and circuit topologies available, and the ability to position devices anywhere to best manage the available high voltage clearances can produce design flexibility that may be a valuable attribute.

Operating at increased higher voltage levels (i.e. higher achievable power processing levels) may result in increased heat that must be dissipated. For instance, if operating efficiencies at those increased power levels remain at 90%, the corresponding 10% power losses may then be on the order of thousands or tens of thousands of watts. With proper adjustments to flow rates, dimensions, and liquid coolant types, the embodiments described herein may still be used to support those levels of heat removal.

The embodiments described herein may also assist in ensuring that the cooling systems remain small while preserving the potential to scale to higher voltage levels. This may be practically important for manufacturing and cost purposes. For example, a sulfur hexafluoride gas charged box containing a power system may become prohibitively expensive to manufacture and seal if its volume were large. The embodiments described herein may enable high cooling capabilities and highest possible voltage withstand capability to achieve very high power densities, but at practical and economical costs by maintaining a smaller size.

Device Package for Capacitors, Inductors, and Transformers

In supporting many types of power circuit topologies, the need commonly arises for a capacitor that occupies minimal volume while having the capability of operating as a DC bus capacitor, an AC filter capacitor or a resonant capacitor as the case may be. Equally so, the need for an inductor or transformer also commonly arises. The disclosed embodiments with a power circuit board 3, can utilize many capacitors, inductor or transformer types generally available in industry. Material choices for capacitor and inductor or transformer electrodes and dielectric is a comprehensive science and depending on the application the choice of one material over another and one construction technique over another may be more appropriate. For example, capacitor manufacturers have the capability of packaging various capacitor technologies in the same form factor (a.k.a the same device package), but with different characteristics, for example the same capacitor can be built looking physically identical but having different loss characteristics, different rated voltage and current, different ac and dc ratings to name only a few. However the need for a capacitor that can be cooled efficiently and can be easily connected and assembled into the embodiments described thus far has particular merit to embodiments described herein because it allows the broadest possible application in a consistent packaging scheme as described herein. Those skilled in the art will recognize the preceding description also applies to not just capacitors but inductors and transformers as well.

Figure 40:
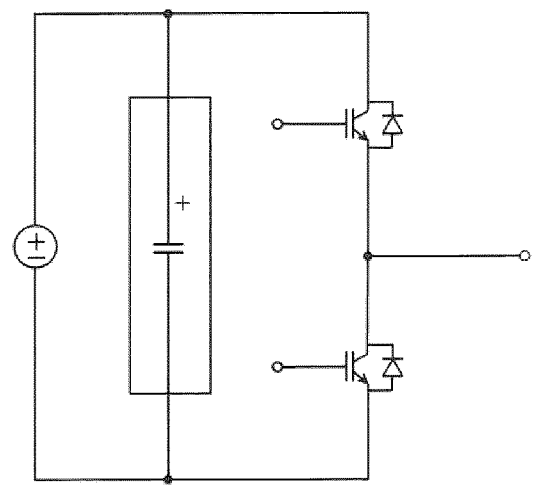
FIG. 40 shows a circuit diagram illustrating an example of a switch configuration employing a capacitor that may be used with embodiments described herein.

Several common switch configurations architectures are common in power electronics circuits. FIG. 40 shows a standard totem pole inverter leg configuration and FIG. 41 shows a three level multi-level totem pole configuration. In these configurations the capacitor shown is generally known as a DC link capacitor. In the switch configurations shown in FIG. 42, capacitors are used for AC filtering and resonant power conversion.

Most capacitors, inductors and transformers used in power electronics circuits benefit from being close to the power circuit to minimize the lead inductance of the power circuit. Most capacitors, inductors and transformers also suffer from thermal limitations that prevent heat from being effectively carried away. In the disclosed embodiments, the central cooling extrusion can be used to remove heat from not just the power devices, but from the surrounding capacitors, inductors and transformers as well. FIG. 43 illustrates a package design that may offer advantages of cooling, close proximity and simple connection to the power circuit. It also offers multiple uses for general circuit topologies similar to those described in FIGS. 40, 41 and 42. The key geometry shown of a cylindrical capacitor, inductor or transformer specifically integrates for broad use into the described embodiments with terminals as shown.

Figure 43A:
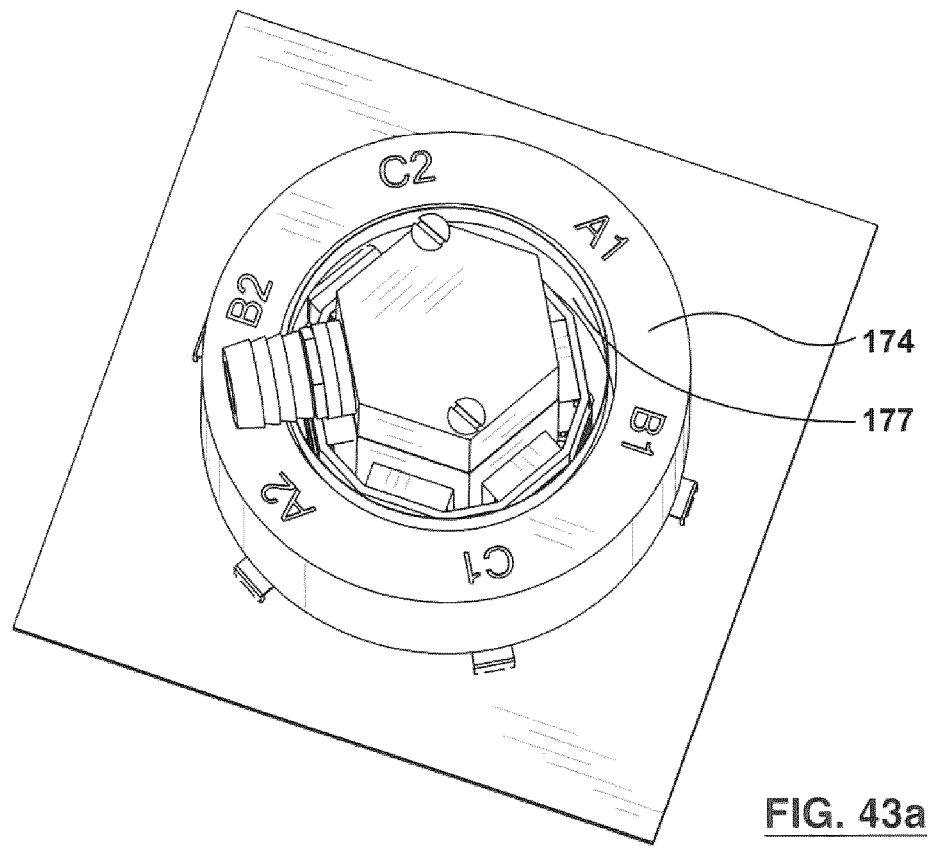
FIGS. 43a and b show perspective views of a cylindrical capacitor, or cylindrical inductor or cylindrical transformer mounted on a heat sink assembly.

For further clarity, those skilled in the art will recognize that it may not be possible for the invention to implement a common package for a capacitor, inductor and transformer in the location depicted in FIG. 43a at the same instance. However, it is possible for capacitors, transformers and inductors to be implemented selectively in multiple instances of the invention as depicted in FIGS. 8, 13, 14 and 17 in different locations. For example, since each instance of the invention as depicted in FIGS. 1, 2, 9, 10, 13, 17 and 35 can have power device locations populated with any type of device, such as resistors, diodes, transistors etc. then each instance of the invention can offer configurable functionality. Such functionality is configurable because the interconnect of the power circuit is uniquely established on the power PCB 3 only, and hence a very broad range of circuits (virtually universal) can be supported while retaining the physical mechanical, thermal and other positive attributes of the invention described herein. Similarly, since each instance of the invention deployed in multiple instances in FIGS. 8, 13, 14 and 17 can have capacitors, inductors and transformers, item 174 in FIG. 43a selectively populated as an inductor or a capacitor or a transformer it means that when appropriately interconnected (configured) in the power PCB 3 then virtually any power system can be created. The unique utility of this configurable power electronic system is that re-use with minimal re-engineering of physical elements except connections in PCB 3 is possible. This synergy within the invention allows broad reuse that maximizes production volumes of all elements of the invention, thereby leading to lowest possible production costs and high sustainability. It also makes re-engineering of new systems considerably less expensive in labor and allows for the incorporation of new power devices, capacitors, inductors, and transformers as older ones become obsolete in a straightforward manner, offering minimal disturbance to established engineering and production methods.

Therefore it should be clear that a common cylindrical package and terminal arrangements of the package 174 are the key to retaining these advantages. The exact details and nature of the embedded technology of 174 as a capacitor, inductor or transformer may be important in any given application but is secondary to the value and point of 174 in this invention. The invention is unique and has distinct utility because a unique common economical apparatus for heat exchange can be shared by all power components thereby reducing duplicity and complexity of multiple cooling methods otherwise typically encountered in the power electronics field.

Figure 43B:
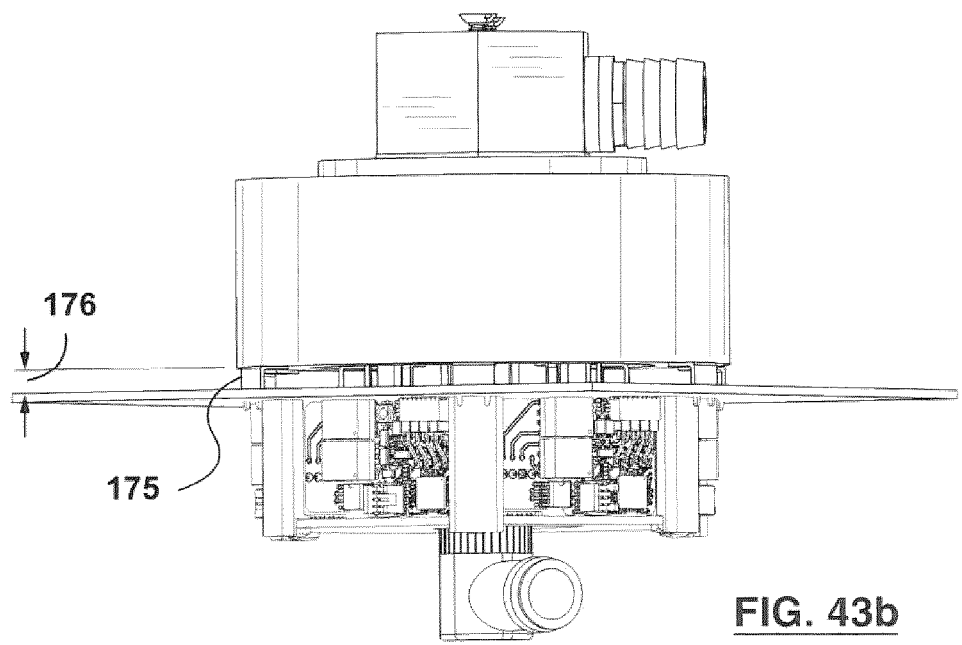

FIG. 43A illustrates a cylindrical capacitor, inductor or transformer 174 design mounted in a heat sink assembly as described herein. The body of the capacitor, inductor or transformer 174 can be composed of an epoxy or molded polymer. This provides high voltage insulation from the internal conductive elements, as well as protection from moisture ingress. FIG. 43B illustrates terminals 175 which connect the capacitor, inductor or transformer 174 into the circuit board 3. The terminals 175 can be connected into the circuit board 3 via soldered pad connections. The capacitor 174 can be a center tapped dual capacitor with three electric connections to support the schematic of FIG. 41, but many other connections are possible.

For circuits like those shown in FIGS. 40 and 42 the outside terminals can be connected together to form a two pin parallel capacitor. For circuits like those shown in FIG. 41 the three terminals of the capacitor can be connected as shown.

A maximum of 6 power connections for 174 are shown in FIGS. 37 and 38 because the best high voltage locations available for non-interference with the rest of the invention are at the outside locations of the insulating flange 169. A maximum of 6 terminals shown in this case are a result of the N=6 case.

Depending on the nature of the circuit, the available 6 connection points can be connected in parallel to offer higher current handling capacity as required. For example, 3 capacitors, each having 2 terminals each can be configured within 174, or one capacitor with three terminals can be configured in 174. This same flexibility also applies to inductors and transformers.

FIG. 43B illustrates how the capacitor can be raised slightly 176 above the circuit board 3 by the terminals 175. This slight elevation allows volume for components to be mounted underneath the capacitor body without interference.

Figure 44:
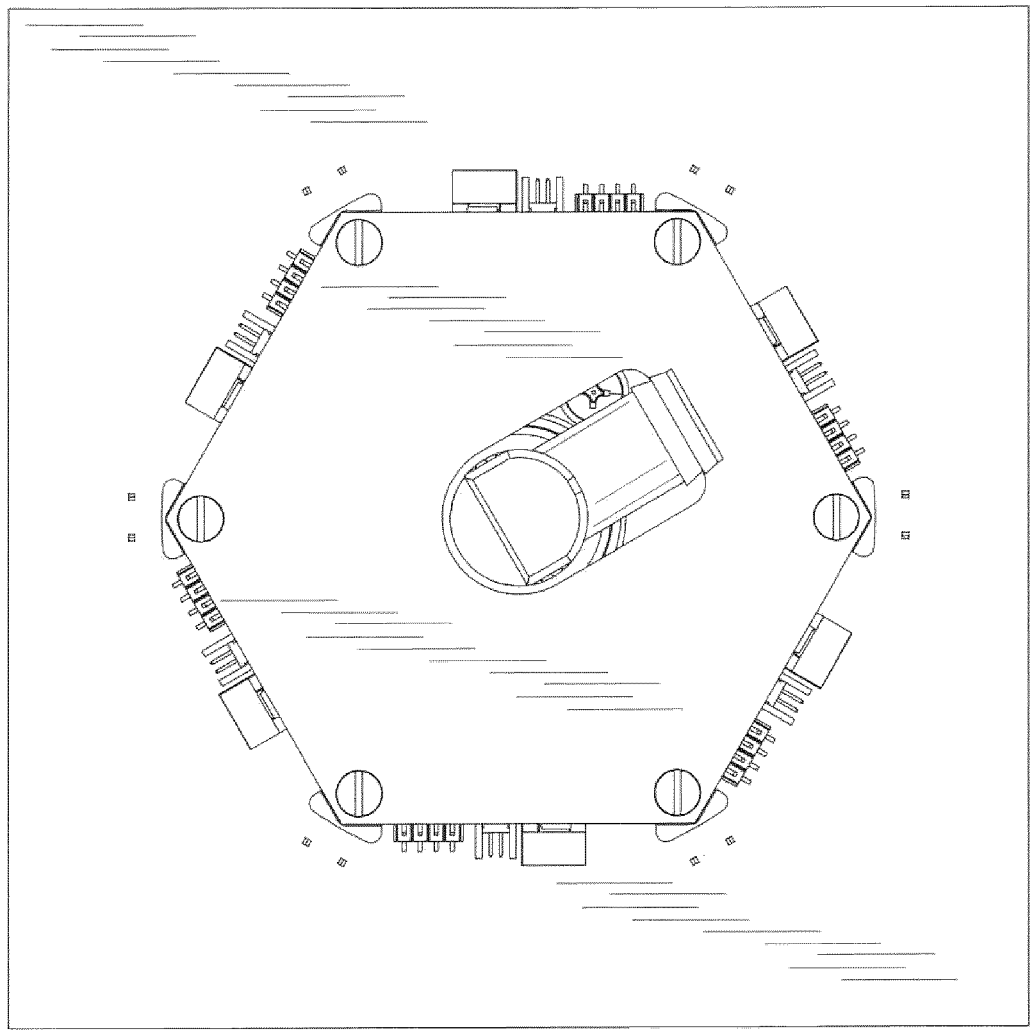
FIG. 44 shows a view from underneath the printed circuit board of the heat sink assembly of FIG. 43.

FIG. 44 illustrates how the capacitor pin protrusion points can be arranged to occur at the locations shown to facilitate good high voltage clearances on the power printed circuit board 3. In FIG. 44, the circuit board solderable terminal used (a common solderable high current pcb terminal used in industry) has two pin protrusion points occur for each of the 6 terminals for a total of 12 protrusion points. Other types of terminals could be used, the key location of the terminals adjacent to the insulating flanges are preferable for high voltage management of creep and strike.

Use of the cylindrical capacitor, inductor or transformer is optional with the invention. In embodiments when the capacitor is used, the ceramic blankets 134 and 140 can be cut back to leave the region of 177 in FIG. 43a clear of obstruction. Thermally conductive compliant epoxy can be filled in the region 177 between the inner diameter of the capacitor and the heat sink 1 and allowed to set under vacuum to produce a void free thermally conductive fill. Cotronics 4461 thermal epoxy is one possible type of thermal epoxy. In this way, heat generated by the capacitor can be carried away by heat sink 1. The compliant epoxy also serves to provide additional mechanical support of the capacitor body weight.

It should be noted that the capacitor can be used with the printed circuit board 3 in a standalone package that omits power devices the heat sink 1, power devices 5, and other ancillary parts 7, 2, 6. In this arrangement, instances of capacitors can be added to a design, with all instances mounting and connected to 3. Thermally conductive compliant epoxy filled in the region between the inner diameter of the capacitor and the extrusion 1 can be deployed as previously described. In this way, a single common 6-pin epoxy molded package can be used to meet the needs of any power circuit, and if liquid cooling is desired, such instances of the packages are easily integrated into the plumbing loops associated with fittings 48 and 46

Without loss of generality, the cylindrical capacitor with 6 terminals can be converted into a six terminal inductor or transformer having identical dimensions and exterior construction. Internal inductor construction can consist of many different types of inductive materials commonly selected by those skilled in the art. Similar to the capacitor, the inductor or transformer can have multiple windings with specific connection details, such common generic packaging and terminal interface allows a very broad range of devices to be fabricated that can be used in the power electronic system of the invention.

While the present invention has been described with reference to what are presently considered to be the preferred examples, it is to be understood that the invention is not limited to the disclosed examples. To the contrary, the invention is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety.

The invention claimed is:

1. A mounting apparatus, for mounting a plurality of heat generating and dissipating electrical devices, the mounting apparatus comprising a heat sink body having peripheral surface with plurality of mounting surfaces for mounting a plurality of heat generating and dissipating electrical devices, and a securing member encircling the heat sink body and each heat generating and dissipating electrical device mounted to one of said mounting surfaces of the heat sink body, the securing member being maintained in tension, thereby to provide a force on each heat generating and dissipating electrical device to press each heat generating and dissipating electrical device against the heat sink body, wherein the securing member comprises a tension strap encircling around the heat sink body and wherein a pressure distributing element is provided between the securing member and each heat generating and dissipating electrical device, whereby each heat generating and dissipating electrical device is subject to a generally uniform pressure, pressing it against the heat sink body.

2. A mounting apparatus as claimed in claim 1, wherein the surfaces are flat surfaces and, wherein a portion of the heat sink body provided with the flat surfaces is of constant cross-section.

3. A mounting apparatus as claimed in claim 2, wherein the cross-section is a regular polygon, and wherein the polygon preferably has one of 4, 6, 8 10 and 12 sides.

4. A mounting apparatus as claimed in claim 3 wherein the securing member comprises one of a tension strap, a ring and a spring, and further optionally including one of tension control by a screw, a tensioning tool and another mechanism, and optionally including retention provided by a screw or a one-time crimp mechanism, or wherein the securing member comprises a silicon rubber sleeve.

5. A mounting apparatus as claimed in claim 4, wherein the securing member is sufficiently resilient to accommodate thereof expansion and contraction, while maintaining each heat generating and dissipating electrical device in contact with the one surface of heat sink body.

6. A mounting apparatus as claimed in claim 5 including at least one of a thermally conductive film or coating on the peripheral surface of the heat sink body and an electrically insulating interface between each electrical device and the securing member.

7. A mounting apparatus as claimed in claim 6, wherein the heat sink body includes a first end face for mounting the apparatus, preferably including a threaded hole for a screw, for securing the heat sink body to at least one of a printed circuit board and a bus bar structure.

8. A mounting apparatus as claimed in claim 1, wherein the heat sink body includes a bore for a fluid coolant, and an inlet fitting and an outlet fitting in communication with the bore for flow of a coolant fluid through the apparatus.

9. A mounting apparatus as claimed in claim 1, including a pressure distributing element between the securing member and each heat dissipating electrical device, whereby each heat dissipating electrical device is subject to a generally uniform pressure, pressing it against the heat sink body.

10. A mounting apparatus as claimed in claim 1, wherein the heat sink body includes a generally central bore for a fluid coolant, and an inlet fitting and an outlet fitting in communication with the bore for flow of a coolant fluid through the apparatus.

11. An apparatus as claimed in claim 10, wherein the heat sink body includes a first end face for mounting the apparatus and an extension, extending from the first end face, whereby the heat sink body can be mounted to a generally planar supporting element, with the heat sink body located on one side of the supporting element and the extension of the heat sink body extending through to another side of the supporting element, wherein one of the inlet fitting and outlet fitting is provided on the heat sink body so as to be located on one side of the supporting element, and the other of the inlet fitting and the outlet fitting is provided on the extension so as to be located on the other side of the supporting element.

12. An apparatus as claimed in claim 11, wherein the bore extends generally perpendicularly to and through the first end face of the heat sink body, and includes a portion remote from the extension that extends radially and is connected to said one of the inlet fitting and the outlet fitting so that said one of the inlet fitting and the outlet fitting is provided extending radially with respect to the bore and the other of the inlet fitting and the outlet fitting is provided extending generally coaxially with the bore.

13. A mounting apparatus, for mounting a plurality of heat generating and dissipating electrical devices, the mounting apparatus comprising a heat sink body having peripheral surface with plurality of mounting surfaces for mounting a plurality of heat generating and dissipating electrical devices, and a securing member encircling the heat sink body and each electrical device mounted to one of said mounting surfaces of the heat sink body, the securing member being maintained in tension, thereby to provide a force on each heat generating and dissipating electrical device to press each heat generating and dissipating electrical device against the heat sink body, wherein the securing member comprises a tension strap encircling around the heat sink body and wherein a pressure distributing element is provided between the securing member and each heat generating and dissipating electrical device, whereby each heat generating and dissipating electrical device is subject to a generally uniform pressure, pressing it against the heat sink body, wherein the heat sink body includes a bore for a fluid coolant, and an inlet fitting and an outlet fitting in communication with the bore for flow of a coolant fluid through the apparatus, wherein the heat sink body includes a first end face for mounting the apparatus and an extension, extending from the first end face, whereby the heat sink body can be mounted to a generally planar supporting element, with the heat sink body located on one side of the supporting element and the extension of the heat sink body extending through to another side of the supporting element, and wherein one of the inlet fitting and outlet fitting is provided on the heat sink body so as to be located on one side of the supporting element, and the other of the inlet fitting and the outlet fitting is provided on the extension so as to be located on the other side of the supporting element.

14. A mounting apparatus as claimed in claim 13, wherein the bore extends generally perpendicularly to and through the first end face of the heat sink body, and includes a portion remote from the extension that extends radially and is connected to said one of the inlet fitting and the outlet fitting so that said one of the inlet fitting and the outlet fitting is provided extending radially with respect to the bore and the other of the inlet fitting and the outlet fitting is provided extending generally coaxially with the bore.

15. A mounting apparatus as claimed in claim 14, wherein the heat sink body includes a second end face opposite the first end face, and provided with threaded holes for mounting screws.

16. A mounting apparatus as claimed in claim 15, wherein the heat sink body is provided with an undercut to provide a desired creepage distance for leads of electrical devices mounted to the heat sink body.

17. In combination: a mounting apparatus, for mounting a plurality of heat generating and dissipating electrical devices, the mounting apparatus comprising a heat sink body having peripheral surface with plurality of mounting surfaces for mounting a plurality of heat generating and dissipating electrical devices, and a securing member encircling the heat sink body and each electrical device mounted to one of said mounting surfaces of the heat sink body, the securing member being maintained in tension, thereby to provide a force on each heat generating and dissipating electrical device to press each heat generating and dissipating electrical device against the heat sink body, wherein the securing member comprises a tension strap encircling around the heat sink body and wherein a pressure distributing element is provided between the securing member and each heat generating and dissipating electrical device, whereby each heat generating and dissipating electrical device is subject to a generally uniform pressure, pressing it against the heat sink body; and a supporting element, with the heat sink body mounted to the supporting element, a plurality of heat generating and dissipating electrical devices mounted to the heat sink body and having a plurality of leads extending from the heat generating and dissipating electrical devices to the supporting element, wherein desired creepage distances are provided between the leads of the heat generating and dissipating electrical devices and the heat sink body, and the heat sink body includes an undercut to provide desired creepage distances to the heat sink body.

18. A mounting apparatus, for mounting at least one heat generating and dissipating electrical device, the mounting apparatus comprising a heat sink body having peripheral surface with at least one surface for mounting a heat generating and dissipating electrical device, wherein the heat sink body includes a first end face for mounting the apparatus and an extension, extending from the first end face, whereby the heat sink body can be mounted to a generally planar supporting element, with the heat sink body located on one side of the supporting element and the extension of the heat sink body extending through to another side of the supporting element, wherein the heat sink body includes a bore for a fluid coolant, and an inlet fitting and an outlet fitting in communication with the bore for flow of a coolant fluid through the apparatus, wherein one of the inlet fitting and outlet fitting is provided on the heat sink body so as to be located on one side of the supporting element, and the other of the inlet fitting and the outlet fitting is provided on the extension so as to be located on the other side of the supporting element, wherein the bore extends generally perpendicularly to and through the first end face of the heat sink body, and wherein one of the inlet fitting and the outlet fitting is provided extending radially with respect to the bore and the other of the inlet fitting and the outlet fitting is provided extending generally coaxially with the bore.

\* \* \* \* \*